United States Patent
Sakamoto

(10) Patent No.: US 11,653,561 B2
(45) Date of Patent: May 16, 2023

(54) ORGANIC ELECTROLUMINESCENCE DEVICE AND FUSED POLYCYCLIC COMPOUND FOR ORGANIC ELECTROLUMINESCENCE DEVICE

(71) Applicant: Samsung Display Co., Ltd., Yongin-si (KR)

(72) Inventor: Naoya Sakamoto, Yokohama (JP)

(73) Assignee: Samsung Display Co., Ltd., Yongin-si (KR)

(*) Notice: Subject to any disclaimer, the term of this patent is extended or adjusted under 35 U.S.C. 154(b) by 497 days.

(21) Appl. No.: 16/814,880

(22) Filed: Mar. 10, 2020

(65) Prior Publication Data

US 2020/0403160 A1 Dec. 24, 2020

(30) Foreign Application Priority Data

Jun. 19, 2019 (KR) .......................... 10-2019-0072821

(51) Int. Cl.
*H01L 51/50* (2006.01)
*H01L 51/00* (2006.01)
(Continued)

(52) U.S. Cl.
CPC .......... *H01L 51/0059* (2013.01); *C07F 5/027* (2013.01); *C09K 11/06* (2013.01);
(Continued)

(58) Field of Classification Search
None
See application file for complete search history.

(56) References Cited

U.S. PATENT DOCUMENTS

2015/0236274 A1  8/2015  Hatakeyama et al.
2018/0301629 A1  10/2018  Hatakeyama et al.
(Continued)

FOREIGN PATENT DOCUMENTS

KR  10-2016-0119683 A  10/2016
KR  10-2017-0130434 A  11/2017
(Continued)

OTHER PUBLICATIONS

Park, In Seob et al., "High-Performance Dibenzoheteraborin-Based Thermally Activated Delayed Fluorescence Emitters: Molecular Architectonics for Concurrently Achieving Narrowband Emission and Efficient Triplet-Singlet Spin Conversion", WILEY-VCH Verlag GmbH & Co. KGaA Weinheim, Germany, 2018; DOI:10.1002/adfm.201802031, 17 pages.
(Continued)

*Primary Examiner* — Gregory D Clark
(74) *Attorney, Agent, or Firm* — Lewis Roca Rothgerber Christie LLP

(57) ABSTRACT

An organic electroluminescence device of the embodiments includes oppositely disposed first electrode and second electrode, and a plurality of organic layers disposed between the first electrode and the second electrode, wherein at least one among the organic layers includes a fused polycyclic compound represented by Formula 1 below, thereby showing improved emission efficiency and long life:

Formula 1
(Continued)

US 11,653,561 B2
Page 2

H01L 51/5056 (2013.01); H01L 51/5072 (2013.01); H01L 51/5088 (2013.01); H01L 51/5092 (2013.01)

(56) References Cited

U.S. PATENT DOCUMENTS

| | | |
|---|---|---|
| 2019/0027694 A1 | 1/2019 | Hatakeyama et al. |
| 2019/0058124 A1 | 2/2019 | Hatakeyama et al. |
| 2020/0190115 A1 | 6/2020 | Hatakeyama et al. |
| 2020/0203617 A1* | 6/2020 | Duan .......... H01L 51/0073 |

FOREIGN PATENT DOCUMENTS

| | | |
|---|---|---|
| KR | 10-2018-0108559 A | 10/2018 |
| KR | 10-2018-0108604 A | 10/2018 |
| KR | 10-2018-0122298 A | 11/2018 |
| WO | WO 2015/102118 A1 | 7/2015 |
| WO | WO 2016/152544 A1 | 9/2016 |
| WO | WO 2017/126443 A1 | 7/2017 |
| WO | WO 2017/138526 A1 | 8/2017 |
| WO | 2018/212169 A1 | 11/2018 |

OTHER PUBLICATIONS

Numata, Masaki et al., "High efficiency pure blue thermally activated delayed fluorescence molecules having 10H-phenoxaborin and acridan units", Electronic Supplementary Material (ESI) for ChemComm. This journal is © The Royal Society of Chemistry 2015, 37 pages.

\* cited by examiner

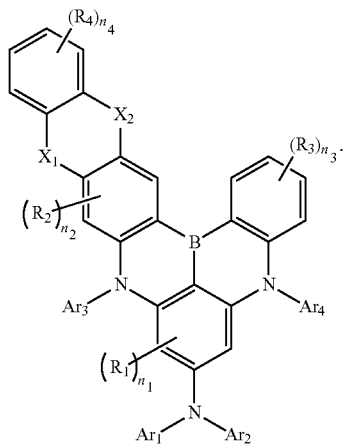

20 Claims, 2 Drawing Sheets

(51) Int. Cl.
  *C07F 5/02* (2006.01)
  *C09K 11/06* (2006.01)
(52) U.S. Cl.
  CPC ........ *H01L 51/008* (2013.01); *H01L 51/0061* (2013.01); *C09K 2211/1007* (2013.01); *H01L 51/0072* (2013.01); *H01L 51/5016* (2013.01);

ORGANIC ELECTROLUMINESCENCE DEVICE AND FUSED POLYCYCLIC COMPOUND FOR ORGANIC ELECTROLUMINESCENCE DEVICE

CROSS-REFERENCE TO RELATED APPLICATION

This application claims priority to and the benefit of Korean Patent Application No. 10-2019-0072821, filed on Jun. 19, 2019, the entire content of which is hereby incorporated by reference.

BACKGROUND

The present disclosure herein relates to an organic electroluminescence device and a fused polycyclic compound used therein, and more particularly, to a fused polycyclic compound used as a light-emitting material and an organic electroluminescence device including the same.

Recently, the development of an organic electroluminescence display device as an image display device is being actively conducted. Different from a liquid crystal display device, the organic electroluminescence display device is a self-luminescent display device in which holes and electrons injected from a first electrode and a second electrode recombine in an emission layer, and a light-emitting material including an organic compound in the emission layer emits light to attain display of images.

In the application of an organic electroluminescence device to a display device, the decrease of the driving voltage, and the increase of the emission efficiency and the life of the organic electroluminescence device are required (or desired), and development of materials for an organic electroluminescence device that are capable of stably attaining these characteristics is being continuously required (or desired).

Particularly, recently, in an effort to accomplish an organic electroluminescence device with high efficiency, techniques on phosphorescence emission (which uses energy in a triplet state) or delayed fluorescence emission (which uses the generating phenomenon of singlet excitons by the collision of triplet excitons (triplet-triplet annihilation, TTA)) are being developed, and development of a material for thermally activated delayed fluorescence (TADF) using delayed fluorescence phenomenon is being conducted.

SUMMARY

One or more aspects of embodiments of the present disclosure are directed toward an organic electroluminescence device having improved emission efficiency.

Aspects of embodiments of the present disclosure are also directed toward a fused polycyclic compound capable of improving the emission efficiency of an organic electroluminescence device.

An embodiment of the inventive concept provides an organic electroluminescence device including a first electrode, a second electrode facing the first electrode, and a plurality of organic layers between the first electrode and the second electrode. At least one organic layer among the plurality of organic layers includes a fused polycyclic compound. The fused polycyclic compound includes a fused polycyclic heterocycle in which five rings are fused, and which includes one boron atom and two nitrogen atoms, an amine group connected with one ring in the fused polycyclic heterocycle, and a substituted or unsubstituted aromatic hydrocarbon ring connected with one or more rings, to which the amine group is not connected in the fused polycyclic heterocycle, via two heteroatoms which are each independently selected from the group consisting of a boron atom, an oxygen atom, a sulfur atom and a nitrogen atom.

In an embodiment, the organic layers may include a hole transport region disposed on the first electrode, an emission layer disposed on the hole transport region, and an electron transport region disposed on the emission layer. The emission layer may include the fused polycyclic compound.

In an embodiment, the emission layer may emit delayed fluorescence.

In an embodiment, the emission layer may be a delayed fluorescence emission layer including a host and a dopant, and the dopant may include the fused polycyclic compound.

In an embodiment, in the fused polycyclic heterocycle, the five rings may be formed by connecting three substituted or unsubstituted benzene rings via one boron atom and two nitrogen atoms, and the amine group and the boron atom may be positioned para in one benzene ring among the three benzene rings.

In an embodiment, the fused polycyclic compound may be represented by Formula 1:

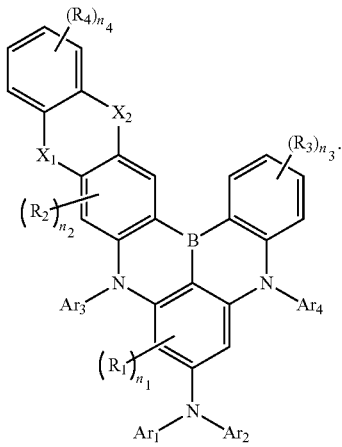

Formula 1

In Formula 1, $X_1$ and $X_2$ may each independently be $BAr_5$, O, S, or $NAr_6$, $Ar_1$ to $Ar_6$ may each independently be a substituted or unsubstituted aryl group of 6 to 60 carbon atoms to form a ring, or a substituted or unsubstituted heteroaryl group of 2 to 60 carbon atoms to form a ring, where $Ar_1$ and $Ar_2$ may be combined with each other to form a ring, $R_1$ to $R_4$ may each independently be a hydrogen atom, a deuterium atom, a halogen atom, a substituted or unsubstituted amine group, a substituted or unsubstituted oxy group, a substituted or unsubstituted thio group, a substituted or unsubstituted alkyl group of 1 to 20 carbon atoms, a substituted or unsubstituted aryl group of 6 to 60 carbon atoms to form a ring, or a substituted or unsubstituted heteroaryl group of 2 to 60 carbon atoms to form a ring, and any of $R_1$ to $R_4$ may be combined with an adjacent group to form a ring, $n_1$ and $n_2$ may each independently be an integer of 0 to 2, and $n_3$ and $n_4$ may each independently be an integer of 0 to 4.

In an embodiment, the fused polycyclic compound represented by Formula 1 may be represented by any one among Formula 2-1 to Formula 2-3:

Formula 2-1

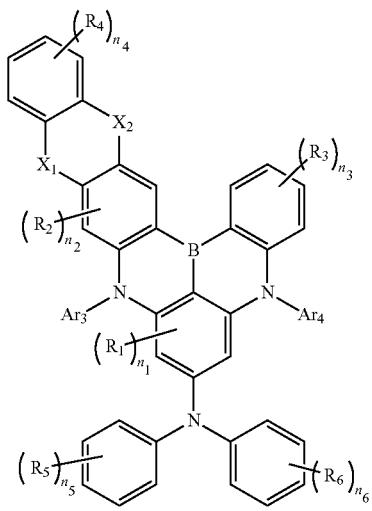

Formula 2-2

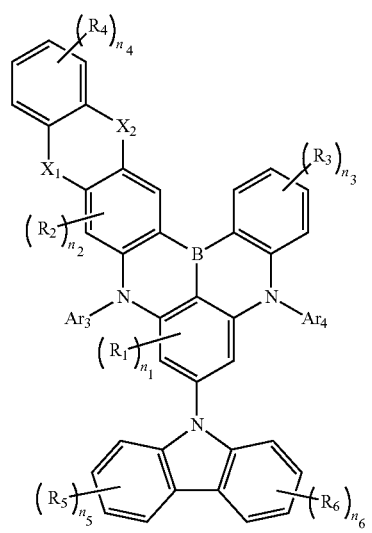

Formula 2-3

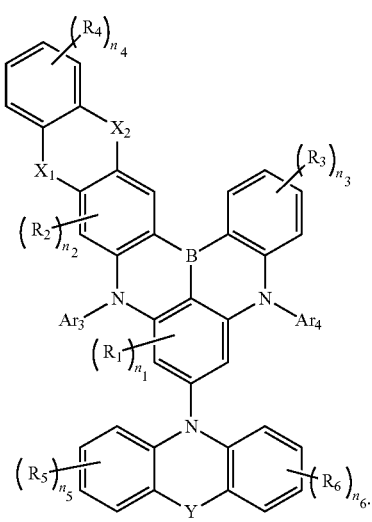

In Formula 2-1 to Formula 2-3, Y may be $CR_7R_8$, O, or S, $R_5$ to $R_8$ may each independently be a hydrogen atom, a deuterium atom, a halogen atom, a substituted or unsubstituted oxy group, a substituted or unsubstituted thio group, a substituted or unsubstituted alkyl group of 1 to 20 carbon atoms, a substituted or unsubstituted aryl group of 6 to 60 carbon atoms to form a ring, or a substituted or unsubstituted heteroaryl group of 2 to 60 carbon atoms to form a ring, where each of a plurality of $R_5$ and $R_6$ may be combined with an adjacent group to form a ring, and $n_5$ and $n_6$ may each independently be an integer of 0 to 4.

In Formula 2-1 to Formula 2-3, $X_1$ and $X_2$, $R_1$ to $R_4$, $Ar_3$ and $Ar_4$, and $n_1$ to $n_4$ are the same as defined in Formula 1.

In an embodiment, the fused polycyclic compound represented by Formula 1 may be represented by any one among Formula 3-1 to Formula 3-5:

Formula 3-1

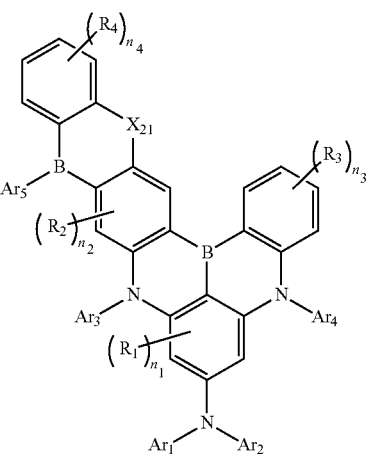

Formula 3-2

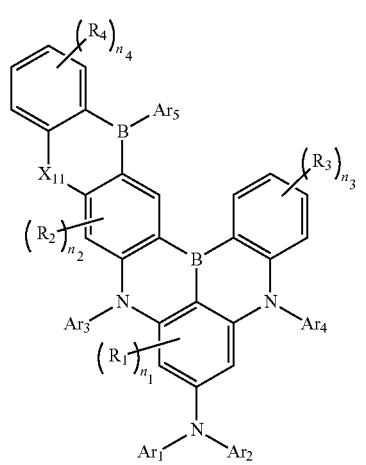

-continued

Formula 3-3
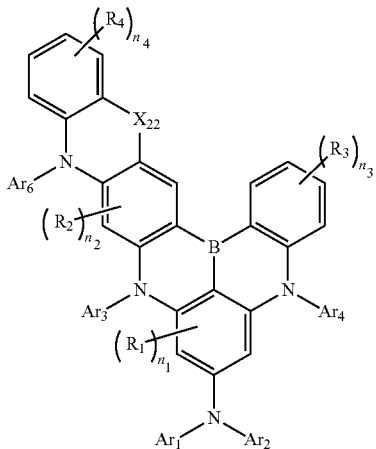

Formula 3-4
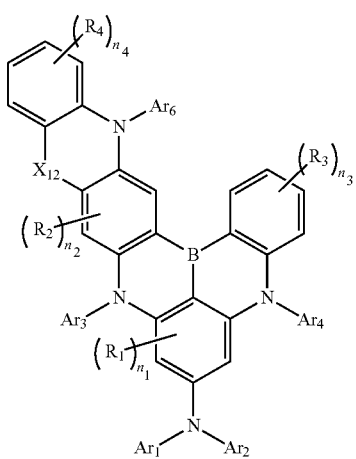

Formula 3-5
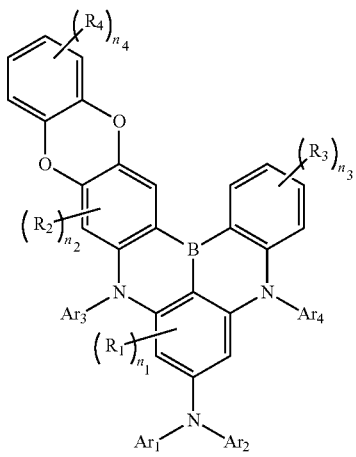

In Formula 3-1 to Formula 3-5, $X_{11}$ and $X_{21}$ may each independently be O, S, or $NAr_6$, and $X_{12}$ and $X_{22}$ may each independently be $BAr_5$, O, or S.

In Formula 3-1 to Formula 3-5, $R_1$ to $R_4$, $Ar_1$ to $Ar_6$, and $n_1$ to $n_4$ are the same as defined in Formula 1.

In an embodiment, $Ar_3$ and $Ar_4$ may each independently be a substituted or unsubstituted phenyl group, a substituted or unsubstituted dibenzofuranyl group, or a substituted or unsubstituted dibenzothiophenyl group.

In an embodiment, $R_3$ may be a substituted or unsubstituted amino group, a substituted or unsubstituted oxy group, a substituted or unsubstituted thio group, or a substituted or unsubstituted phenyl group, and each of a plurality of $R_3$ groups may be combined with an adjacent group to form a ring.

In an embodiment, $R_4$ may be a hydrogen atom, a halogen atom, a substituted or unsubstituted methyl group, or a substituted or unsubstituted phenyl group.

In an embodiment, the first electrode and the second electrode each independently comprise at least one selected from Ag, Mg, Cu, Al, Pt, Pd, Au, Ni, Nd, Ir, Cr, Li, Ca, LiF/Ca, LiF/Al, Mo, Ti, In, Sn, and Zn, a compound of two or more thereof, a mixture of two or more thereof, and an oxide of one or more thereof.

A fused polycyclic compound according to embodiments of the inventive concept may be represented by Formula 1 above.

BRIEF DESCRIPTION OF THE FIGURES

The accompanying drawings are included to provide a further understanding of the inventive concept, and are incorporated in and constitute a part of this specification. The drawings illustrate example embodiments of the inventive concept and, together with the description, serve to explain principles of the inventive concept. In the drawings.

DETAILED DESCRIPTION

Figure 1:
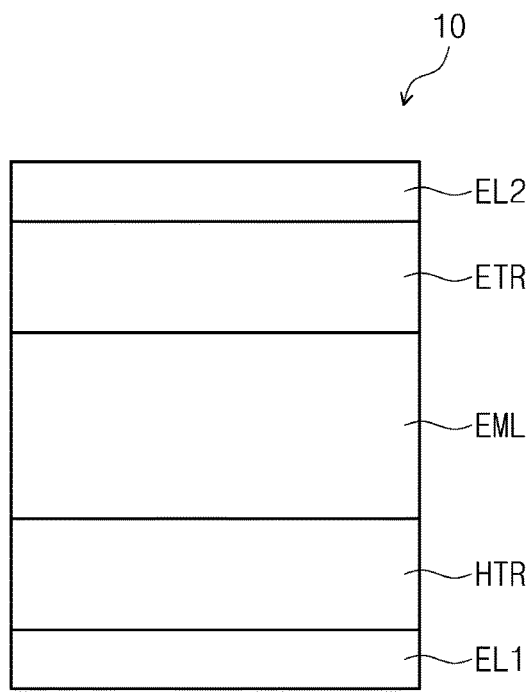
FIG. 1 is a cross-sectional view schematically illustrating an organic electroluminescence device according to an embodiment of the inventive concept.

The above objects, other objects, features and advantages of the inventive concept should be easily understood from the description of example embodiments with reference to the accompanying drawings. The inventive concept may, however, be embodied in different forms and should not be construed as limited to the embodiments set forth herein. Rather, example embodiments are provided so that the contents disclosed herein are thorough and complete, and the spirit of the inventive concept is sufficiently accepted for a person skilled in the art.

Like reference numerals refer to like elements in each drawing and throughout the specification. In the drawings, the sizes of elements may be enlarged for clarity of the inventive concept. It will be understood that, although the terms first, second, etc. may be used herein to describe various elements, these elements should not be limited by these terms. These terms are only used to distinguish one element from another element. For example, a first element discussed below could be termed a second element, and similarly, a second element could be termed a first element. As used herein, the singular forms are intended to include the plural forms as well, unless the context clearly indicates otherwise.

It will be further understood that the terms "comprises" or "comprising," when used in this application, specify the presence of stated features, numerals, steps, operations, elements, parts, or a combination thereof, but do not preclude the presence or addition of one or more other features, numerals, steps, operations, elements, parts, or a combination thereof. It will also be understood that when a layer, a film, a region, a plate, etc. is referred to as being "on" another part, it can be "directly on" the other part, or intervening layers (parts) may also be present. Similarly, when a layer, a film, a region, a plate, etc. is referred to as being "under" another part, it can be "directly under" the other part, or intervening layers (parts) may also be present. On the contrary, when a layer, a film, a region, a plate, etc. is referred to as being "directly on" or "directly under" another part, no intervening layers (parts) may be present.

Hereinafter, the organic electroluminescence device according to an embodiment of the inventive concept will be explained with reference to attached drawings.

Figure 2:
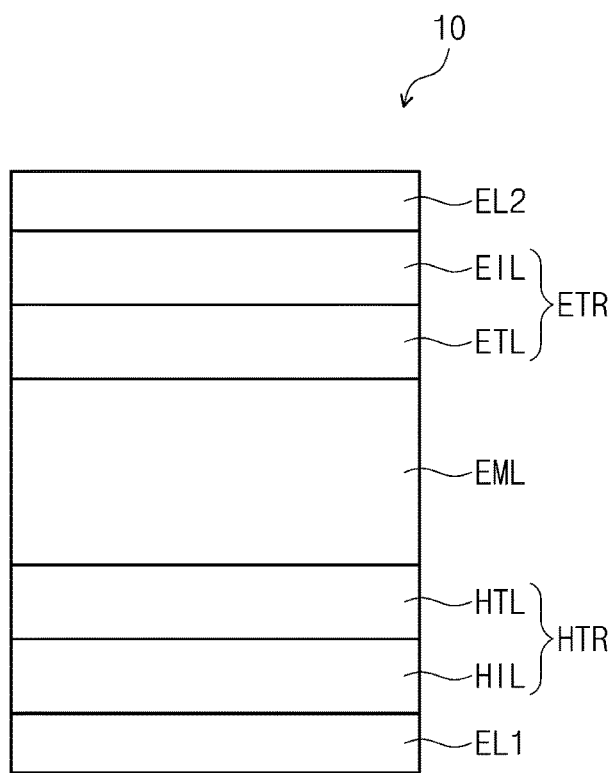
FIG. 2 is a cross-sectional view schematically illustrating an organic electroluminescence device according to an embodiment of the inventive concept.
Figure 3:
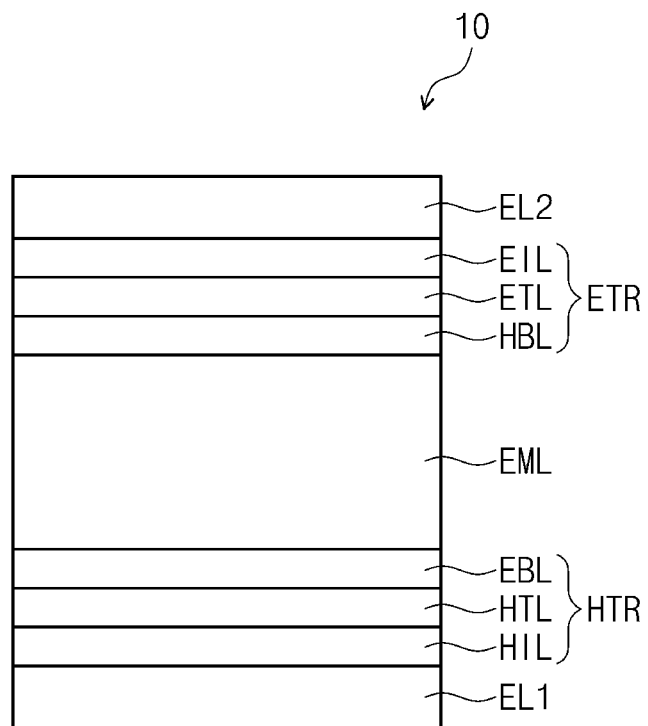
FIG. 3 is a cross-sectional view schematically illustrating an organic electroluminescence device according to an embodiment of the inventive concept.

FIGS. 1 to 3 are cross-sectional views schematically showing organic electroluminescence devices according to example embodiments of the inventive concept. Referring to FIGS. 1 to 3, in an organic electroluminescence device 10 according to an embodiment, a first electrode EL1 and a second electrode EL2 are oppositely disposed (positioned) to face each other, and between the first electrode EL1 and the second electrode EL2, a plurality of organic layers may be disposed. The plurality of the organic layers may include a hole transport region HTR, an emission layer EML, and an electron transport region ETR. That is, the organic electroluminescence device 10 of the embodiments may include a first electrode EL1, a hole transport region HTR, an emission layer EML, an electron transport region ETR, and a second electrode EL2, laminated one by one (sequentially) in the stated order, but embodiments of the present disclosure are not limited thereto.

The organic electroluminescence device 10 of the embodiments may include a fused polycyclic compound of the embodiments, which will be explained in more detail later, in at least one organic layer among the plurality of the organic layers disposed between the first electrode EL1 and the second electrode EL2. For example, the organic electroluminescence device 10 of the embodiments may include a fused polycyclic compound of the embodiments in the emission layer EML disposed between the first electrode EU and the second electrode EL2. However, embodiments of the inventive concept are not limited thereto, and the organic electroluminescence device 10 of the embodiments may include a fused polycyclic compound of the embodiments in at least one organic layer included in the hole transport region HTR and the electron transport region ETR, which are among the plurality of the organic layers disposed between the first electrode EL1 and the second electrode EL2 in addition to the emission layer EML.

FIG. 2 shows a cross-sectional view of an organic electroluminescence device 10 of the embodiments, wherein a hole transport region HTR includes a hole injection layer HIL and a hole transport layer HTL, and an electron transport region ETR includes an electron injection layer EIL and an electron transport layer ETL. FIG. 3 shows a cross-sectional view of an organic electroluminescence device 10 of the embodiments, wherein a hole transport region HTR includes a hole injection layer HIL, a hole transport layer HTL, and an electron blocking layer EBL, and an electron transport region ETR includes an electron injection layer EIL, an electron transport layer ETL, and a hole blocking layer HBL.

Hereinafter, in explaining the organic electroluminescence device 10 of the embodiments, the emission layer EML is explained to include a fused polycyclic compound according to an embodiment, but embodiments of the inventive concept are not limited thereto. The fused polycyclic compound according to an embodiment may be included in a hole transport region HTR or electron transport region ETR.

The first electrode EL1 has conductivity. The first electrode EU may be formed using a metal alloy or a conductive compound. The first electrode EL1 may be an anode. The first electrode EL1 may be a pixel electrode. The first electrode EL1 may be a transmissive electrode, a transflective electrode, or a reflective electrode. If the first electrode EU is the transmissive electrode, the first electrode EL1 may be formed using a transparent metal oxide such as indium tin oxide (ITO), indium zinc oxide (IZO), zinc oxide (ZnO), and/or indium tin zinc oxide (ITZO). If the first electrode EL1 is the transflective electrode or the reflective electrode, the first electrode EU may include Ag, Mg, Cu, Al, Pt, Pd, Au, Ni, Nd, Ir, Cr, Li, Ca, LiF/Ca, LiF/Al, Mo, Ti, a compound thereof, and/or a mixture thereof (for example, a mixture of Ag and Mg). The first electrode EL1 may have a structure including a plurality of layers including a reflective layer or a transflective layer formed using any of the above materials, and a transmissive conductive layer formed using ITO, IZO, ZnO, and/or ITZO. For example, the first electrode EU may include a three-layer structure of ITO/Ag/ITO. However, embodiments of the inventive concept are not limited thereto. The thickness of the first electrode EL1 may be from about 1,000 Å to about 10,000 Å, for example, from about 1,000 Å to about 3,000 Å.

The hole transport region HTR is provided on the first electrode EL1. The hole transport region HTR may include at least one of a hole injection layer HIL, a hole transport layer HTL, a hole buffer layer, or an electron blocking layer EBL. The thickness of the hole transport region HTR may be from about 50 Å to about 1,500 Å

The hole transport region HTR may have a single layer formed using a single material, a single layer formed using a plurality of different materials, or a multilayer structure including a plurality of layers formed using a plurality of different materials.

For example, the hole transport region HTR may have the structure of a single layer of a hole injection layer HIL, or a hole transport layer HTL, and may have a structure of a single layer formed using a hole injection material and a hole transport material. In one or more embodiments, the hole transport region HTR may have a structure of a single layer formed using a plurality of different materials, or a structure laminated from the first electrode EL1 of hole injection layer HIL/hole transport layer HTL, hole injection layer HIL/hole transport layer HTL/hole buffer layer, hole injection layer HIL/hole buffer layer, hole transport layer HTL/hole buffer layer, or hole injection layer HIL/hole transport layer HTL/electron blocking layer EBL, without limitation.

The hole transport region HTR may be formed using one or more suitable methods such as a vacuum deposition method, a spin coating method, a cast method, a Langmuir-Blodgett (LB) method, an inkjet printing method, a laser printing method, and/or a laser induced thermal imaging (LITI) method.

The hole injection layer HIL may include, for example, a phthalocyanine compound (such as copper phthalocyanine), N,N'-diphenyl-N,N'-bis-[4-(phenyl-m-tolyl-amino)-phenyl]-phenyl-4,4'-diamine (DNTPD), 4,4',4"-[tris(3-methylphenyl)phenylamino] triphenylamine (m-MTDATA), 4,4',4"-tris(N,N-diphenylamino)triphenylamine (TDATA), 4,4',4"-tris{N,N-2-naphthyl)-N-phenylamino}-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PAN I/CSA), polyaniline/poly(4-styrenesulfonate) (PANI/PSS), N,N'-di(1-naphthalen-1-yl)-N,N'-diphenyl-benzidine (NPB), N,N'-di(1-naphthyl)-N,N''-diphenyl-(1, 1''-biphenyl)-4,4''-diamine (NPD), triphenylamine-containing polyetherketone (TPAPEK), 4-isopropyl-4'-methyldiphenyliodonium [tetrakis(pentafluorophenyl)borate], and/or dipyrazino[2,3-f:2',3'-h]quinoxaline-2,3,6,7,10,11-hexacarbonitrile (HAT-CN).

The hole transport layer HTL may include, for example, carbazole derivatives (such as N-phenyl carbazole and/or polyvinyl carbazole), fluorene-based derivatives, N,N'-bis(3-methylphenyl)-N,N'-diphenyl-[1,1-biphenyl]-4,4'-di-amine (TPD), triphenylamine-based derivatives (such as 4,4',4''-tris(N-carbazolyl)triphenylamine (TCTA)), N,N'-di(1-naphthalen-1-yl)-N,N'-diphenyl-benzidine (NPB), 4,4'-cyclohexylidene bis[N,N-bis(4-methylphenyl)benzeneam-ine (TAPC), 4,4'-bis[N,N'-(3-tolyl)amino]-3,3'-dimethylbiphenyl (HMTPD), 1,3-bis(N-carbazolyl)benzene (mCP), 9-(4-tert-butylphenyl)-3,6-bis(triphenylsilyl)-9H-carbazole (CzSi), and/or the like.

The thickness of the hole transport region HTR may be from about 100 Å to about 10,000 Å, for example, from about 100 Å to about 5,000 Å. The thickness of the hole injection layer HIL may be, for example, from about 30 Å to about 1,000 Å, and the thickness of the hole transport layer HTL may be from about 30 Å to about 1,000 Å. For example, the thickness of the electron blocking layer EBL may be from about 10 Å to about 1,000 Å. If the thicknesses of the hole transport region HTR, the hole injection layer HIL, the hole transport layer HTL and the electron blocking layer EBL satisfy the above-described ranges, satisfactory (or suitable) hole transport properties may be achieved without substantial increase of a driving voltage.

The hole transport region HTR may further include a charge generating material, in addition to the above-described materials, to increase conductivity. The charge generating material may be dispersed uniformly or non-uniformly in the hole transport region HTR. The charge generating material may be, for example, a p-dopant. The p-dopant may be one of quinone derivatives, metal oxides, or cyano group-containing compounds, without limitation. For example, non-limiting examples of the p-dopant may include quinone derivatives (such as tetracyanoquinodimethane (TCNQ) and/or 2,3,5,6-tetrafluoro-7,7',8,8'-tetracyanoquinodimethane (F4-TCNQ)), and metal oxides (such as tungsten oxide and/or molybdenum oxide), without limitation.

As described above, the hole transport region HTR may further include at least one of a hole buffer layer or an electron blocking layer EBL, in addition to the hole injection layer HIL and the hole transport layer HTL. The hole buffer layer may compensate an optical resonance distance according to the wavelength of light emitted from an emission layer EML and may increase light emission efficiency. Any of the materials which may be included in a hole transport region HTR may be used as materials included in a hole buffer layer. The electron blocking layer EBL is a layer capable of preventing or reducing the electron injection from the electron transport region ETR to the hole transport region HTR.

The emission layer EML is provided on the hole transport region HTR. The emission layer EML may have a thickness of, for example, about 100 Å to about 1,000 Å or about 100 Å to about 300 Å. The emission layer EML may have a single layer formed using a single material, a single layer formed using a plurality of different materials, or a multi-layer structure having a plurality of layers formed using a plurality of different materials.

In the organic electroluminescence device 10 of the embodiments, the emission layer EML may include the fused polycyclic compound of the embodiments.

In the present specification, the term "substituted or unsubstituted" when used in connection with a functional group may refer to the functional group being unsubstituted or substituted or with at least one substituent selected from a deuterium atom, a halogen atom, a cyano group, a nitro group, an amino group, a silyl group, an oxy group, a thio group, a sulfinyl group, a sulfonyl group, a carbonyl group, a boron group, a phosphine oxide group, a phosphine sulfide group, an alkyl group, an alkenyl group, an alkoxy group, a hydrocarbon ring group, an aryl group, and a heterocyclic group. In addition, each of the above-described substituents may be substituted or unsubstituted. For example, a biphenyl group may be described as an aryl group or a phenyl group substituted with a phenyl group.

In the present description, the term "forming a ring via the combination with an adjacent group" may refer to forming a substituted or unsubstituted hydrocarbon ring, or a substituted or unsubstituted heterocycle via the combination of one group with an adjacent group. The hydrocarbon ring may include an aliphatic hydrocarbon ring and/or an aromatic hydrocarbon ring. The heterocycle may include an aliphatic heterocycle and/or an aromatic heterocycle. The ring formed by the combination of one group with an adjacent group may be a monocyclic ring or a polycyclic ring. In addition, the ring formed via the combination of one group with an adjacent group may be combined with another ring to form a Spiro structure.

In the present description, the term "adjacent group" may refer to a pair of substituent groups where the first substituent is connected to an atom which is directly connected to another atom substituted with the second substituent; a pair of substituent groups connected to the same atom; or a pair of substituent groups where the first substituent is sterically positioned at the nearest position to the second substituent. For example, in 1,2-dimethylbenzene, two methyl groups may be described as "adjacent groups" to each other, and in 1,1-diethylcyclopentene, two ethyl groups may be described as "adjacent groups" to each other.

In the present description, a direct linkage may be a single bond.

In the present description, the halogen atom may be a fluorine atom, a chlorine atom, a bromine atom and/or an iodine atom.

In the present description, the alkyl may be a linear, branched or cyclic group. The carbon number of the alkyl may be 1 to 50, 1 to 30, 1 to 20, 1 to 10, or 1 to 6. Examples of the alkyl may include methyl, ethyl, n-propyl, isopropyl, n-butyl, s-butyl, t-butyl, i-butyl, 2-ethylbutyl, 3,3-dimethylbutyl, n-pentyl, i-pentyl, neopentyl, t-pentyl, cyclopentyl, 1-methylpentyl, 3-methylpentyl, 2-ethylpentyl, 4-methyl-2-pentyl, n-hexyl, 1-methylhexyl, 2-ethylhexyl, 2-butylhexyl, cyclohexyl, 4-methylcyclohexyl, 4-t-butylcyclohexyl, n-heptyl, 1-methylheptyl, 2,2-dimethylheptyl, 2-ethylheptyl, 2-butylheptyl, n-octyl, t-octyl, 2-ethyloctyl, 2-butyloctyl, 2-hexyloctyl, 3,7-dimethyloctyl, cyclooctyl, n-nonyl, n-decyl, adamantyl, 2-ethyldecyl, 2-butyldecyl, 2-hexyldecyl, 2-octyldecyl, n-undecyl, n-dodecyl, 2-ethyldodecyl, 2-butyldodecyl, 2-hexyldocecyl, 2-octyldodecyl, n-tridecyl, n-tetradecyl, n-pentadecyl, n-hexadecyl, 2-ethylhexadecyl, 2-butylhexadecyl, 2-hexylhexadecyl, 2-octylhexadecyl, n-heptadecyl, n-octadecyl, n-nonadecyl, n-eicosyl, 2-ethyleicosyl, 2-butyleicosyl, 2-hexyleicosyl, 2-octyleicosyl, n-heneicosyl, n-docosyl, n-tricosyl, n-tetracosyl, n-pentacosyl, n-hexacosyl, n-heptacosyl, n-octacosyl, n-nonacosyl, n-triacontyl, etc., without limitation.

In the present description, the hydrocarbon ring includes an aliphatic hydrocarbon ring and/or an aromatic hydrocarbon ring. The heterocycle includes an aliphatic heterocycle and/or an aromatic heterocycle. The hydrocarbon ring and the heterocycle may each independently be monocyclic or polycyclic.

In the present description, the hydrocarbon ring may be a functional group or a substituent, which is derived from an aliphatic hydrocarbon ring, or a functional group or a substituent derived from an aromatic hydrocarbon ring. The number of carbon atoms in the hydrocarbon ring to form a ring may be 5 to 60.

In the present description, the heterocyclic group may be a functional group or a substituent, which is derived from a heterocycle including at least one heteroatom as a ring-forming element. The number of carbon atoms in the heterocyclic group to form a ring may be 5 to 60.

In the present description, the aryl group may refer to a functional group or a substituent derived from an aromatic hydrocarbon ring. The aryl group may be a monocyclic aryl group or a polycyclic aryl group. The number of carbon atoms to form a ring in the aryl group may be 6 to 30, 6 to 20, or 6 to 15. Examples of the aryl group may include phenyl, naphthyl, fluorenyl, anthracenyl, phenanthryl, biphenyl, terphenyl, quaterphenyl, quinqphenyl, sexiphenyl, triphenylenyl, pyrenyl, benzofluoranthenyl, chrysenyl, etc., without limitation.

In the present description, the fluorenyl group may be substituted, and two substituents may be combined with each other to form a spiro structure. Non-limiting examples of the substituted fluorenyl group are as follows. However, embodiments of the inventive concept are not limited thereto:

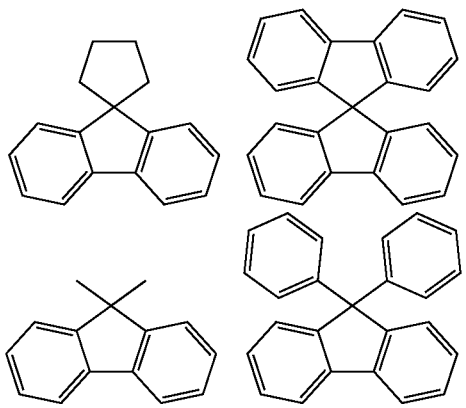

In the present description, the heteroaryl may be one including one or more from among B, O, N, P, Si and S as heteroatoms. If the heteroaryl includes two or more heteroatoms, two or more heteroatoms may be the same or different. The heteroaryl may be monocyclic heteroaryl or polycyclic heteroaryl. The number of carbon atoms to form a ring of the heteroaryl may be 2 to 30, 2 to 20, or 2 to 10. Examples of the heteroaryl may include thiophene, furan, pyrrole, imidazole, thiazole, oxazole, oxadiazole, triazole, pyridine, bipyridine, pyrimidine, triazine, triazole, acridyl, pyridazine, pyrazinyl, quinoline, quinazoline, quinoxaline, phenoxazine, phthalazine, pyrido pyrimidine, pyrido pyrazine, pyrazino pyrazine, isoquinoline, indole, carbazole, N-aryl-carbazole, N-heteroarylcarbazole, N-alkylcarbazole, benzoxazole, benzoimidazole, benzothiazole, benzocarbazole, benzothiophene, dibenzothiophene, thienothiophene, benzofurane, phenanthroline, thiazole, isooxazole, oxadiazole, thiadiazole, phenothiazine, dibenzosilole, dibenzofuran, etc., without limitation.

In the present description, the silyl group includes an alkylsilyl group and/or an arylsilyl group. Examples of the silyl group may include trimethylsilyl, triethylsilyl, t-butyldimethylsilyl, vinyldimethylsilyl, propyldimethylsilyl, triphenylsilyl, diphenylsilyl, phenylsilyl, etc. However, embodiments of the inventive concept are not limited thereto.

In the present description, the boron group includes an alkyl boron group and/or an aryl boron group. Examples of the boron group include a trimethylboron group, a triethylboron group, a t-butyldimethylboron group, a triphenylboron group, a diphenylboron group, a phenylboron group, etc., without limitation.

In the present description, the carbon number of the amine group is not specifically limited, but may be 1 to 30. The amine group may include an alkyl amine group and/or an aryl amine group. Examples of the amine group include a methylamine group, a dimethylamine group, a phenylamine group, a naphthylamine group, a 9-methyl-anthracenylamine group, a triphenylamine group, etc., without limitation.

In the present description, the hydrocarbon ring may refer to a functional group or a substituent derived from an aliphatic hydrocarbon ring. The hydrocarbon ring may be a saturated hydrocarbon ring of 5 to 20 carbon atoms to form a ring.

In the present description, the heterocyclic group may include one or more from among B, O, N, P, Si and S as heteroatoms. If the heterocyclic group includes two or more heteroatoms, two or more heteroatoms may be the same or different. The heterocyclic group may be monocyclic heterocyclic group or polycyclic heterocyclic group, and may be a heteroaryl group. The number of carbon atoms to form a ring of the heterocyclic group may be 2 to 30, 2 to 20, or 2 to 10.

The fused polycyclic compound of the embodiments includes a fused polycyclic heterocycle in which five rings are fused, and which includes one boron atom and two nitrogen atoms, an amine group connected with one ring in the fused polycyclic heterocycle; and one or more substituted or unsubstituted aromatic hydrocarbon rings which are connected with rings of the fused polycyclic heterocycle, to which the amine group is not connected, each of the aromatic hydrocarbon rings being connected via two heteroatoms which are each independently selected from a boron atom, an oxygen atom, a sulfur atom, and a nitrogen atom.

In one or more embodiments, the fused polycyclic heterocycle included in the fused polycyclic compound may form the five rings through connecting three substituted or unsubstituted benzene rings via one boron atom and two nitrogen atoms. More particularly, in the three benzene rings included in the fused polycyclic heterocycle, three benzene rings may be connected with one boron atom as a center, a first benzene ring and a second benzene ring among the three benzene rings may be connected via a nitrogen atom, and the remaining third benzene ring may be connected with the first benzene ring via one nitrogen atom. To the first benzene ring, all of the one boron atom and the two nitrogen atoms may be connected.

An amine group included in the fused polycyclic compound may be connected with the first benzene ring. The amine group connected with the first benzene ring may be combined at a para position with respect to the boron atom which is connected with the first benzene ring.

The aromatic hydrocarbon ring included in the fused polycyclic compound may be connected with one of the second and third benzene rings. In one or more embodiments, the aromatic hydrocarbon ring may be connected with the second benzene ring via two heteroatoms each independently selected from a boron atom, an oxygen atom, a sulfur atom, and a nitrogen atom.

The fused polycyclic compound of the embodiments may be represented by the following Formula 1:

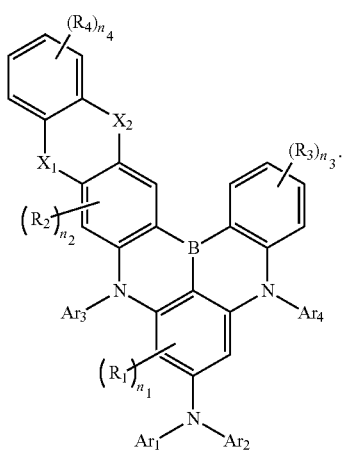

Formula 1

In Formula 1, $X_1$ and $X_2$ may each independently be $BAr_5$, O, S, or $NAr_6$. In one or more embodiments, one among $X_1$ and $X_2$ may be $BAr_5$, and the other one may be O, S, or $NAr_6$. One among $X_1$ and $X_2$ may be $NAr_6$, and the other one may be $BAr_5$, O, or S. In some embodiments, both $X_1$ and $X_2$ may be O.

$Ar_1$ to $Ar_6$ may each independently be a substituted or unsubstituted aryl group of 6 to 60 carbon atoms to form a ring, or a substituted or unsubstituted heteroaryl group of 2 to 60 carbon atoms to form a ring. $Ar_1$ to $Ar_6$ may each independently be a substituted or unsubstituted phenyl group. $Ar_3$ and $Ar_4$ may each independently be a substituted or unsubstituted dibenzofuranyl group, or a substituted or unsubstituted dibenzothiophenyl group. In one or more embodiments, $Ar_1$ and $Ar_2$ may be combined with each other to form a ring.

$R_1$ to $R_4$ may each independently be a hydrogen atom, a deuterium atom, a halogen atom, a substituted or unsubstituted amine group, a substituted or unsubstituted oxy group, a substituted or unsubstituted thio group, a substituted or unsubstituted alkyl group of 1 to 20 carbon atoms, a substituted or unsubstituted aryl group of 6 to 60 carbon atoms to form a ring, or a substituted or unsubstituted heteroaryl group of 2 to 60 carbon atoms to form a ring. In some embodiments, $R_1$ to $R_4$ may each independently be combined with an adjacent group to form a ring. In one or more embodiments, both $R_1$ and $R_2$ may be hydrogen atoms. $R_4$ may be a hydrogen atom, a halogen atom, a substituted or unsubstituted methyl group, or a substituted or unsubstituted phenyl group.

$R_3$ may be a substituted or unsubstituted amino group, a substituted or unsubstituted oxy group, a substituted or unsubstituted thio group, or a substituted or unsubstituted phenyl group. In some embodiments, a plurality of $R_3$ groups may be combined with each other to form a ring. In one or more embodiments, one $R_3$ may include any one selected from a substituted or unsubstituted oxy group, a substituted or unsubstituted thio group, and a substituted or unsubstituted amino group, and an adjacent $R_3$ include one substituted or unsubstituted phenyl group, and the two adjacent $R_3$ groups may be combined with each other to form a ring. In some embodiments, two $R_3$ groups may each independently include a substituted or unsubstituted oxy group, a substituted or unsubstituted thio group, and/or a substituted or unsubstituted amino group, and the two adjacent $R_3$ groups may be combined with each other to form a ring.

$n_1$ and $n_2$ may be an integer of 0 to 2. In Formula 1, in case where $n_1$ is 0, the fused polycyclic compound of the embodiments may not be substituted with $R_1$. In Formula 1, a case where $n_1$ is 2 and all $R_1$ groups are hydrogen atoms, may be the same as a case where $n_1$ is 0 in Formula 1. In case where $n_1$ is 2 in Formula 1, a plurality of $R_1$ groups may be the same or different from each other. In case where $n_2$ is 0 in Formula 1, the fused polycyclic compound of the embodiments may not be substituted with $R_2$. A case where $n_2$ is 2 and all $R_2$ groups are hydrogen atoms in Formula 1, may be the same as a case where $n_2$ is 0 in Formula 1. In case where $n_2$ is 2 in Formula 1, a plurality of $R_2$ groups may be the same or different from each other.

$n_3$ and $n_4$ may each independently be an integer of 0 to 4. In Formula 1, in case where $n_3$ is 0, the fused polycyclic compound of the embodiments may not be substituted with $R_3$. In Formula 1, a case where $n_3$ is 2 or more and all $R_3$ groups are hydrogen atoms, may be the same as a case where $n_3$ is 0 in Formula 1. In case where $n_3$ is 2 or more in Formula 1, a plurality of $R_3$ groups may be the same or different from each other. In case where $n_4$ is 0 in Formula 1, the fused polycyclic compound of the embodiments may not be substituted with $R_4$. A case where $n_4$ is 2 or more and all $R_4$ groups are hydrogen atoms in Formula 1, may be the same as a case where $n_4$ is 0 in Formula 1. In case where $n_4$ is 2 or more in Formula 1, a plurality of $R_4$ groups may be the same or different from each other.

The fused polycyclic compound of the present embodiments additionally includes an amine group which is bonded to a benzene ring at a para position to a boron atom, and aryl groups which are connected to the benzene ring via two heteroatoms each, thus forming a structure having a fused polycyclic ring including five rings which include one boron atom and two nitrogen atoms. Additionally, in some embodiments, the fused polycyclic compound includes aryl group(s) connected via two heteroatoms with the five-ring fused polycyclic heterocycle (which includes one boron atom and two nitrogen atoms as core atoms). Due to the structural characteristics, the fused polycyclic compound of the present embodiments may decrease a difference between the lowest singlet excitation energy level (S1 level) and the lowest triplet excitation energy level (T1 level) through the increasing effect of multiple resonance. Accordingly, an organic electroluminescence device including the fused polycyclic compound of the present embodiments as a light-emitting material may easily generate reverse intersystem crossing, and may show improved device emission efficiency.

The fused polycyclic compound represented by Formula 1 may be represented by any one selected from the following Formula 2-1 to Formula 2-3:

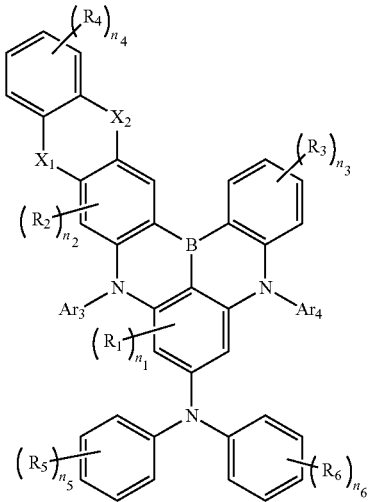

Formula 2-1

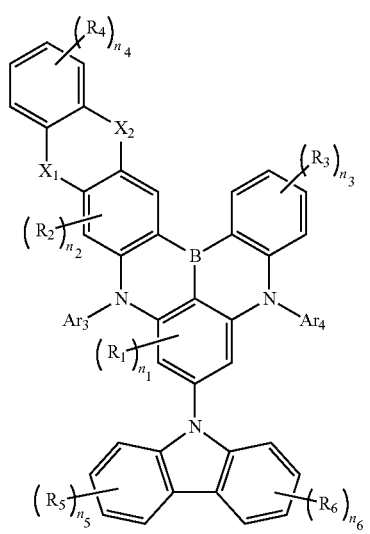

Formula 2-2

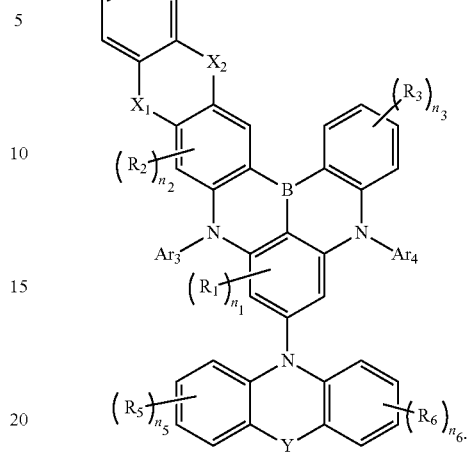

Formula 2-3

Formula 2-1 to Formula 2-3 correspond to Formula 1 where $Ar_1$ and $Ar_2$ are substituted or unsubstituted phenyl groups.

In Formula 2-1 to Formula 2-3, Y may be $CR_7R_8$, O, or S.

$R_5$ to $R_8$ may each independently be a hydrogen atom, a deuterium atom, a halogen atom, a substituted or unsubstituted oxy group, a substituted or unsubstituted thio group, a substituted or unsubstituted alkyl group of 1 to 20 carbon atoms, a substituted or unsubstituted aryl group of 6 to 60 carbon atoms to form a ring, or a substituted or unsubstituted heteroaryl group of 2 to 60 carbon atoms to form a ring. Each of a plurality of $R_5$ and $R_6$ groups may be combined with another one of the plurality of $R_5$ and $R_6$ groups to form a ring. In one or more embodiments, $R_5$ and $R_6$ may be substituted or unsubstituted oxy groups. $R_7$ and $R_8$ may each independently be substituted or unsubstituted methyl groups.

$n_5$ and $n_6$ may each independently be an integer of 0 to 4. In Formula 2-1 to Formula 2-3, in case where $n_5$ is 0, the fused polycyclic compound of the embodiments may not be substituted with $R_5$. In Formula 2-1 to Formula 2-3, a case where $n_5$ is 2 or more and all $R_5$ groups are hydrogen atoms, may be the same as a case where $n_5$ is 0 in Formula 2-1 to Formula 2-3. In Formula 2-1 to Formula 2-3, in case where $n_5$ is 2 or more, a plurality of $R_5$ groups may be the same or different from each other. In Formula 2-1 to Formula 2-3, in case where $n_6$ is 0, the fused polycyclic compound of the embodiments may not be substituted with $R_6$. In Formula 2-1 to Formula 2-3, a case where $n_6$ is 2 or more and all $R_6$ groups are hydrogen atoms, may be the same as a case where $n_6$ is 0 in Formula 2-1 to Formula 2-3. In Formula 2-1 to Formula 2-3, in case where $n_6$ is 2 or more, a plurality of $R_6$ groups may be the same or different from each other.

In Formula 2-1 to Formula 2-3, $X_1$ and $X_2$, $R_1$ to $R_4$, $Ar_3$ and $Ar_4$, and $n_1$ to $n_4$ may be the same as described in connection with Formula 1.

The fused polycyclic compound represented by Formula 1 may be represented by any one selected from the following Formula 3-1 to Formula 3-5:

Formula 3-1 to Formula 3-5 represent Formula 1 where one or both of $X_1$ and $X_2$ are set to be $BAr_5$, O, S, and/or $NAr_6$.

In Formula 3-1 and Formula 3-2, $X_{11}$ and $X_{21}$ may each independently be O, S, or $NAr_6$. In Formula 3-3 and Formula 3-4, $X_{12}$ and $X_{22}$ may each independently be $BAr_5$, O, or S.

In Formula 3-1 to Formula 3-5, $R_1$ to $R_4$, $Ar_1$ to $Ar_6$, and $n_1$ to $n_4$ may be the same as described in connection with Formula 1.

The fused polycyclic compound of the embodiments may be any one selected from the compounds represented in Compound Group 1. The organic electroluminescence device 10 of the embodiments may include at least one fused polycyclic compound selected from the compounds represented in Compound Group 1 in an emission layer EML.

Compound Group 1
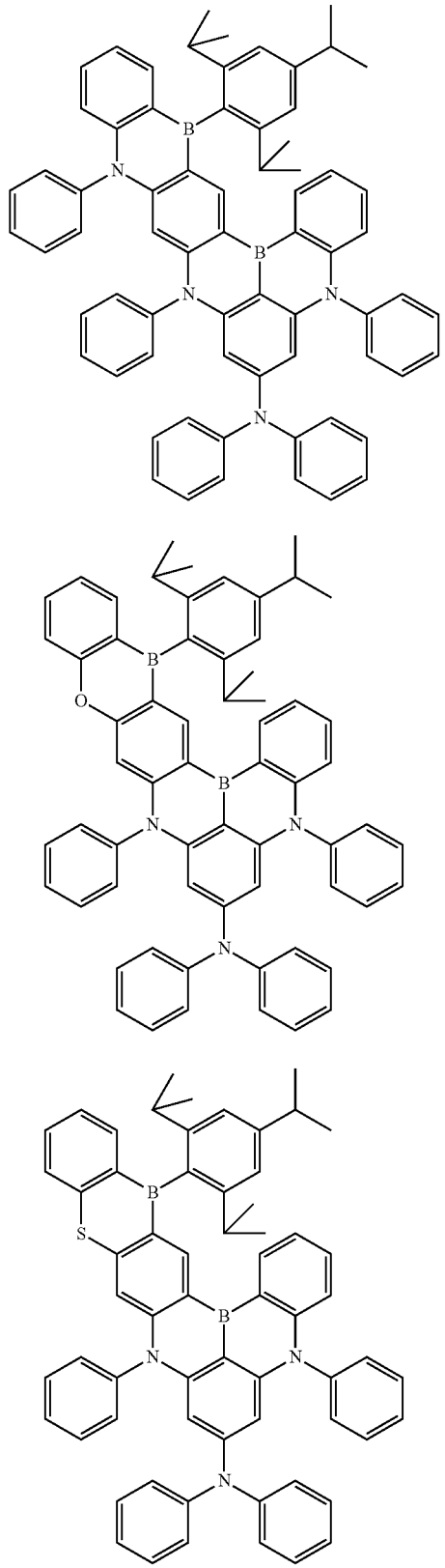
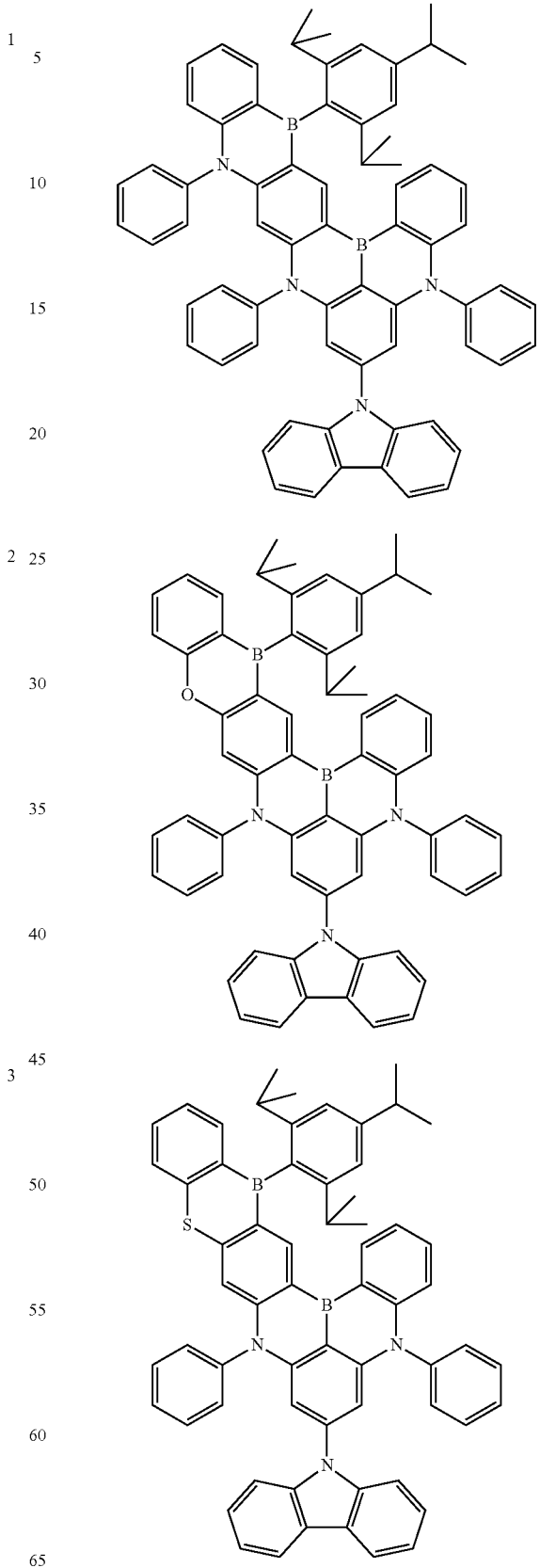

7
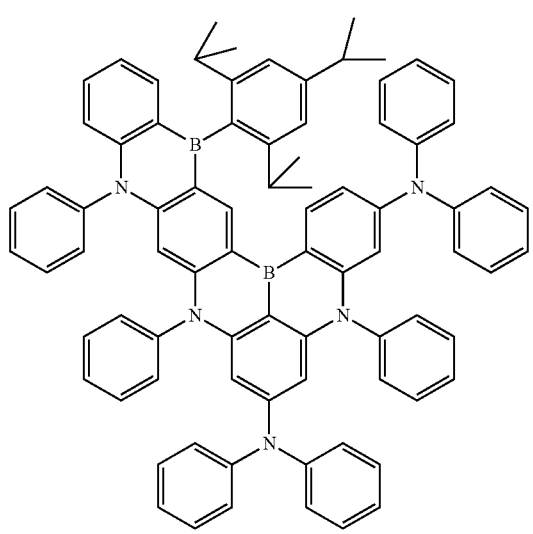
8
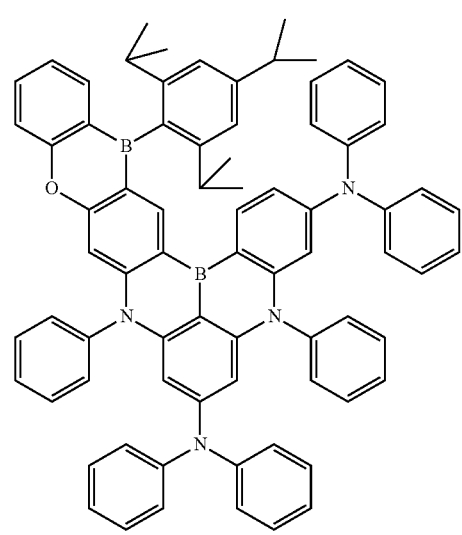
9
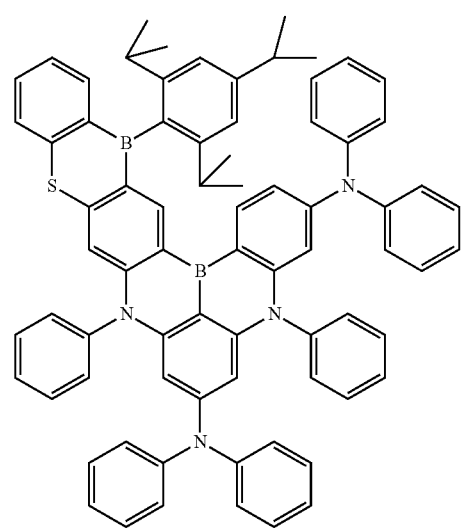
10
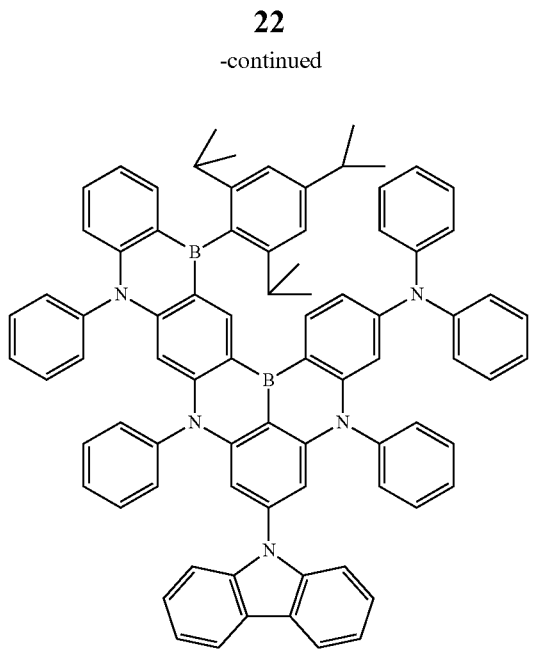
11
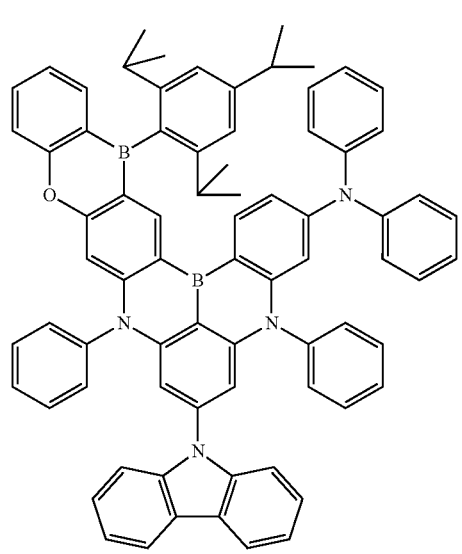
12
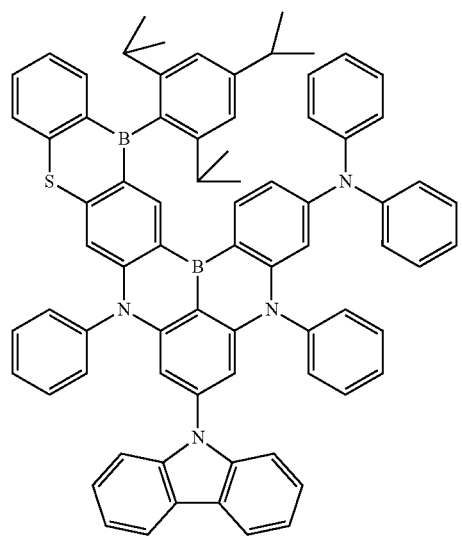

13
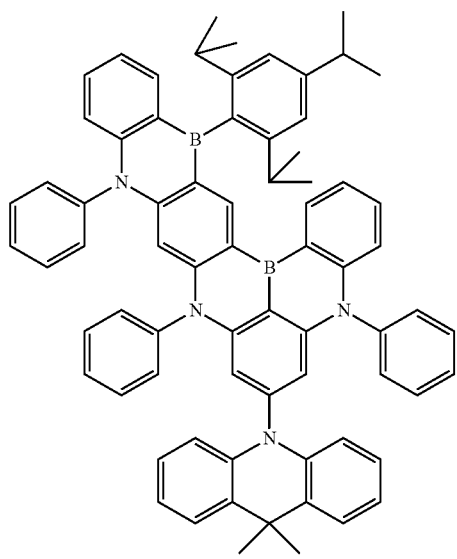
14
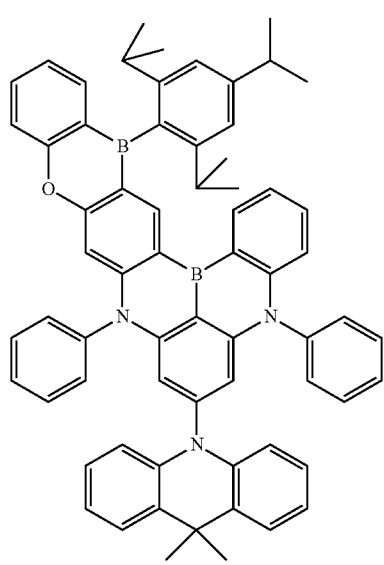
15
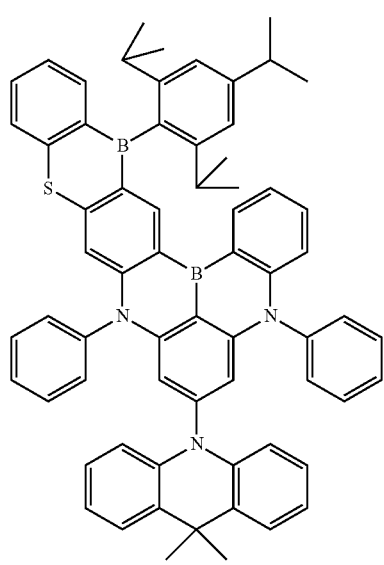
16
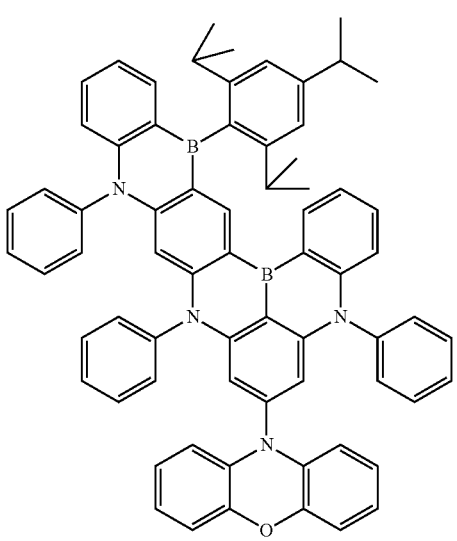
17
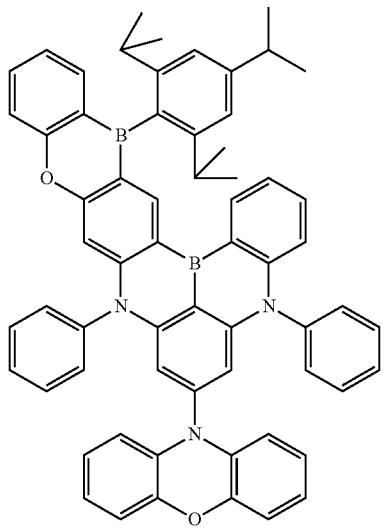
18
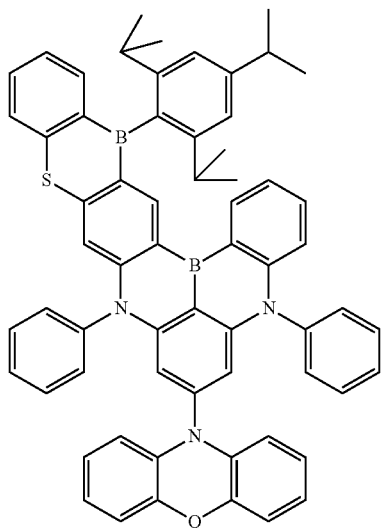

19
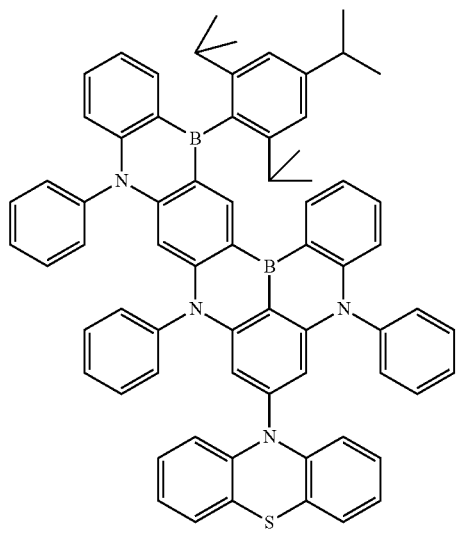
20
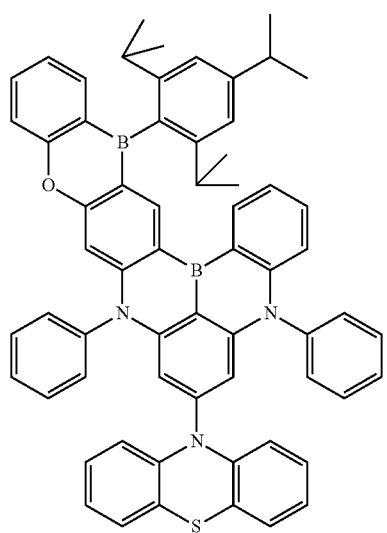
21
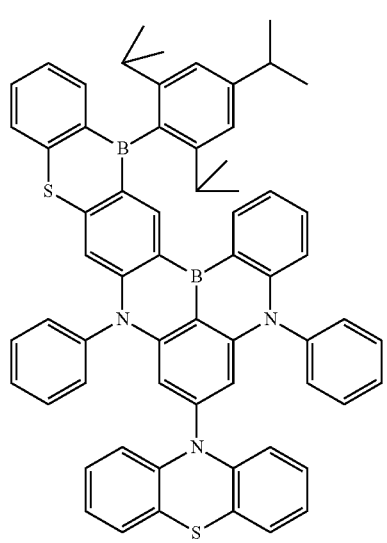
22
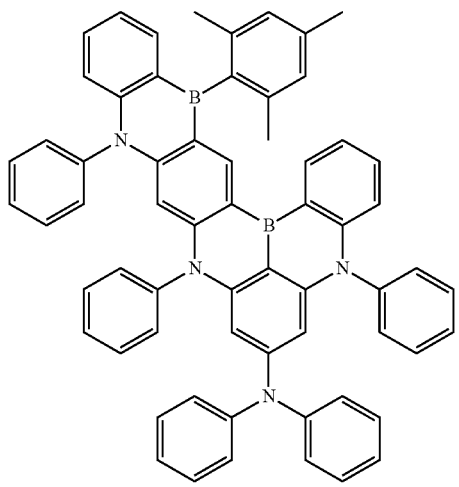
23
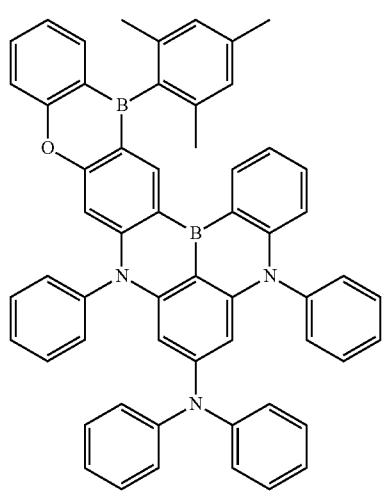
24
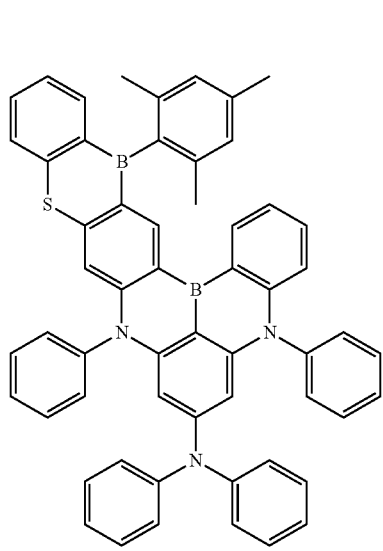

25
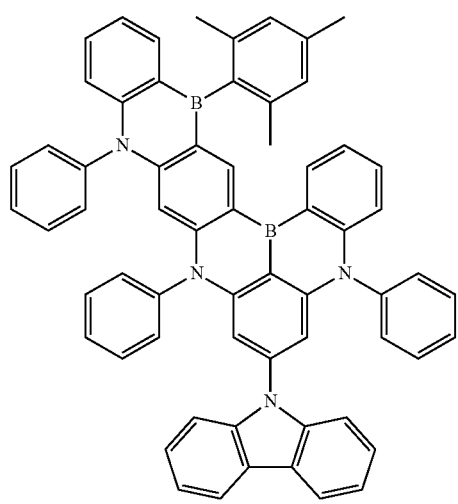
26
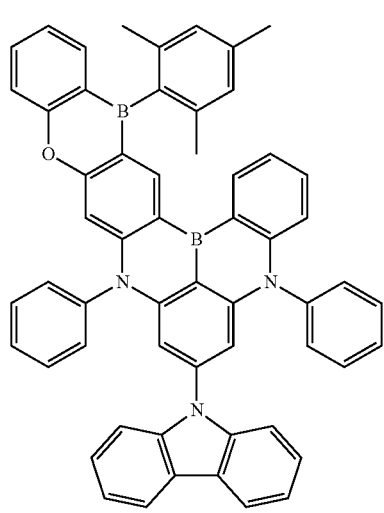
27
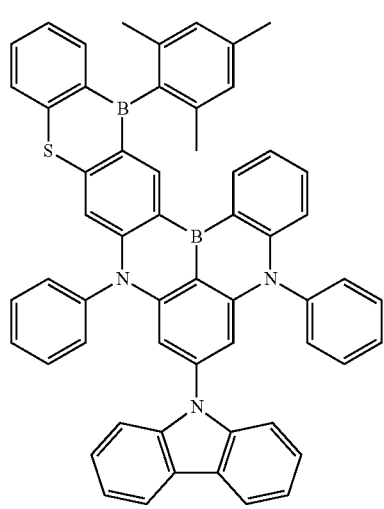
28
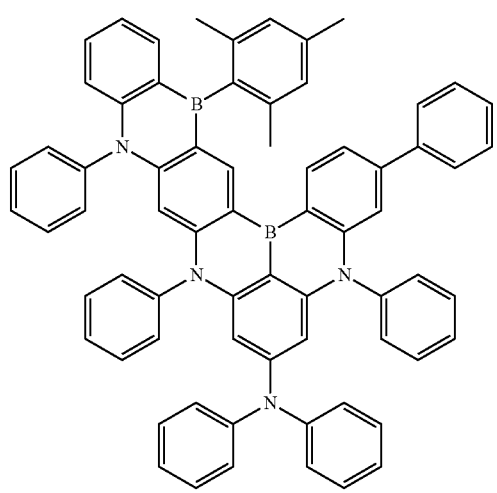
29
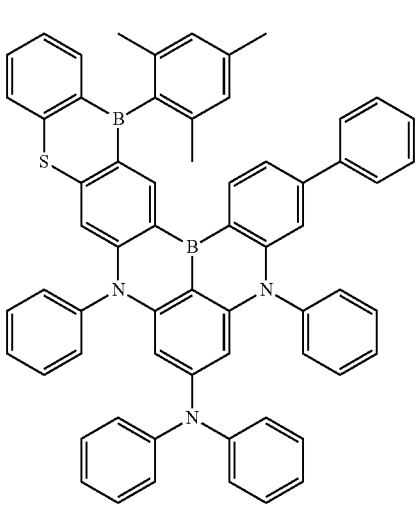
30

31
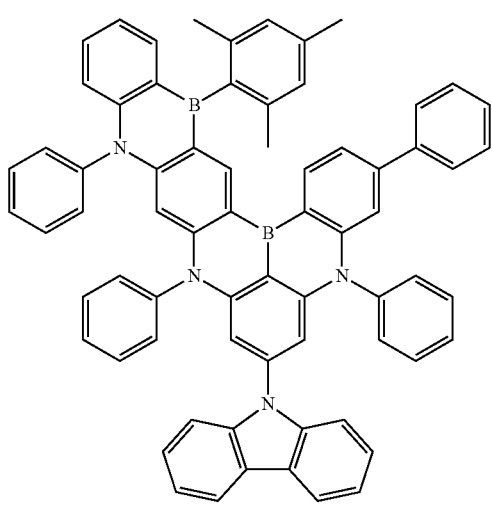
32
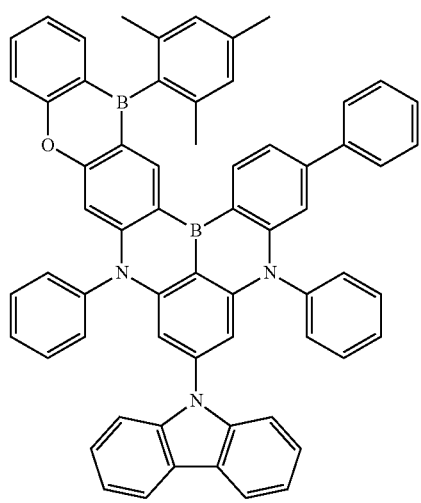
33
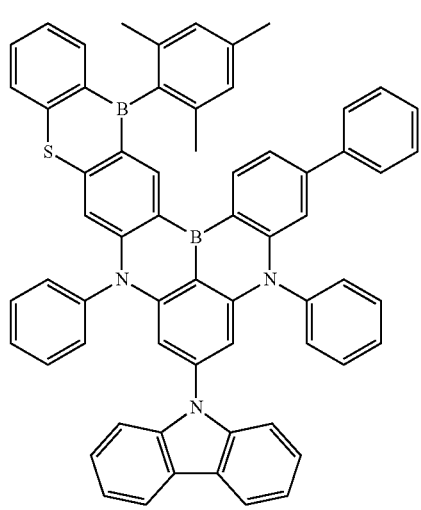
34
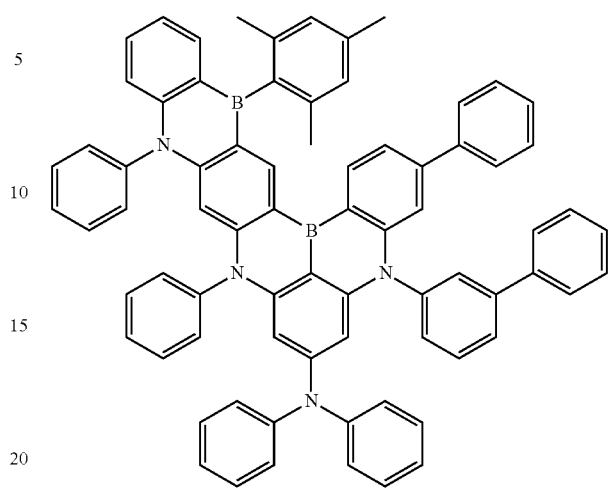
35
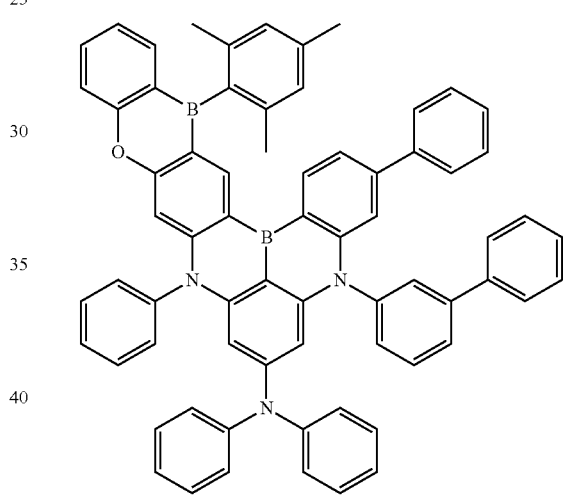
36
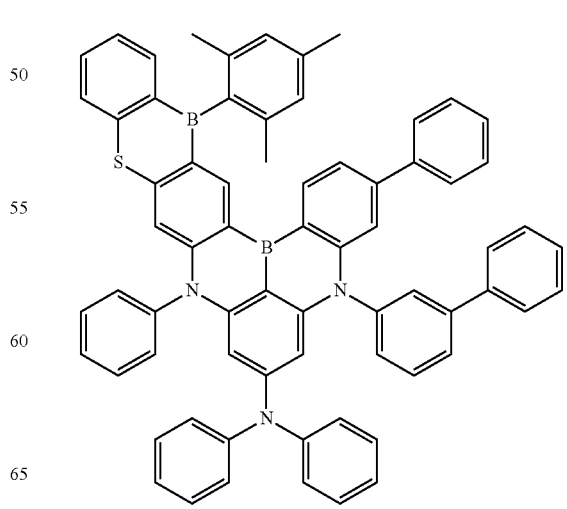

37
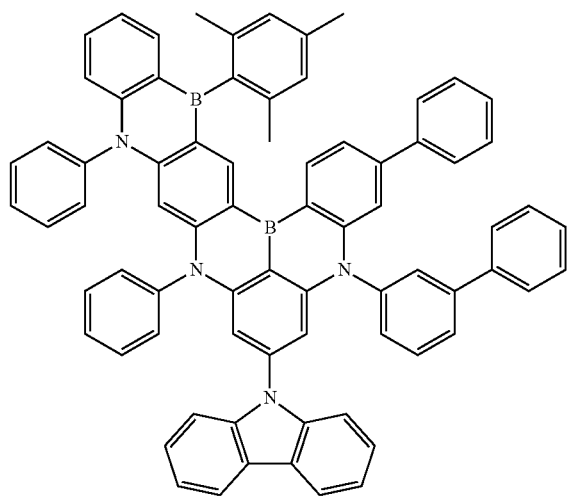
38
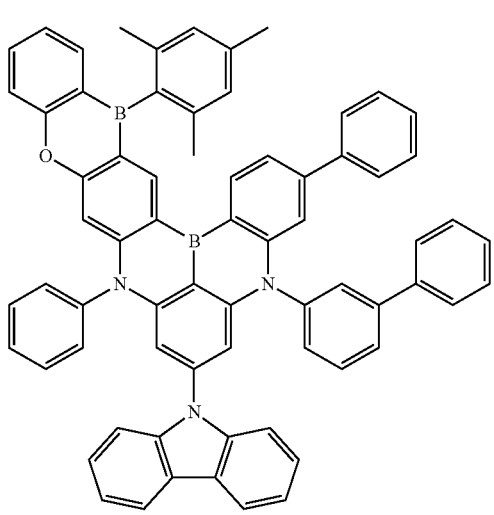
39
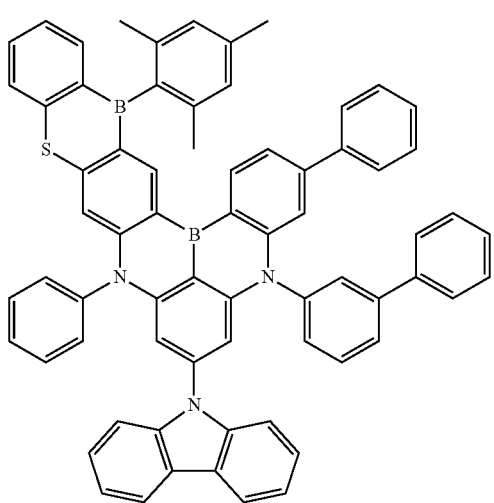
40
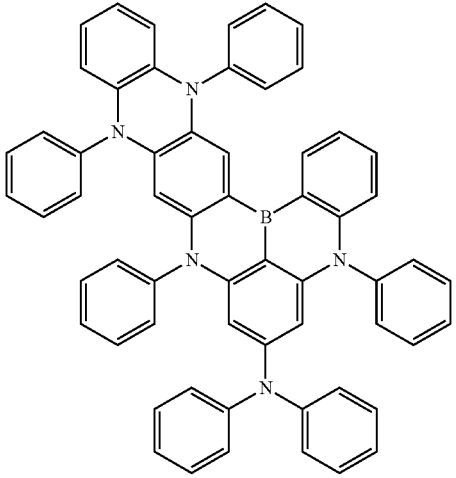
41
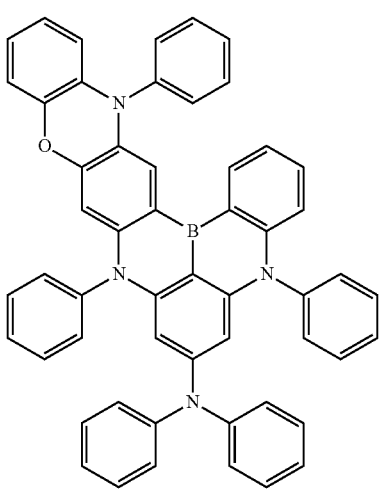
42

43
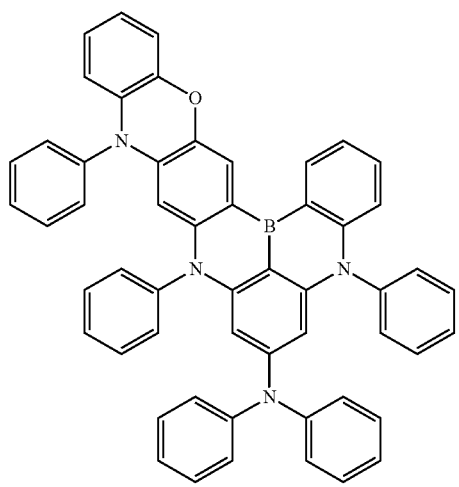
44
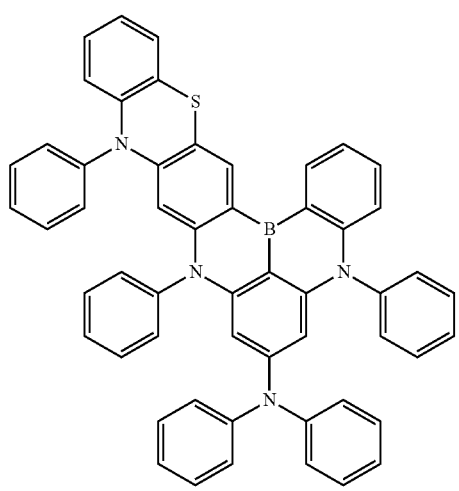
45
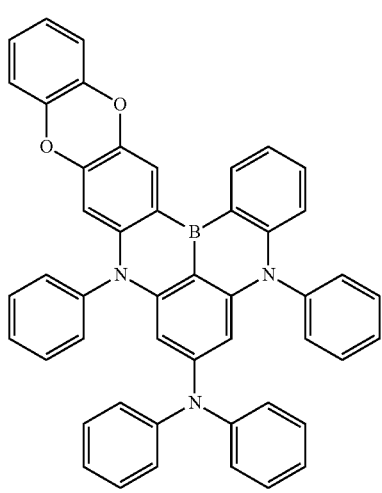
46
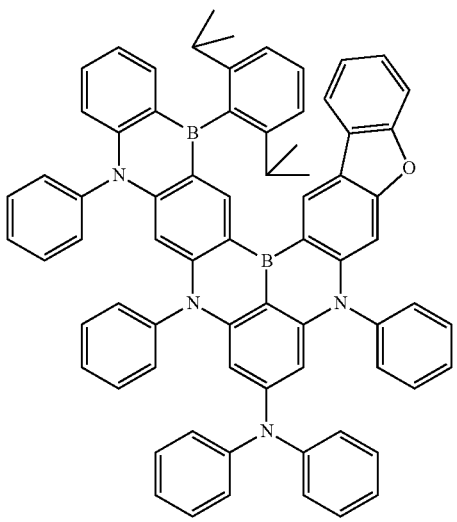
47
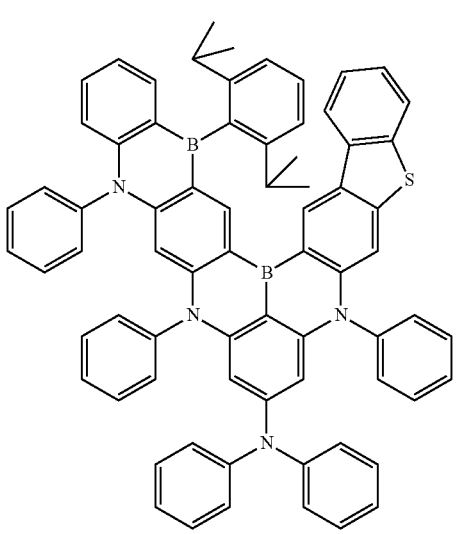
48
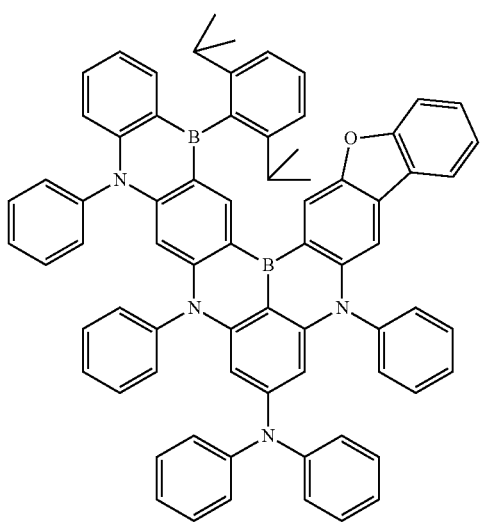

49
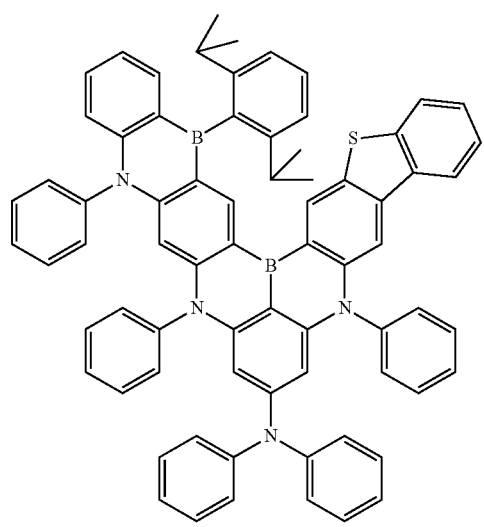
50
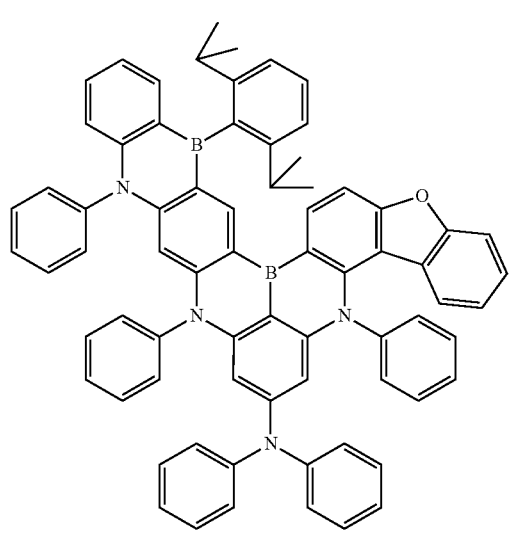
51
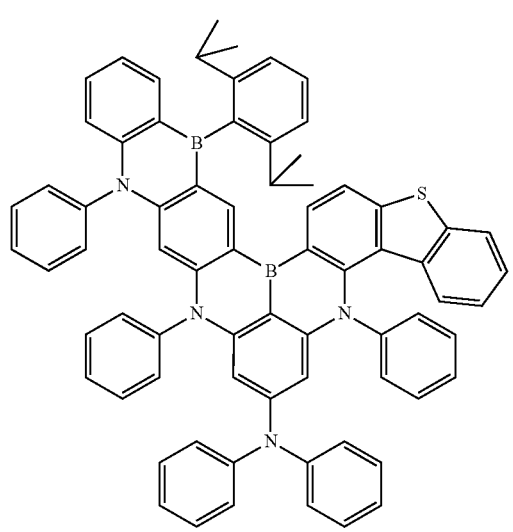
52
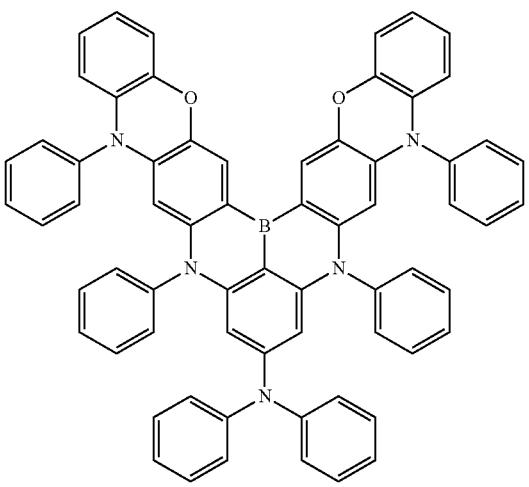
53
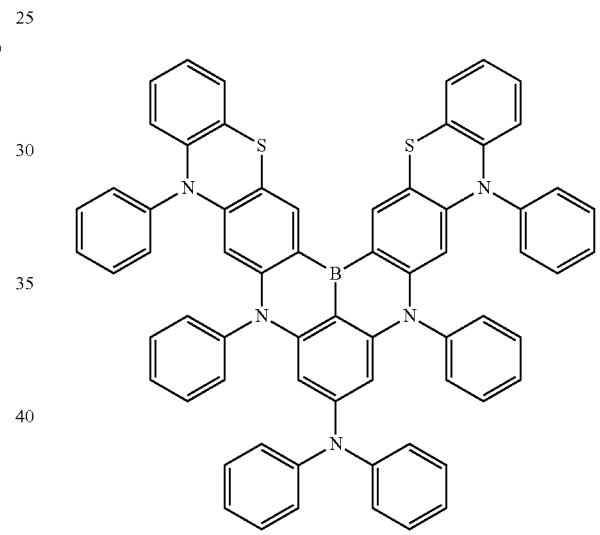
54
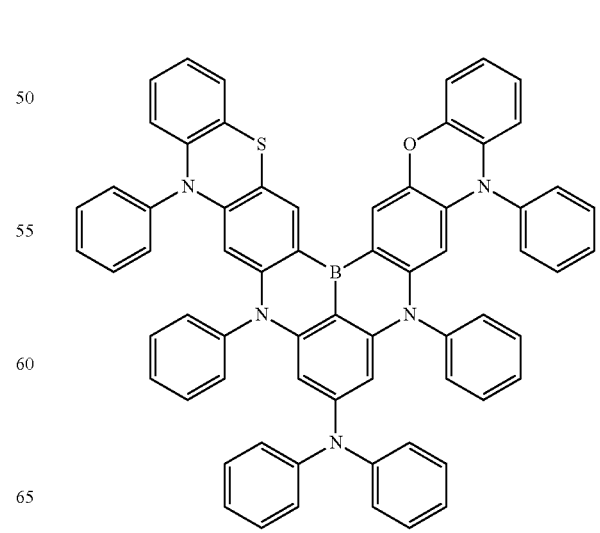

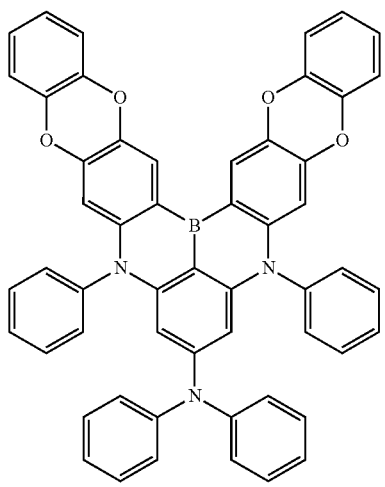
55
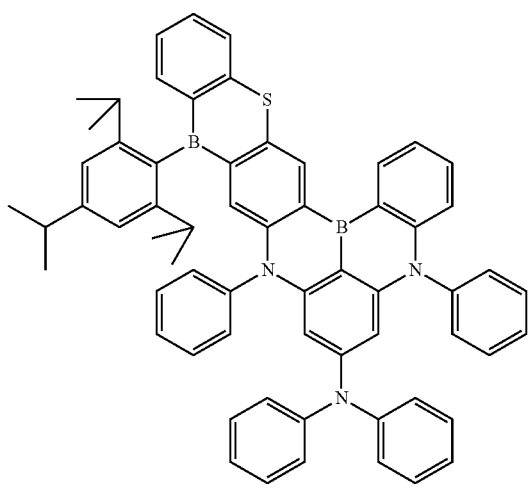
56
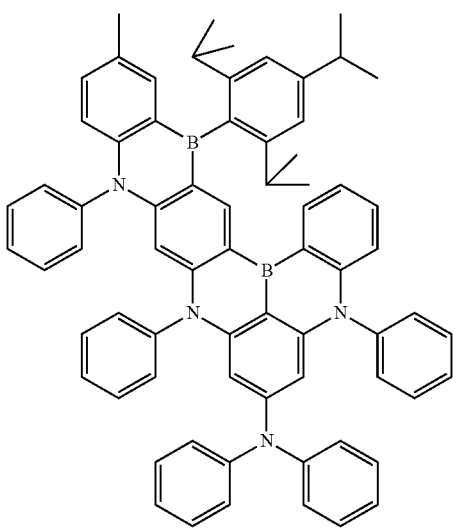
57
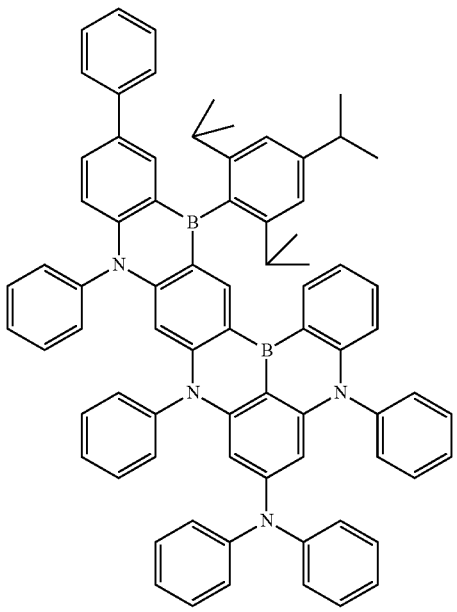

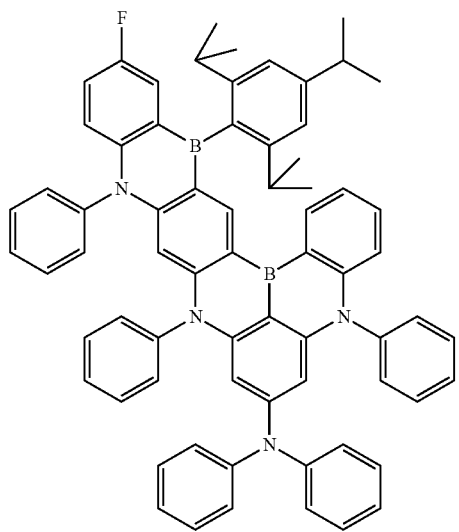
61
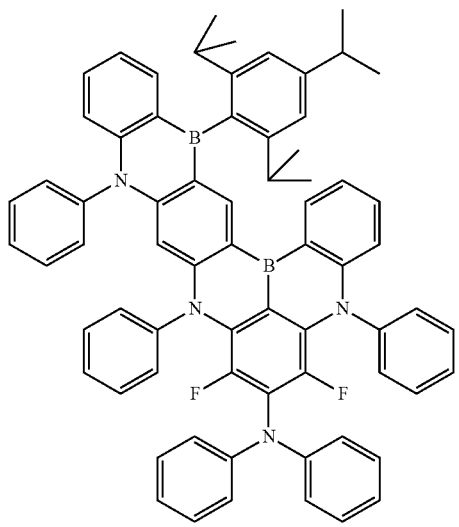
64
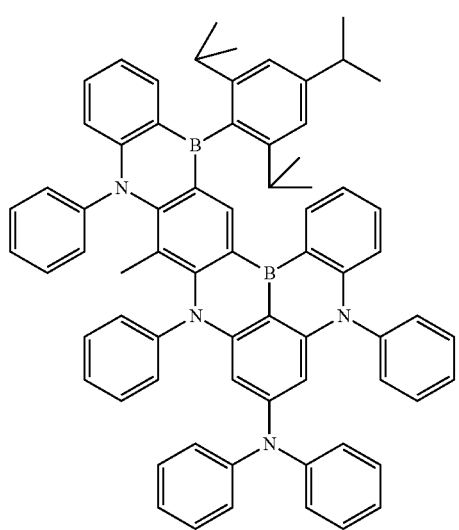
62
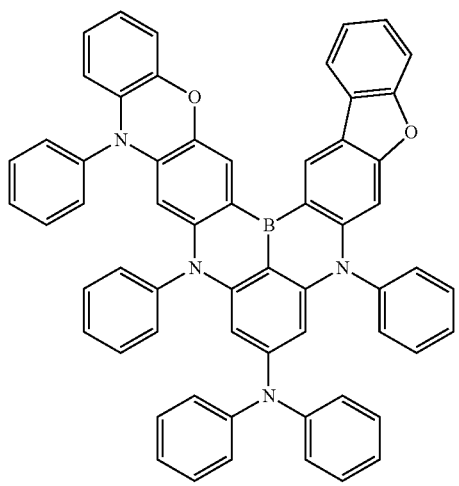
65
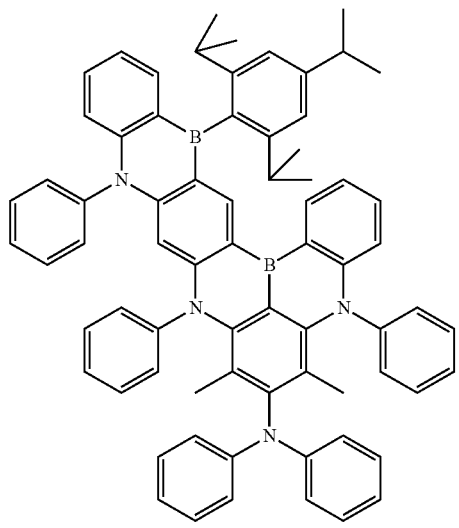
63
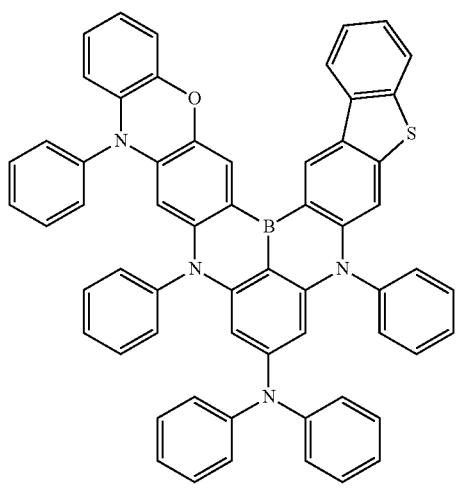
66

-continued
67
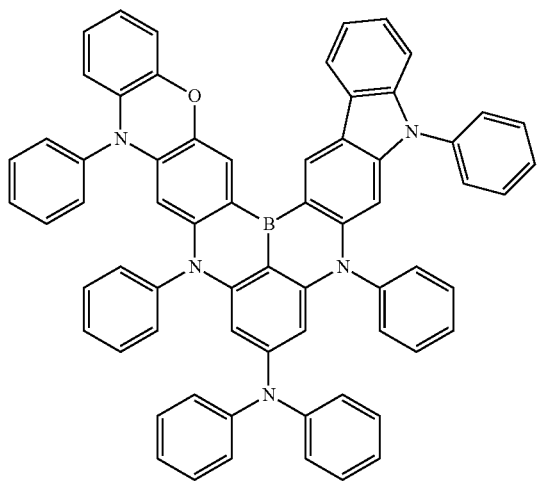
68
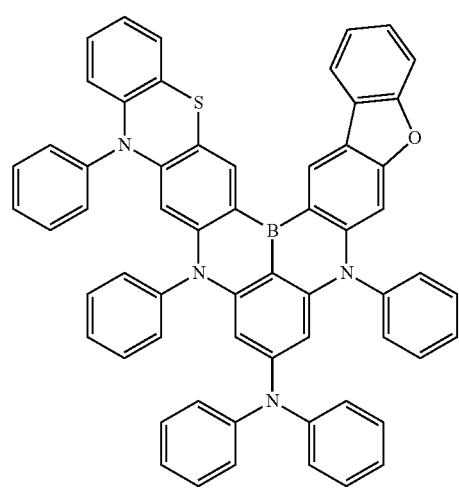
69
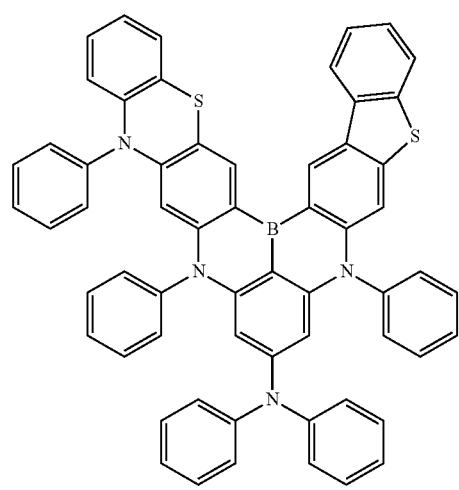
-continued
70
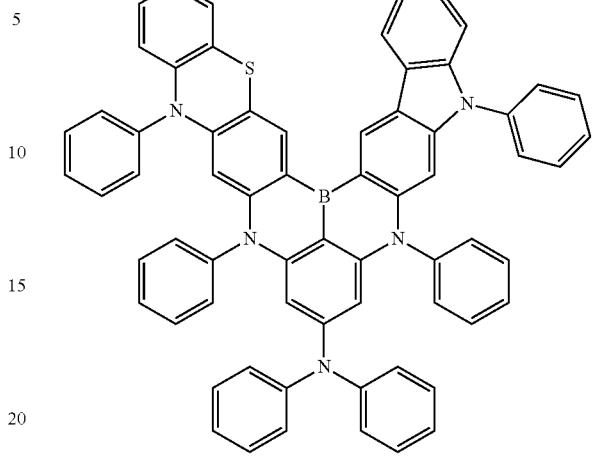
71
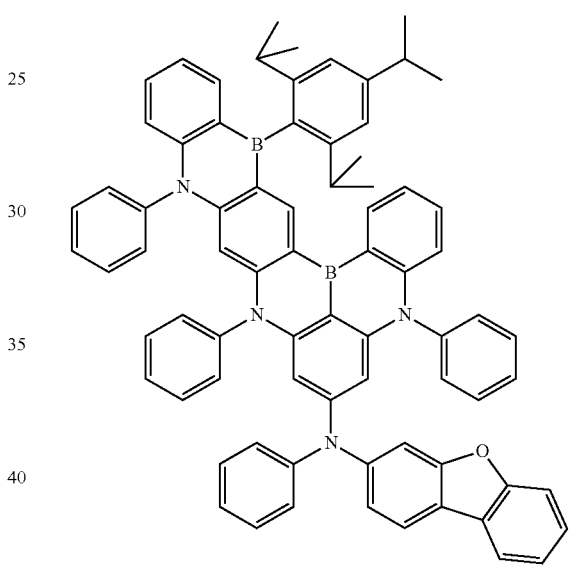
72
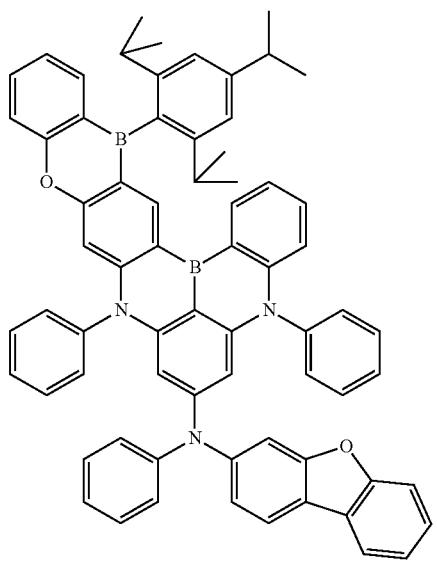

73
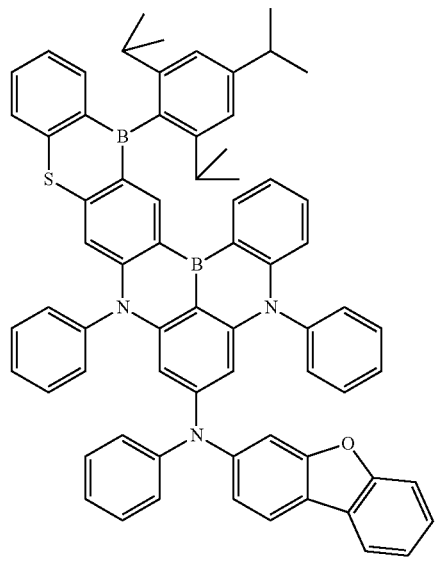
74
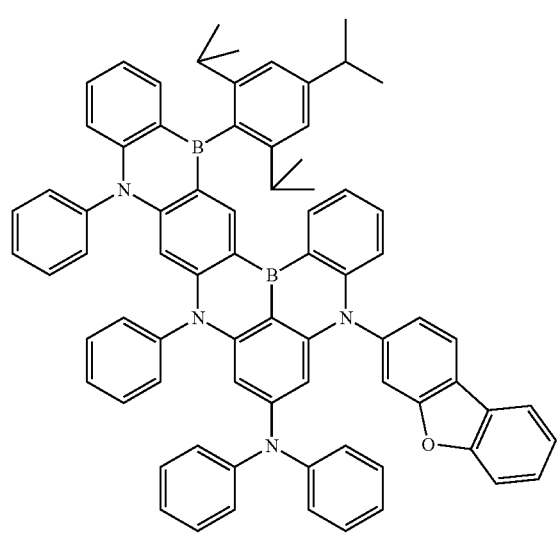
75
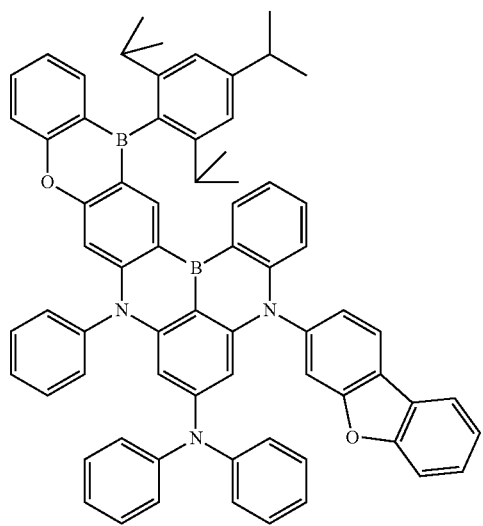
76
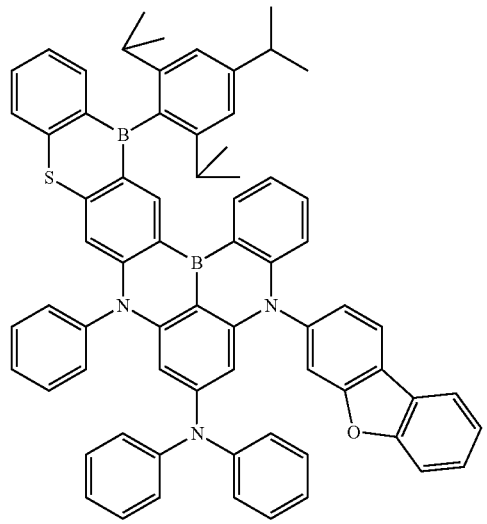
77
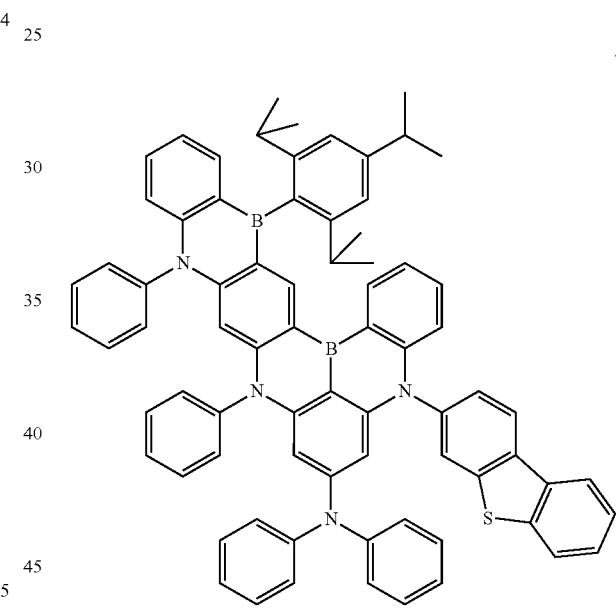
78
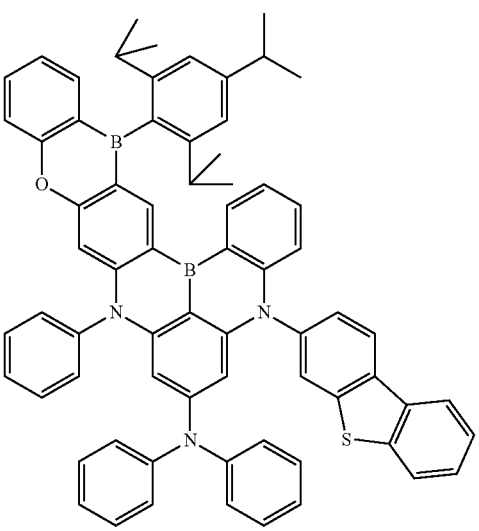

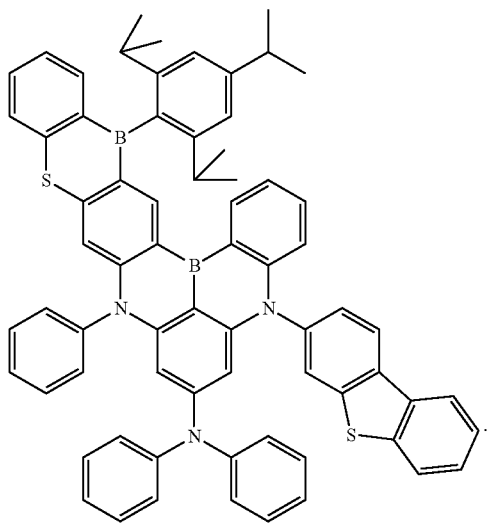

The fused polycyclic compound of the embodiments, represented by Formula 1 may be a thermally activated delayed fluorescence emission material. In addition, the fused polycyclic compound of the embodiments, represented by Formula 1 may be a thermally activated delayed fluorescence dopant having a difference ($\Delta E_{ST}$) between the lowest triplet excitation energy level (T1 level) and the lowest singlet excitation energy level (S1 level) of about 0.2 eV or less. For example, $\Delta E_{ST}$ of the fused polycyclic compound of the embodiments, represented by Formula 1 may be about 0.01 eV or less. The fused polycyclic compound of the embodiments, represented by Formula 1 may be a light-emitting material having a light-emitting central wavelength in a wavelength region of about 430 nm to about 490 nm. For example, the fused polycyclic compound of the embodiments, represented by Formula 1 may be a blue thermally activated delayed fluorescence (TADF) dopant. However, embodiments of the inventive concept are not limited thereto, and in case of using the fused polycyclic compound of the embodiments as the light-emitting material, the fused polycyclic compound may be used as a dopant material emitting light in various wavelength regions, such as a red emitting dopant and/or a green emitting dopant.

In the organic electroluminescence device 10 of the embodiments, the emission layer EML may emit delayed fluorescence. For example, the emission layer EML may emit thermally activated delayed fluorescence (TADF).

In one or more embodiments, the organic electroluminescence device 10 may emit blue light. For example, the emission layer EML of the organic electroluminescence device 10 of the embodiments may emit blue light in a region of about 490 nm or more. However, embodiments of the inventive concept are not limited thereto, and the emission layer EML may emit green light or red light.

In one or more embodiments, the organic electroluminescence device 10 of the embodiments may include a plurality of emission layers. The plurality of emission layers may be laminated one by one (sequentially). For example, the organic electroluminescence device 10 including a plurality of emission layers may emit white light. The organic electroluminescence device including the plurality of emission layers may be an organic electroluminescence device having a tandem structure. If the organic electroluminescence device 10 includes a plurality of emission layers, at least one emission layer EML may include the fused polycyclic compound of the present embodiments.

In one or more embodiments, the emission layer EML includes a host and a dopant, and may include the fused polycyclic compound of the embodiments as a dopant. For example, in the organic electroluminescence device 10 of the embodiments, the emission layer EML may include a host to emit delayed fluorescence and a dopant to emit delayed fluorescence, and may include the fused polycyclic compound as a dopant to emit delayed fluorescence. The emission layer EML may include at least one selected from the fused polycyclic compounds represented in Compound Group 1 as a thermally activated delayed fluorescence dopant.

Meanwhile, as the host material of the emission layer EML, any suitable host materials may be used, and may be selected, without specific limitation, from fluoranthene derivatives, pyrene derivatives, arylacetylene derivatives, anthracene derivatives, fluorene derivatives, perylene derivatives, chrysene derivatives, and the like. In some embodiments, pyrene derivatives, perylene derivatives, and/or anthracene derivatives may be used. For example, as the host material of the emission layer EML, an anthracene derivative represented by the following Formula 6 may be used:

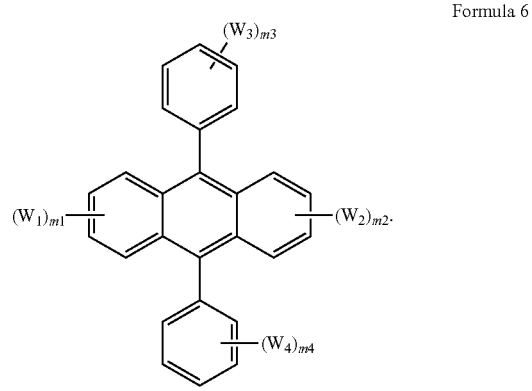

Formula 6

In Formula 6, $W_1$ to $W_4$ may each independently be a hydrogen atom, a deuterium atom, a halogen atom, a substituted or unsubstituted silyl group, a substituted or unsubstituted alkyl group of 1 to 20 carbon atoms, a substituted or unsubstituted aryl group of 6 to 30 carbon atoms to form a ring, or a substituted or unsubstituted heteroaryl group of 2 to 30 carbon atoms to form a ring, and one or more of $W_1$ to $W_4$ may be combined with an adjacent group to form a ring. m1 and m2 may each independently be an integer of 0 to 4, and m3 and m4 may each independently be an integer of 0 to 5.

In case where m1 is 1, $W_1$ may not be a hydrogen atom, in case where m2 is 1, $W_2$ may not be a hydrogen atom, in case where m3 is 1, $W_3$ may not be a hydrogen atom, and in case where m4 is 1, $W_4$ may not be a hydrogen atom.

In case where m1 is 2 or more, a plurality of $W_1$ groups are the same or different. In case where m2 is 2 or more, a plurality of $W_2$ groups are the same or different. In case where m3 is 2 or more, a plurality of $W_3$ groups are the same or different. In case where m4 is 2 or more, a plurality of $W_4$ groups are the same or different.

The compound represented by Formula 6 may include, for example, any of the compounds represented by the structures below. However, embodiments of the present disclosure are not limited thereto:

a-1
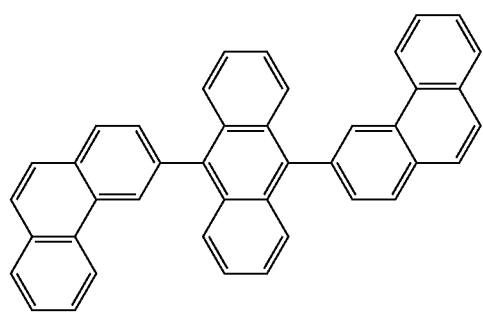
a-2
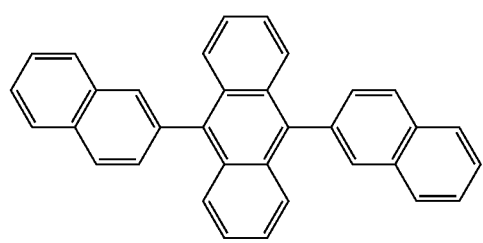
a-3
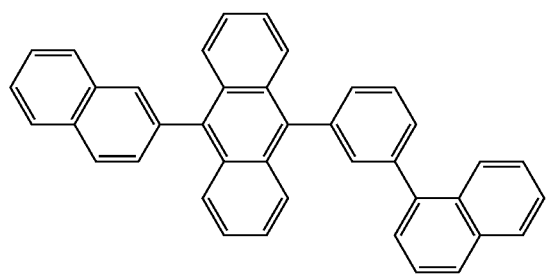
a-4
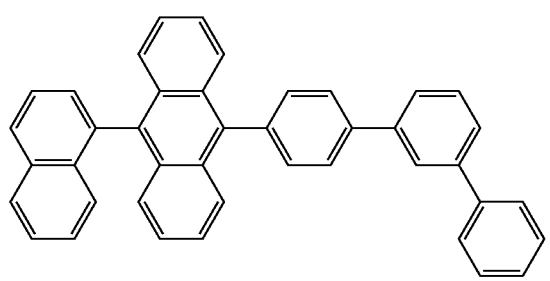
a-5
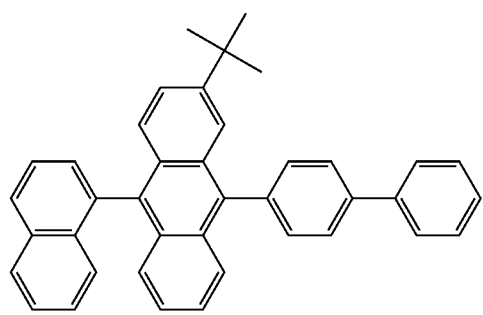
-continued
a-6
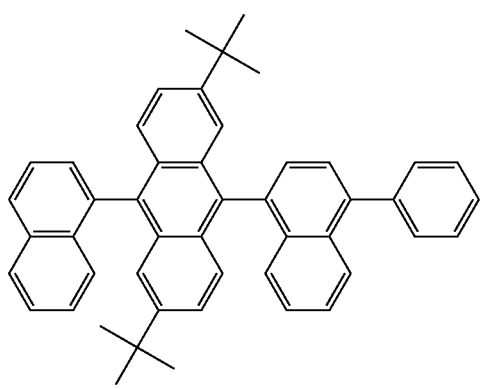
a-7
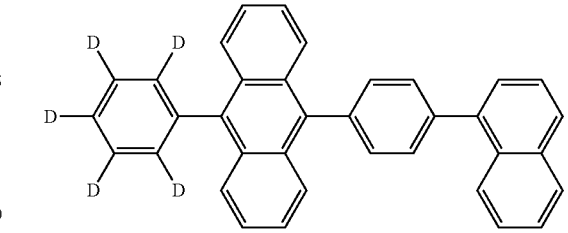
a-8
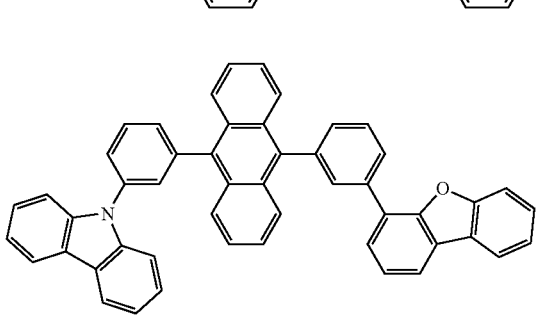
a-9
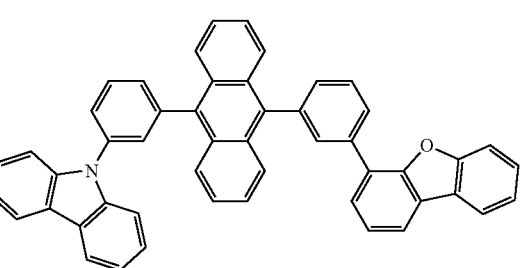
a-10
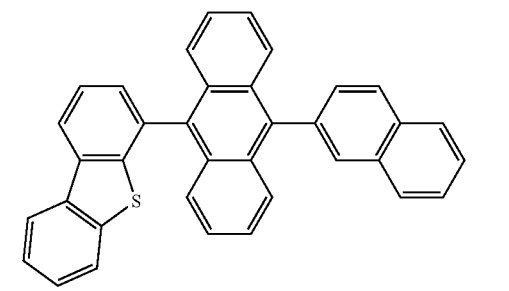

-continued

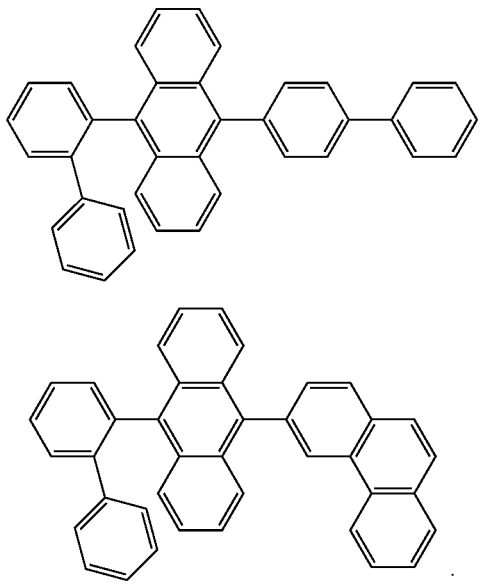

a-11 a-12

In one or more embodiments, the emission layer EML may include, as a host material, tris(8-hydroxyquinolinato) aluminum (Alq$_3$), 4,4'-bis(N-carbazolyl)-1,1'-biphenyl (CBP), poly(N-vinylcarbazole) (PVK), 9,10-di(naphthalene-2-yl)anthracene (ADN), 4,4',4''-tris(carbazol-9-yl)triphenylamine (TCTA), 1,3,5-tris(N-phenyl-1H-benzo[d]imidazol-2-yl)benzene (TPBi), 3-tert-butyl-9,10-di(naphth-2-yl)anthracene (TBADN), distyrylarylene (DSA), 4,4'-bis(9-carbazolyl)-2,2''-dimethyl-biphenyl (CDBP), 2-methyl-9,10-bis(naphthalen-2-yl)anthracene (MADN), bis[2-(diphenylphosphino)phenyl]ether oxide (DPEPO), hexaphenyl cyclotriphosphazene (CP1), 1,4-bis(triphenylsilyl)benzene (UGH2), hexaphenylcyclotrisiloxane (DPSiO$_3$), octaphenylcyclotetrasiloxane (DPSiO$_4$), 2,8-bis(diphenylphosphoryl)dibenzofuran (PPF), 3,3'-bis(N-carbazolyl)-1,1'-biphenyl (mCBP), 1,3-bis(N-carbazolyl)benzene (mCP), etc. However, embodiments of the inventive concept are not limited thereto. Any suitable host materials to emit delayed fluorescence may be included.

Meanwhile, in the organic electroluminescence device 10 of the embodiments, the emission layer EML may further include any suitable dopant material. In one or more embodiments, the emission layer EML may include, as a dopant, styryl derivatives (for example, 1,4-bis[2-(3-N-ethylcarbazoryl)vinyl]benzene (BCzVB), 4-(di-p-tolylamino)-4'-[(di-p-tolylamino)styryl]stilbene (DPAVB), and/or N-(4-((E)-2-(6-((E)-4-(diphenylamino)styryl)naphthalen-2-yl)vinyl)phenyl)-N-phenylbenzenamine (N-BDAVBi), perylene and the derivatives thereof (for example, 2,5,8,11-tetra-t-butylperylene (TBP)), pyrene and the derivatives thereof (for example, 1,1-dipyrene, 1,4-dipyrenylbenzene, and/or 1,4-bis(N,N-diphenylamino)pyrene), etc.

In one or more embodiments, the emission layer EML may include two dopant materials having different lowest triplet excitation energy levels (T1 levels) from each other. In the organic electroluminescence device 10 of the embodiments, the emission layer EML may include a host having a first lowest triplet excitation energy level, a first dopant having a second lowest triplet excitation energy level that is lower than the first lowest triplet excitation energy level, and a second dopant having a third lowest triplet excitation energy level that is lower than the second lowest triplet excitation energy level. In one or more embodiments, the emission layer EML may include the above-described fused polycyclic compound as the first dopant.

In the organic electroluminescence device 10 of the embodiments including the host, the first dopant, and the second dopant in the emission layer EML, the first dopant may be a delayed fluorescence dopant, and the second dopant may be a fluorescence dopant. In addition, in the organic electroluminescence device 10 of the embodiments, the fused polycyclic compound represented by Formula 1 may play the role of an assistant dopant.

For example, in case where the emission layer EML of the organic electroluminescence device 10 of the embodiments includes a plurality of dopants, the emission layer EML may include the polycyclic compound of the embodiments as the first dopant, and any of the above-described dopant materials as the second dopant. For example, in case where the emission layer EML emits blue light, the emission layer EML may further include, as the second dopant, styryl derivatives (for example, 1,4-bis[2-(3-N-ethylcarbazoryl)vinyl]benzene (BCzVB), 4-(di-p-tolylamino)-4'-[(di-p-tolylamino)styryl]stilbene (DPAVB), and/or N-(4-((E)-2-(6-((E)-4-(diphenylamino)styryl)naphthalen-2-yl)vinyl)phenyl)-N-phenylbenzenamine (N-BDAVBi), perylene and/or the derivatives thereof (for example, 2,5,8,11-tetra-t-butylperylene (TBP)), pyrene and/or the derivatives thereof (for example, 1,1-dipyrene, 1,4-dipyrenylbenzene, and/or 1,4-bis(N,N-diphenylamino)pyrene). In one or more embodiments, the second dopant may include a metal complex, an organometallic complex (including Ir, Pt, Pd, etc., as a core atom), perylene, and/or the derivatives thereof.

Meanwhile, in the organic electroluminescence device 10 of the embodiments, including the fused polycyclic compound of the embodiments as the first dopant of the emission layer EML, the emission layer EML may emit green light or red light, and in this case, the second dopant material may be the above-described suitable dopant, a suitable green fluorescence dopant, or a suitable red fluorescence dopant.

In the organic electroluminescence device 10 of the embodiments, the emission layer EML may be a phosphorescence emission layer. For example, the fused polycyclic compound of the embodiments may be included in the emission layer EML as a phosphorescence host material.

In the organic electroluminescence device 10 of the embodiments, as shown in FIGS. 1 to 3, the electron transport region ETR is provided on the emission layer EML. The electron transport region ETR may include at least one of an hole blocking layer HBL, an electron transport layer ETL or an electron injection layer EIL. However, embodiments of the inventive concept are not limited thereto.

The electron transport region ETR may have a single layer formed using a single material, a single layer formed using a plurality of different materials, or a multilayer structure having a plurality of layers formed using a plurality of different materials.

For example, the electron transport region ETR may have a single layer structure of an electron injection layer EIL or an electron transport layer ETL, or a single layer structure formed using an electron injection material and an electron transport material. In some embodiments, the electron transport region ETR may have a single layer structure having a plurality of different materials, or a structure laminated from the emission layer EML of electron transport layer ETL/ electron injection layer EIL, or hole blocking layer HBL/ electron transport layer ETL/electron injection layer EIL, without limitation. The thickness of the electron transport region ETR may be, for example, from about 1,000 Å to about 1,500 Å.

The electron transport region ETR may be formed using one or more suitable methods such as a vacuum deposition method, a spin coating method, a cast method, a Langmuir-Blodgett (LB) method, an inkjet printing method, a laser printing method, and/or a laser induced thermal imaging (LITI) method.

If the electron transport region ETR includes an electron transport layer ETL, the electron transport region ETR may include an anthracene-based compound. The electron transport region may include, for example, tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-ylphenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato) aluminum (BAlq), berylliumbis(benzoquinolin-10-olate (Bebq2), 9,10-di(naphthalene-2-yl)anthracene (ADN), diphenyl(4-(triphenylsilyl)phenyl)phosphine oxide (TSPO1), or a mixture thereof, without limitation. The thickness of the electron transport layer ETL may be from about 100 Å to about 1,000 Å and may be, for example, from about 150 Å to about 500 Å. If the thickness of the electron transport layer ETL satisfies the above-described range, satisfactory (or suitable) electron transport properties may be obtained without substantial increase of a driving voltage.

If the electron transport region ETR includes the electron injection layer EIL, the electron transport region ETR may include a metal halide such as LiF, NaCl, CsF, RbCl, RbI, and/or CuI, a metal from lanthanoides such as Yb, a metal oxide such as $Li_2O$ and/or BaO, and/or LiQ (lithium quinolate). However, embodiments of the inventive concept are not limited thereto. In one or more embodiments, the electron injection layer EIL may be formed using a mixture material of an electron transport material and an insulating organo metal salt. The organo metal salt may be a material having an energy band gap of about 4 eV or more. The organo metal salt may include, for example, metal acetates, metal benzoates, metal acetoacetates, metal acetylacetonates, and/or metal stearates. The thickness of the electron injection layer EIL may be from about 1 Å to about 500 Å, and from about 3 Å to about 300 Å. If the thickness of the electron injection layer EIL satisfies the above described range, satisfactory (or suitable) electron injection properties may be obtained without inducing substantial increase of a driving voltage.

The electron transport region ETR may include a hole blocking layer HBL as described above. The hole blocking layer HBL may include, for example, at least one of 2,9-dimethyl-4,7-diphenyl-1,10-phenanthroline (BCP), or 4,7-diphenyl-1,10-phenanthroline (Bphen). However, embodiments of the inventive concept are not limited thereto.

The second electrode EL2 is provided on the electron transport region ETR. The second electrode EL2 may be a common electrode or a cathode. The second electrode EL2 may be a transmissive electrode, a transflective electrode or a reflective electrode. If the second electrode EL2 is the transmissive electrode, the second electrode EL2 may include a transparent metal oxide, for example, ITO, IZO, ZnO, ITZO, etc.

If the second electrode EL2 is the transflective electrode or the reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). The second electrode EL2 may have a multilayered structure including a reflective layer or a transflective layer formed using any of the above-described materials and a transparent conductive layer formed using ITO, IZO, ZnO, ITZO, etc.

The second electrode EL2 may be connected (or coupled) with an auxiliary electrode. If the second electrode EL2 is connected with the auxiliary electrode, the resistance of the second electrode EL2 may decrease.

The fused polycyclic compound of the embodiments includes an amine group which is bonded to a benzene ring in a para position relative to a boron atom and further includes aryl groups which are connected to the benzene ring via two heteroatoms each, thus resulting in a structure having a fused polycyclic ring including five rings including one boron atom and two nitrogen atoms. Additionally, in some embodiments, the fused polycyclic compound includes aryl group(s) connected via two heteroatoms with the five-ring fused polycyclic heterocycle (which includes one boron atom and two nitrogen atoms as core atoms). Accordingly, the fused polycyclic compound according to the embodiments may have a decreased difference between the lowest singlet excitation energy level (S1 level) and the lowest triplet energy (T1 level) due to the increase of multiple resonance effects. In case of using the fused polycyclic compound of the embodiments as a light-emitting material of an organic electroluminescence device, high efficiency of the organic electroluminescence device may be achieved.

Hereinafter, the fused polycyclic compound according to the embodiments and the organic electroluminescence device of the embodiments of the inventive concept will be particularly explained by referring to particular (example) embodiments and comparative embodiments. The following embodiments are only illustrations to assist the understanding of the inventive concept, and the scope of the inventive concept is not limited thereto.

1. Synthesis of Fused Polycyclic Compounds

First, the synthetic (or synthesis) method of the fused polycyclic compounds according to example embodiments will be particularly explained referring to the synthetic methods of Compound 1, Compound 2, Compound 3, Compound 41, Compound 52, Compound 55 and Compound 67. In addition, the synthetic methods of the fused polycyclic compounds explained below are only embodiments, and the synthetic method of the fused polycyclic compound according to embodiments of the inventive concept is not limited thereto. Further, the synthetic methods of the fused polycyclic compounds of the present embodiments that are not specifically exemplified below should be understood by those of ordinary skill in the art by referring to the present example embodiments.

(1) Synthesis of Compound 1

Synthesis of Compound A

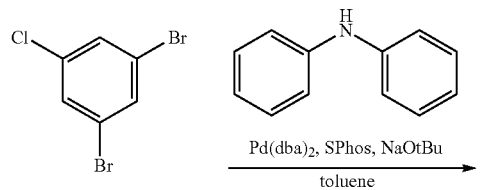

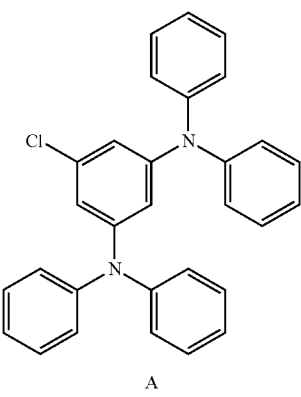

Under an argon (Ar) atmosphere, to a 1,000 ml, three-neck flask, 1,3-dibromo-5-chlorobenzene (25.0 g), diphenylamine (31.3 g), bis(dibenzylideneacetone)palladium(0) (Pd(dba)$_2$, 1.06 g), 2-dicyclohexylphosphino-2',6'-dimethoxybiphenyl (SPhos, 0.76 g), and sodium tert-butoxide (NaOtBu, 18.0 g) were added and dissolved in toluene (300 ml), followed by heating and stirring the resulting mixture to about 100° C. for about 2 hours. Water was added thereto and extraction with CH$_2$Cl$_2$ was carried out. Organic layers were collected and dried with MgSO$_4$, and solvents were distilled under a reduced pressure. The crude product thus obtained was separated by silica gel column chromatography to obtain 37.2 g (yield 90%) of Compound A. The molecular weight of Compound A measured by Fast Atom Bombardment-Mass Spectroscopy (FAB-MS) was 446.

Synthesis of Compound B

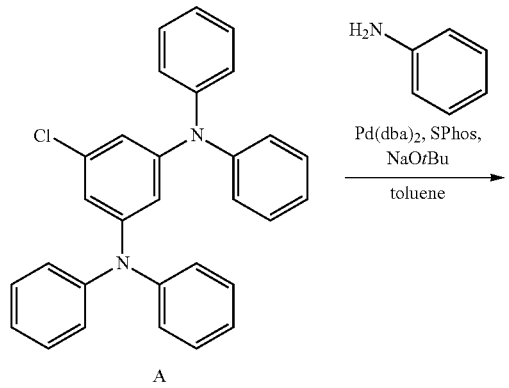

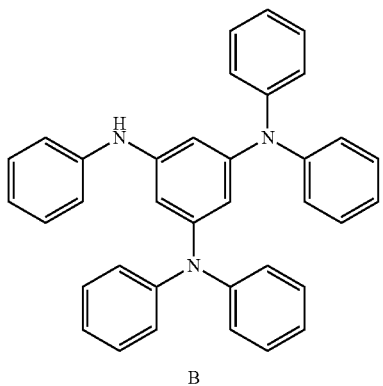

Under an argon (Ar) atmosphere, to a 500 ml, three-neck flask, Compound A (35.0 g), aniline (10.9 g), Pd(dba)$_2$ (0.45 g), SPhos (0.32 g), and NaO$^t$Bu (11.3 g) were added and dissolved in toluene (200 ml), followed by heating and stirring the resulting mixture for about 1 hour. Water was added thereto and extraction with CH$_2$Cl$_2$ was carried out. Organic layers were collected and dried with MgSO$_4$, and solvents were distilled under a reduced pressure. Ethanol was added to the crude product thus obtained and cleaned with ultrasonic waves to obtain 37.1 g (yield 94%) of Compound B. The molecular weight of Compound B measured by FAB-MS was 503.

Synthesis of Compound D

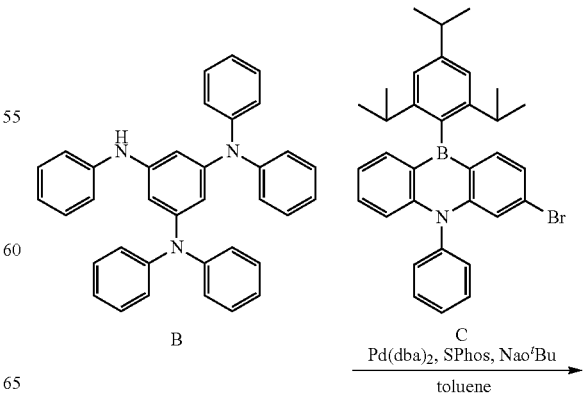

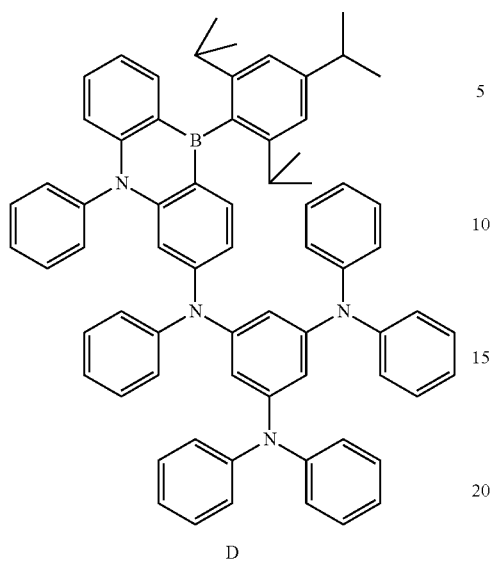

D

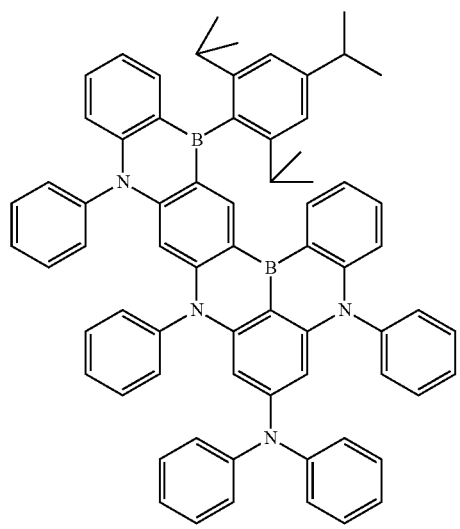

1

Under an argon (Ar) atmosphere, to a 500 ml, three-neck flask, Compound B (10.0 g), azaborinine derivative C (10.7 g), Pd(dba)$_2$ (0.11 g), SPhos (0.08 g), and NaO$^t$Bu (1.91 g) were added and dissolved in toluene (100 ml), followed by heating and refluxing the resulting mixture for about 3 hours. Meanwhile, azaborinine derivative C was synthesized referring to a non-patent document (Adv. Funct. Mater. 2018, 28, 1802031), the entire content of which is hereby incorporated by reference.

Water was added thereto and extraction with CH$_2$Cl$_2$ was carried out. Organic layers were collected and dried with MgSO$_4$, and solvents were distilled under a reduced pressure. The crude product thus obtained was separated by silica gel column chromatography to obtain 16.9 g (yield 89%) of Compound D. The molecular weight of Compound D measured by FAB-MS was 959.

Synthesis of Compound 1

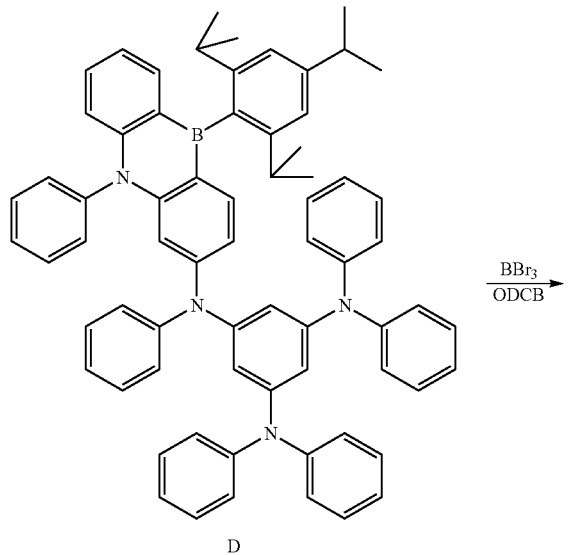

D

Under an argon (Ar) atmosphere, to a 300 ml, three-neck flask, Compound D (16.0 g) was added, dissolved in dichlorobenzene (ODCB, 100 ml) and cooled to about 0° C. in an ice bath. Then, boron tribromide (BBr$_3$, 3.1 ml) was added thereto dropwisely. After finishing the dropwise addition, the reaction mixture was heated and stirred at about 150° C. for about 3 hours and then, cooled to about 0° C. in an ice bath, and triethylamine (23 ml) was added thereto. The temperature was increased back to room temperature and the reaction solution was filtered by silica gel. The filtrate solvent was distilled in a reduced pressure. The crude product thus obtained was separated by recrystallization from toluene to obtain 1.29 g (yield 8%) of Compound 1. The molecular weight measured by FAB-MS of Compound 1 was 966. Through the results, it was confirmed that the compound thus obtained was Compound 1.

(2) Synthesis of Compound 2

Synthesis of Compound F

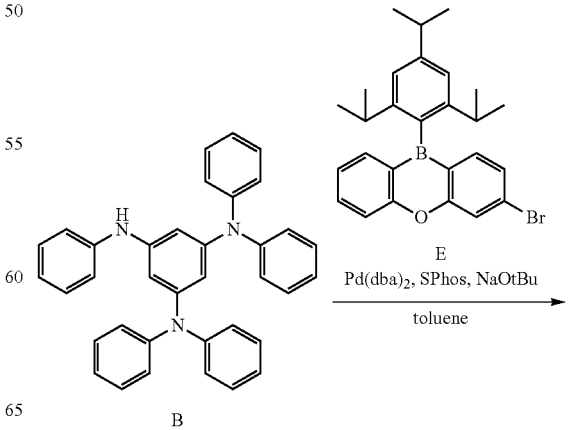

B

-continued

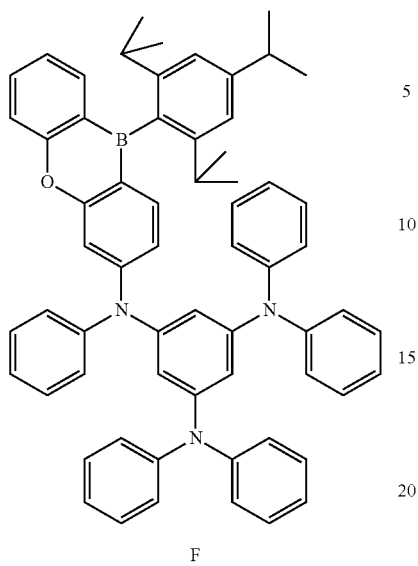

F

-continued

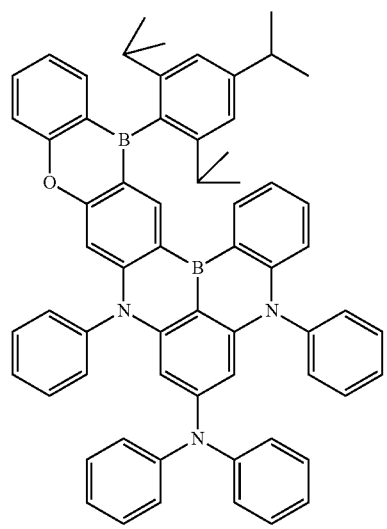

2

Under an argon (Ar) atmosphere, to a 500 ml, three-neck flask, Compound B (10.0 g), Compound E (9.16 g), Pd(dba)$_2$ (0.11 g), SPhos (0.08 g), and NaO$^t$Bu (1.91 g) were added and dissolved in toluene (100 ml), followed by heating and refluxing the resulting mixture for about 3 hours. Meanwhile, oxaborinine derivative E was synthesized referring to a non-patent document (Chem. Commun. 2015, 51, 9443-9446), the entire content of which is hereby incorporated by reference. Water was added thereto and extraction with CH$_2$Cl$_2$ was carried out. Organic layers were collected and dried with MgSO$_4$, and solvents were distilled under a reduced pressure. The crude product thus obtained was separated by silica gel column chromatography to obtain 16.1 g (yield 92%) of Compound F. The molecular weight of Compound F measured by FAB-MS was 883.

Synthesis of Compound 2

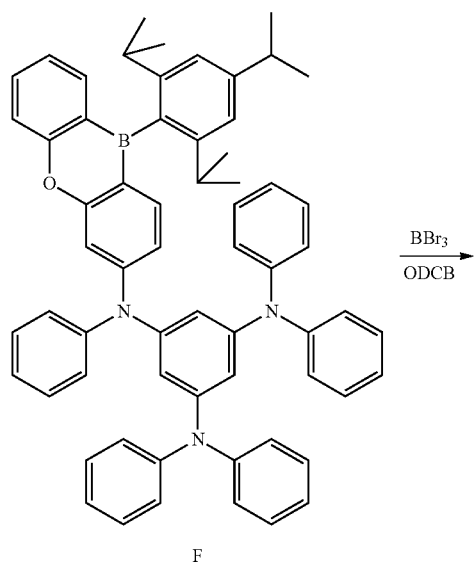

F

Under an argon (Ar) atmosphere, to a 300 ml, three-neck flask, Compound F (16.0 g) was added and dissolved in ODCB (100 ml) and then, cooled to about 0° C. in an ice bath. Then, BBr$_3$ (3.4 ml) was added thereto dropwise. After finishing the dropwise addition, the reaction mixture was heated and stirred to about 150° C. for about 2 hours and then, cooled to about 0° C. in an ice bath and triethylamine (25 ml) was added thereto. The temperature was increased back to room temperature and the reaction solution was filtered by silica gel. The filtrate solvent was distilled in a reduced pressure. The crude product thus obtained was separated by recrystallization from toluene to obtain 1.61 g (yield 10%) of Compound 2. The molecular weight measured by FAB-MS of Compound 2 was 891. Through the results, it was confirmed that the compound thus obtained was Compound 2.

(3) Synthesis of Compound 3

Synthesis of Compound H

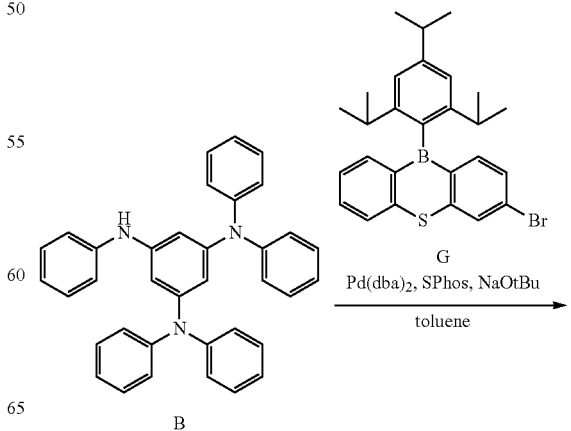

B

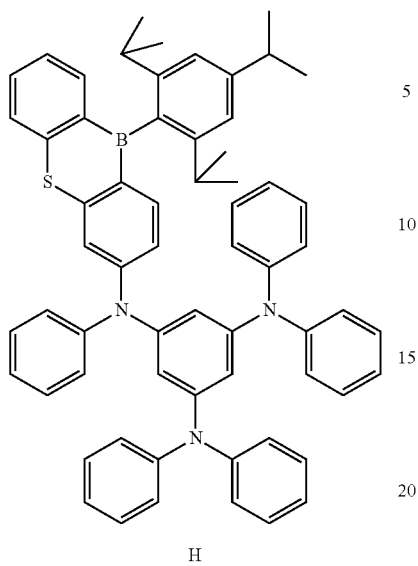

H

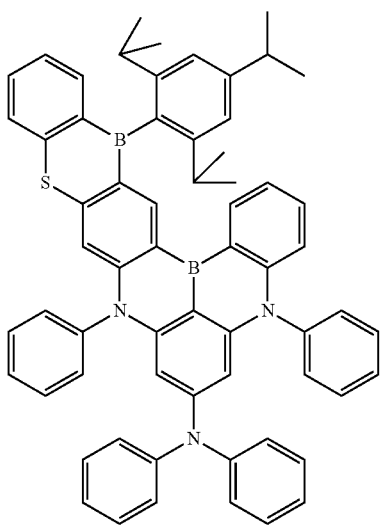

3

Under an argon (Ar) atmosphere, to a 500 ml, three-neck flask, Compound B (10.0 g), thiaborinine derivative G (9.48 g), Pd(dba)$_2$ (0.11 g), SPhos (0.08 g), and NaO$^t$Bu (1.91 g) were added and dissolved in toluene (100 ml), followed by heating and refluxing the resulting mixture for about 3 hours. Meanwhile, thiaborinine derivative G was synthesized referring to a non-patent document (Adv. Funct. Mater. 2018, 28, 1802031), the entire content of which is hereby incorporated by reference. Water was added thereto and extraction with CH$_2$Cl$_2$ was carried out. Organic layers were collected and dried with MgSO$_4$, and solvents were distilled under a reduced pressure. The crude product thus obtained was separated by silica gel column chromatography to obtain 15.3 g (yield 86%) of Compound H. The molecular weight of Compound H measured by FAB-MS was 900.

Synthesis of Compound 3

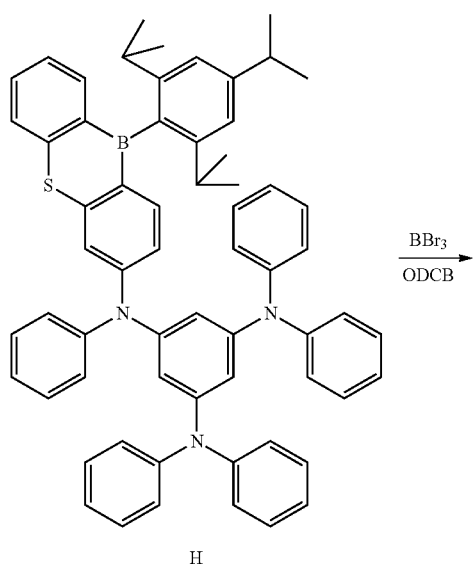

H

Under an argon (Ar) atmosphere, to a 300 ml, three-neck flask, Compound H (15.0 g) was added and dissolved in ODCB (100 ml) and then, cooled to about 0° C. in an ice bath. Then, BBr$_3$ (3.1 ml) was added thereto dropwisely. After finishing the dropwise addition, the reaction mixture was heated and stirred at about 150° C. for about 2 hours and then, cooled to about 0° C. in an ice bath and triethylamine (23 ml) was added thereto. The temperature was increased back to room temperature and the reaction solution was filtered by silica gel. The filtrate solvent was distilled in a reduced pressure. The crude product thus obtained was separated by recrystallization from toluene to obtain 1.06 g (yield 7%) of Compound 3. The molecular weight measured by FAB-MS of Compound 3 was 907. Through the results, it was confirmed that the compound thus obtained was Compound 3.

(4) Synthesis of Compound 41

Synthesis of Compound J

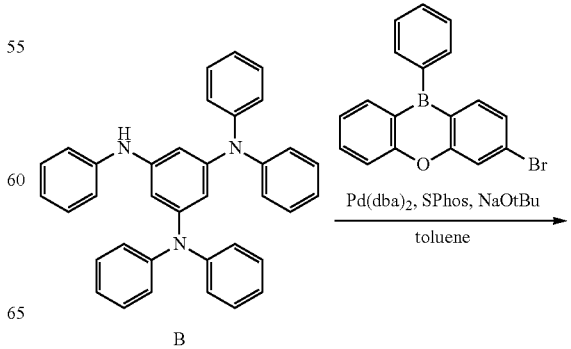

B

-continued

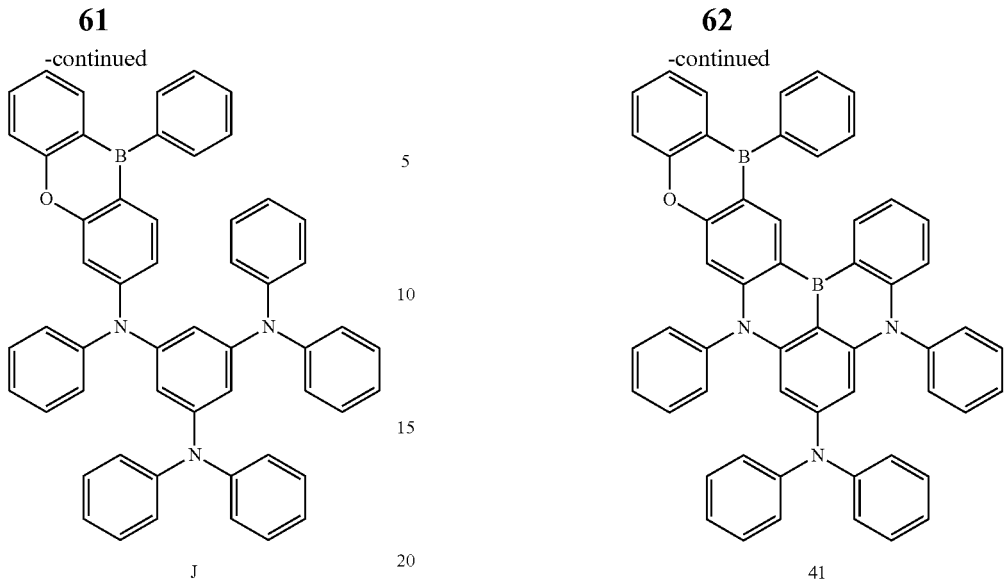

J

Under an argon (Ar) atmosphere, to a 500 ml, three-neck flask, Compound B (15.0 g), 3-bromo-10-phenylphenoxazine (10.1 g), Pd(dba)$_2$ (0.17 g), SPhos (0.12 g), and NaO$^t$Bu (2.86 g) were added and dissolved in toluene (100 ml), followed by heating and refluxing the resulting mixture for about 3 hours. Water was added thereto and extraction with CH$_2$Cl$_2$ was carried out. Organic layers were collected and dried with MgSO$_4$, and solvents were distilled under a reduced pressure. The crude product thus obtained was separated by silica gel column chromatography to obtain 17.4 g (yield 77%) of Compound J. The molecular weight of Compound J measured by FAB-MS was 760.

Synthesis of Compound 41

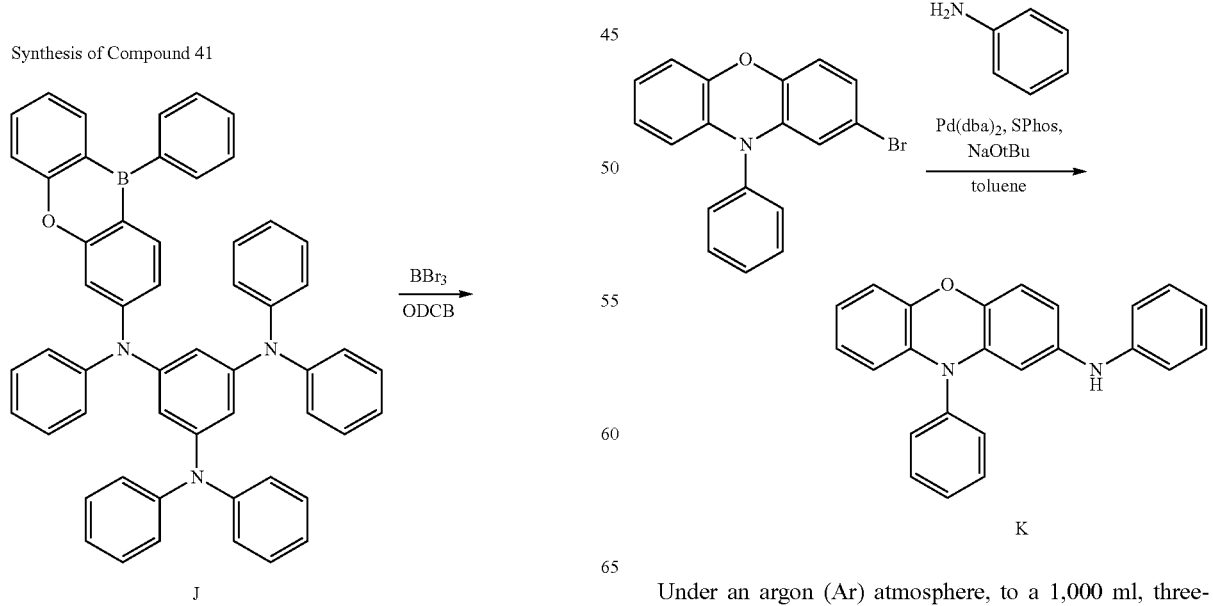

-continued

41

Under an argon (Ar) atmosphere, to a 300 ml, three-neck flask, Compound J (15.0 g) was added and dissolved in ODCB (100 ml) and then, cooled to about 0° C. in an ice bath. Then, BBr$_3$ (3.7 ml) was added thereto dropwise. After finishing the dropwise addition, the reaction mixture was heated and stirred at about 150° C. for about 2 hours and then, cooled to about 0° C. in an ice bath and triethylamine (27 ml) was added thereto. The temperature was increased back to room temperature and the reaction solution was filtered by silica gel. The filtrate solvent was distilled in a reduced pressure. The crude product thus obtained was separated by recrystallization from toluene to obtain 2.27 g (yield 15%) of Compound 41. The molecular weight measured by FAB-MS of Compound 41 was 768. Through the results, it was confirmed that the compound thus obtained was Compound 41.

(5) Synthesis of Compound 52

Synthesis of Compound K

Synthesis of Compound K

K

Under an argon (Ar) atmosphere, to a 1,000 ml, three-neck flask, 2-bromo-10-phenylphenoxazine (30.0 g), aniline (8.26 g), Pd(dba)₂ (0.51 g), SPhos (0.36 g), and NaOʳBu (8.52 g) were added and dissolved in toluene (300 ml), followed by heating and refluxing the resulting mixture for about 1 hour. Water was added thereto and extraction with CH₂Cl₂ was carried out. Organic layers were collected and dried with MgSO₄, and solvents were distilled under a reduced pressure. The crude product thus obtained was separated by silica gel column chromatography to obtain 23.3 g (yield 75%) of Compound K. The molecular weight of Compound K measured by FAB-MS was 350.

Synthesis of Compound L

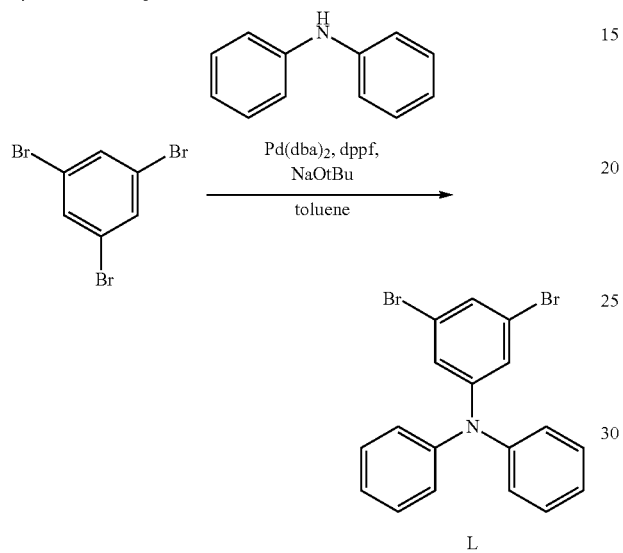

Under an argon (Ar) atmosphere, to a 1,000 ml, three-neck flask, 1,3,5-tribromobenzene (50.0 g), diphenylamine (26.8 g), Pd(dba)₂ (0.91 g), bis(diphenylphosphino)ferrocene (dppf, 1.76 g), and NaOʳBu (15.3 g) were added and dissolved in toluene (300 ml), followed by heating and refluxing the resulting mixture for about 2 hours. Water was added thereto and extraction with CH₂Cl₂ was carried out. Organic layers were collected and dried with MgSO₄, and solvents were distilled under a reduced pressure. The crude product thus obtained was separated by silica gel column chromatography to obtain 25.6 g (yield 40%) of Compound L. The molecular weight of Compound L measured by FAB-MS was 403.

Synthesis of Compound M

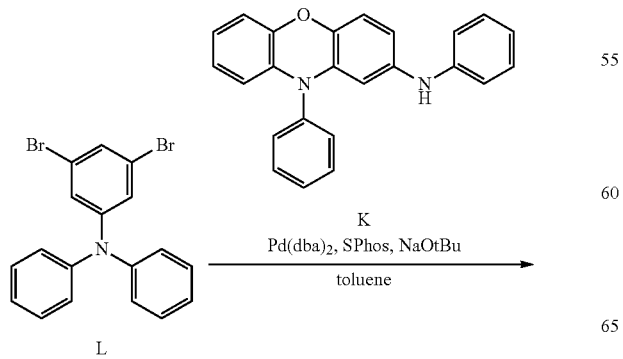

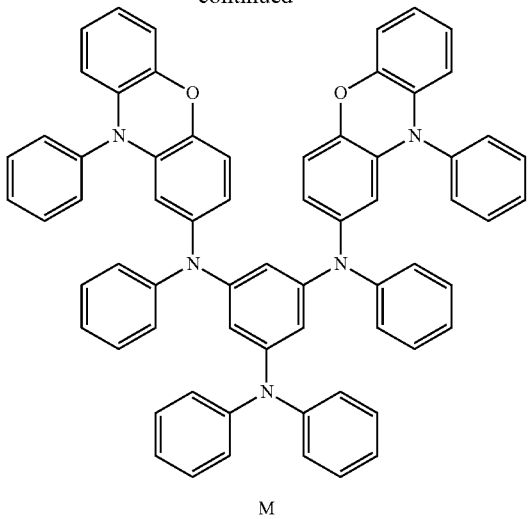

Under an argon (Ar) atmosphere, to a 500 ml, three-neck flask, Compound L (10.0 g), Compound K (17.4 g), Pd(dba)₂ (0.14 g), SPhos (0.10 g), and NaOʳBu (4.80 g) were added and dissolved in toluene (100 ml), followed by heating and refluxing the resulting mixture for about 3 hours. Water was added thereto and extraction with CH₂Cl₂ was carried out. Organic layers were collected and dried with MgSO₄, and solvents were distilled under a reduced pressure. The crude product thus obtained was separated by silica gel column chromatography to obtain 15.9 g (yield 68%) of Compound M. The molecular weight of Compound M measured by FAB-MS was 942.

Synthesis of Compound 52

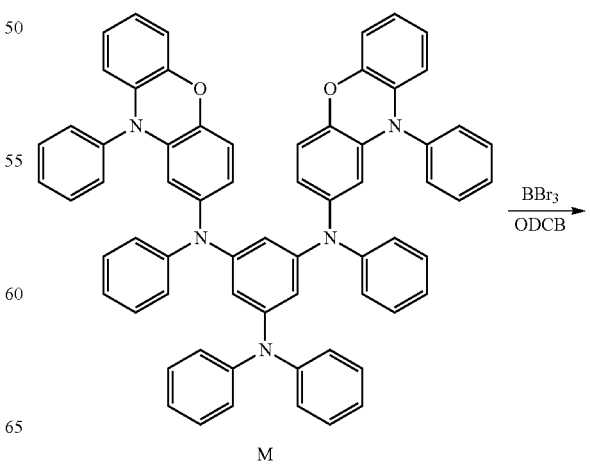

-continued

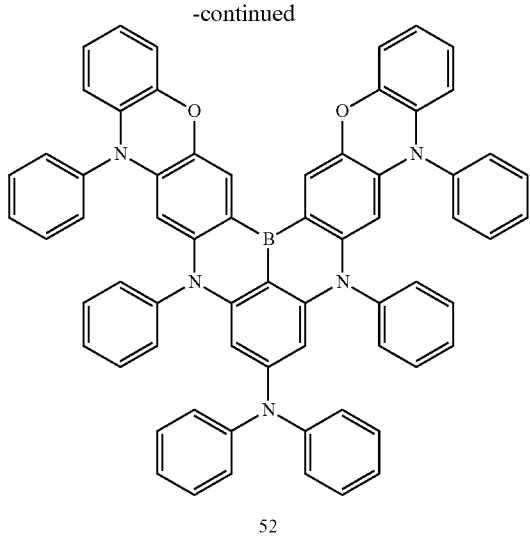

52

Under an argon (Ar) atmosphere, to a 300 ml, three-neck flask, Compound M (15.0 g) was added and dissolved in ODCB (100 ml) and then, cooled to about 0° C. in an ice bath. Then, BBr$_3$ (3.0 ml) was added thereto dropwisely. After finishing the dropwise addition, the reaction mixture was heated and stirred at about 150° C. for about 4 hours and then, cooled to about 0° C. in an ice bath and triethylamine (22 ml) was added thereto. The temperature was increased back to room temperature and the reaction solution was filtered by silica gel. The filtrate solvent was distilled in a reduced pressure. The crude product thus obtained was separated by recrystallization from toluene to obtain 3.02 g (yield 20%) of Compound 52. The molecular weight measured by FAB-MS of Compound 52 was 949. Through the results, it was confirmed that the compound thus obtained was Compound 52.

(6) Synthesis of Compound 55

Synthesis of Compound N

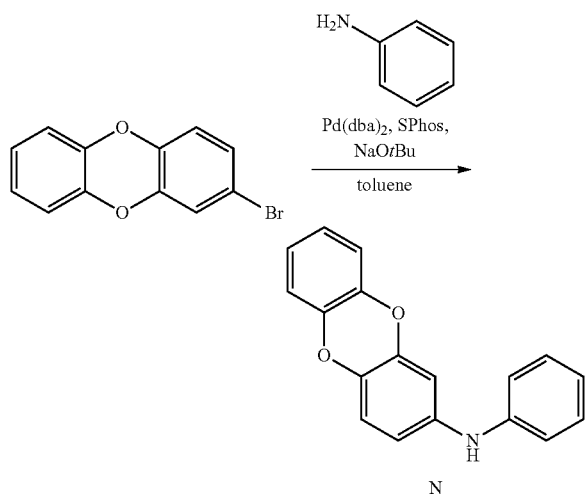

Under an argon (Ar) atmosphere, to a 1,000 ml, three-neck flask, 2-bromodibenzodioxine (30.0 g), aniline (10.6 g), Pd(dba)$_2$ (0.66 g), SPhos (0.46 g), and NaO$^t$Bu (11.0 g) were added and dissolved in toluene (400 ml), followed by heating and refluxing the resulting mixture for about 3 hours. Water was added thereto and extraction with CH$_2$Cl$_2$ was carried out. Organic layers were collected and dried with MgSO$_4$, and solvents were distilled under a reduced pressure. The crude product thus obtained was separated by silica gel column chromatography to obtain 21.9 g (yield 70%) of Compound N. The molecular weight of Compound N measured by FAB-MS was 275.

Synthesis of Compound O

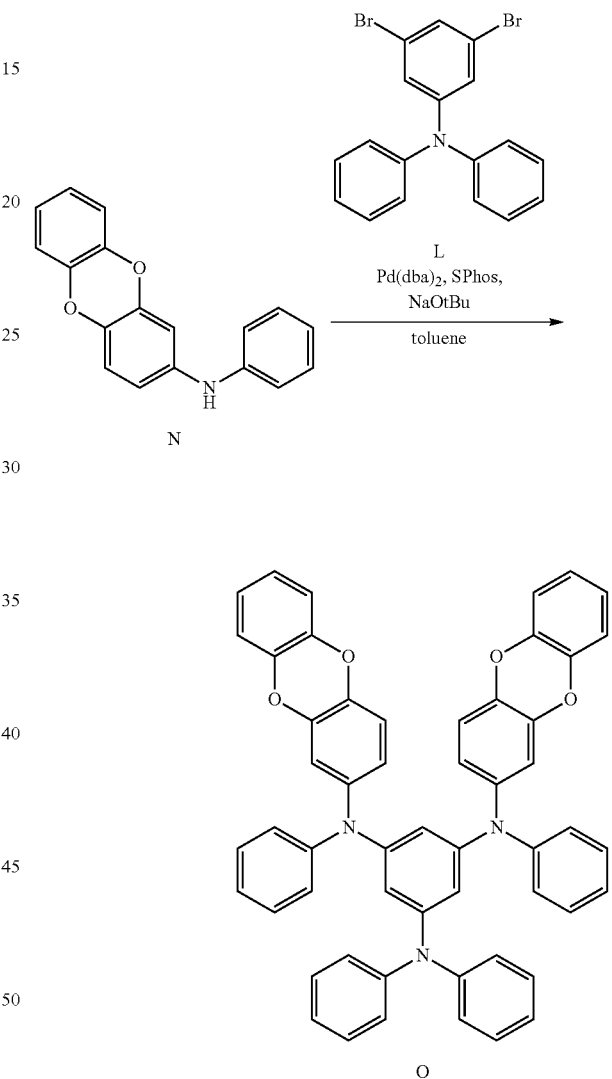

Under an argon (Ar) atmosphere, to a 1,000 ml, three-neck flask, Compound N (20.0 g), Compound L (14.6 g), Pd(dba)$_2$ (0.41 g), SPhos (0.30 g), and NaO$^t$Bu (6.98 g) were added and dissolved in toluene (250 ml), followed by heating and refluxing the resulting mixture for about 4 hours. Water was added thereto and extraction with CH$_2$Cl$_2$ was carried out. Organic layers were collected and dried with MgSO$_4$, and solvents were distilled under a reduced pressure. The crude product thus obtained was separated by silica gel column chromatography to obtain 18.7 g (yield 65%) of Compound O. The molecular weight of Compound O measured by FAB-MS was 791.

Synthesis of Compound 55

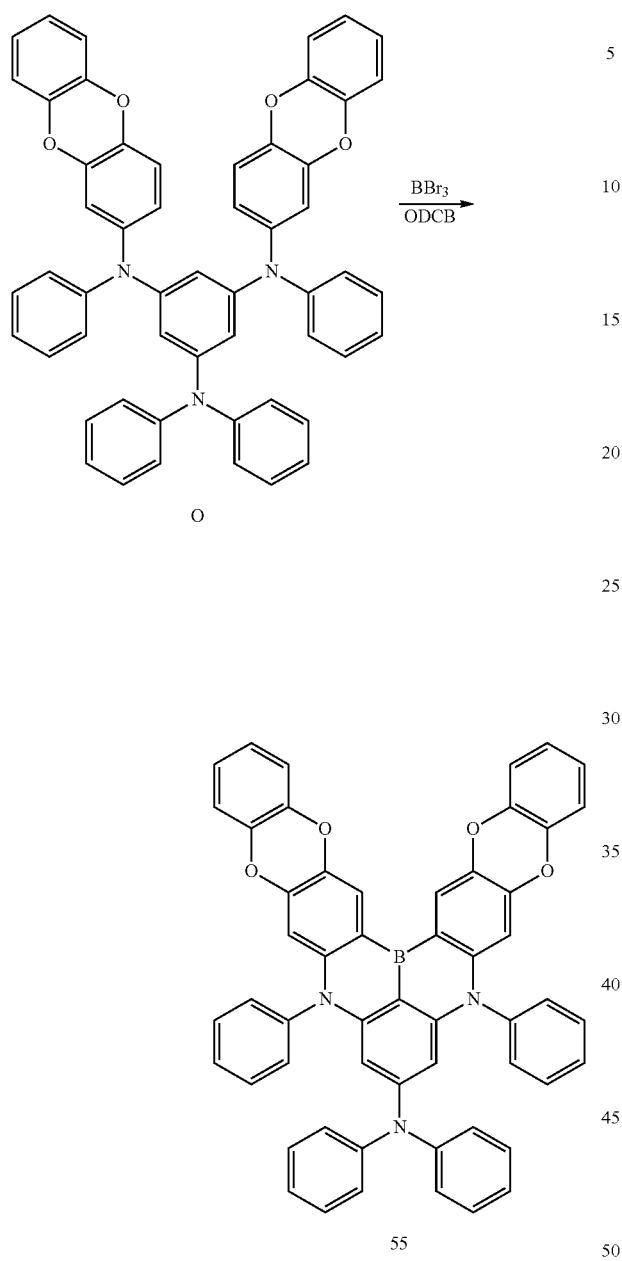

filtered by silica gel. The filtrate solvent was distilled in a reduced pressure. The crude product thus obtained was separated by recrystallization from toluene to obtain 2.73 g (yield 18%) of Compound 55. The molecular weight measured by FAB-MS of Compound 55 was 799. Through the results, it was confirmed that the compound thus obtained was Compound 55.

(7) Synthesis of Compound 67

Synthesis of Compound P

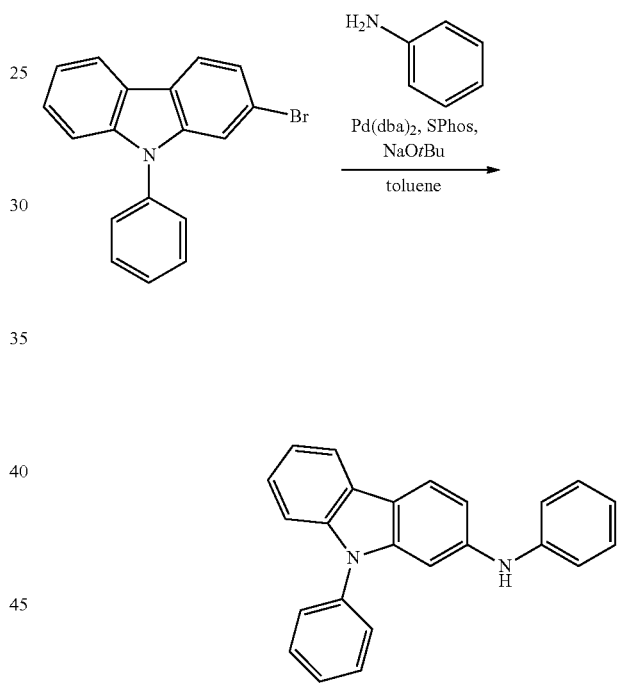

Under an argon (Ar) atmosphere, to a 300 ml, three-neck flask, Compound O (15.0 g) was added and dissolved in ODCB (100 ml) and then, cooled to about 0° C. in an ice bath. Then, BBr$_3$ (3.5 ml) was added thereto dropwisely. After finishing the dropwise addition, the reaction mixture was heated and stirred at about 150° C. for about 2 hours and then, cooled to about 0° C. in an ice bath and triethylamine (26 ml) was added thereto. The temperature was increased back to room temperature and the reaction solution was Under an argon (Ar) atmosphere, to a 1,000 ml, three-neck flask, 2-bromo-9-phenylcarbazole (50.0 g), aniline (14.5 g), Pd(dba)$_2$ (0.90 g), SPhos (0.64 g), and NaO$^t$Bu (14.9 g) were added and dissolved in toluene (400 ml), followed by heating and refluxing the resulting mixture for about 3 hours. Water was added thereto and extraction with CH$_2$Cl$_2$ was carried out. Organic layers were collected and dried with MgSO$_4$, and solvents were distilled under a reduced pressure. The crude product thus obtained was separated by silica gel column chromatography to obtain 35.3 g (yield 68%) of Compound P. The molecular weight of Compound P measured by FAB-MS was 334.

Synthesis of Compound Q

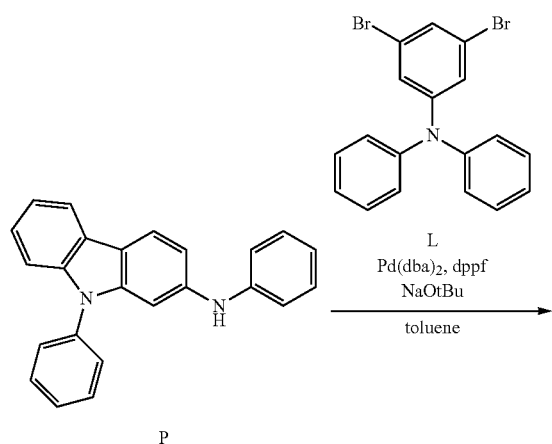

P

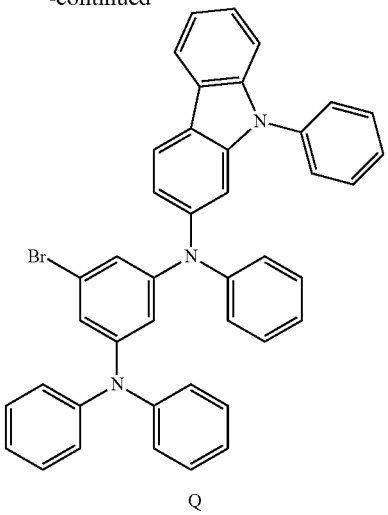

Q

Under an argon (Ar) atmosphere, to a 1,000 ml, three-neck flask, Compound P (20.0 g), L (24.1 g), Pd(dba)$_2$ (0.34 g), dppf (0.66 g), and NaO$^t$Bu (5.74 g) were added and dissolved in toluene (200 ml), followed by heating and refluxing the resulting mixture for about 2 hours. Water was added thereto and extraction with CH$_2$Cl$_2$ was carried out. Organic layers were collected and dried with MgSO$_4$, and solvents were distilled under a reduced pressure. The crude product thus obtained was separated by silica gel column chromatography to obtain 20.4 g (yield 52%) of Compound Q. The molecular weight of Compound Q measured by FAB-MS was 656.

Synthesis of Compound R

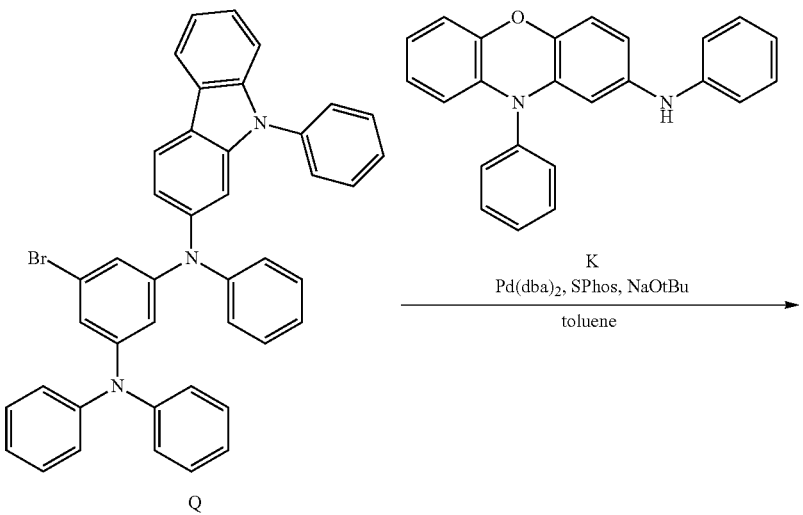

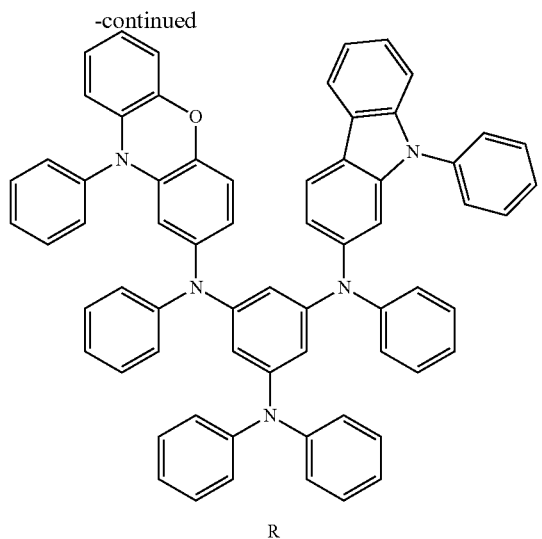

R

Under an argon (Ar) atmosphere, to a 500 ml, three-neck flask, Compound Q (19.0 g), Compound K (10.1 g), Pd(dba)$_2$ (0.16 g), SPhos (0.12 g), and NaO$^t$Bu (2.78 g) were added and dissolved in toluene (100 ml), followed by heating and refluxing the resulting mixture for about 3 hours. Water was added thereto and extraction with CH$_2$Cl$_2$ was carried out. Organic layers were collected and dried with MgSO$_4$, and solvents were distilled under a reduced pressure. The crude product thus obtained was separated by silica gel column chromatography to obtain 17.4 g (yield 65%) of Compound R. The molecular weight of Compound R measured by FAB-MS was 926.

Synthesis of Compound 67

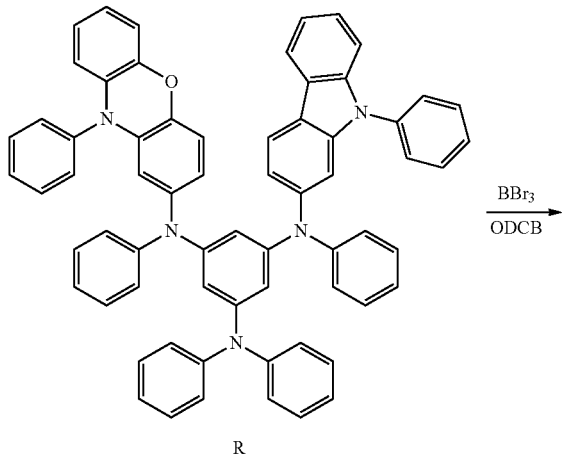

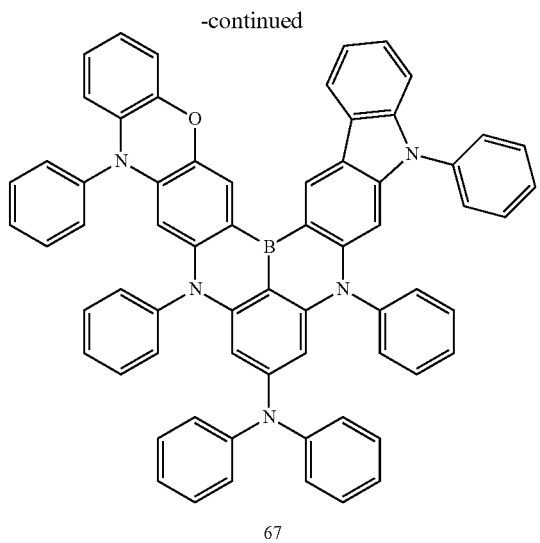

67

Under an argon (Ar) atmosphere, to a 300 ml, three-neck flask, Compound R (15.0 g) was added and dissolved in ODCB (100 ml) and then, cooled to about 0° C. in an ice bath. Then, BBr$_3$ (3.1 ml) was added thereto dropwisely. After finishing the dropwise addition, the reaction mixture was heated and stirred at about 150° C. for about 4 hours and then, cooled to about 0° C. in an ice bath and triethylamine (22 ml) was added thereto. The temperature was increased back to room temperature and the reaction solution was filtered by silica gel. The filtrate solvent was distilled in a reduced pressure. The crude product thus obtained was separated by recrystallization from toluene to obtain 2.12 g (yield 14%) of Compound 67. The molecular weight measured by FAB-MS of Compound 67 was 933. Through the results, it was confirmed that the compound thus obtained was Compound 67.

2. Manufacture and Evaluation of Organic Electroluminescence Device Including Fused Polycyclic Compound Manufacture of Organic Electroluminescence Device Organic electroluminescence devices of Examples 1 to 7 were manufactured using Compounds 1, 2, 3, 41, 52, 55, and 67, respectively, as dopant materials for an emission layer.

Example Compounds
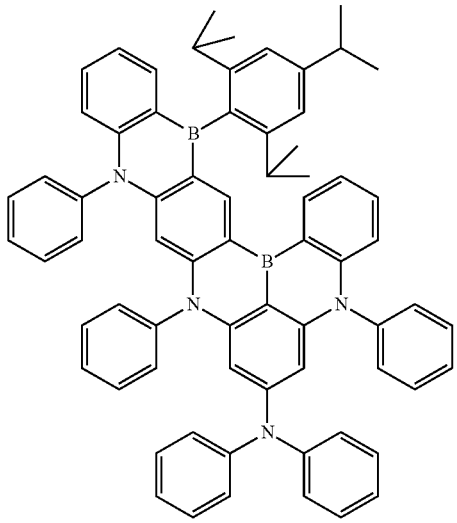
1
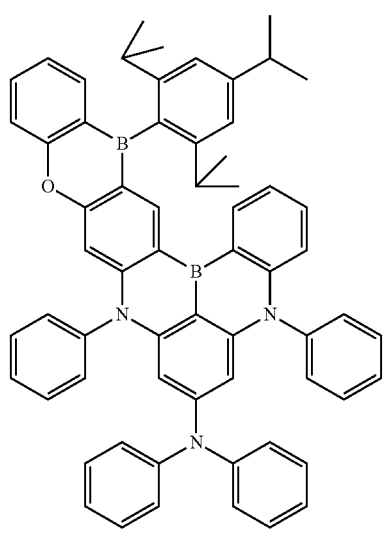
2
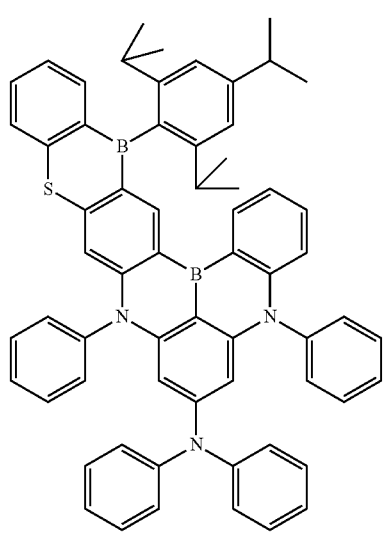
3
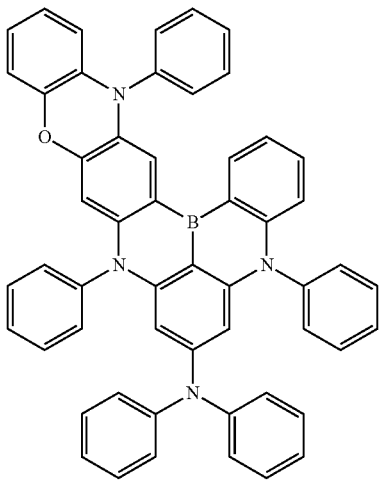
41
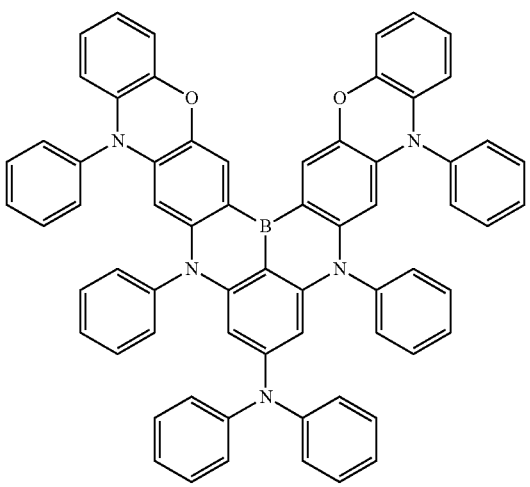
52
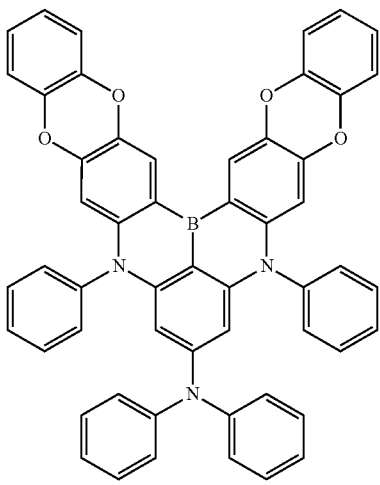
55

-continued

67
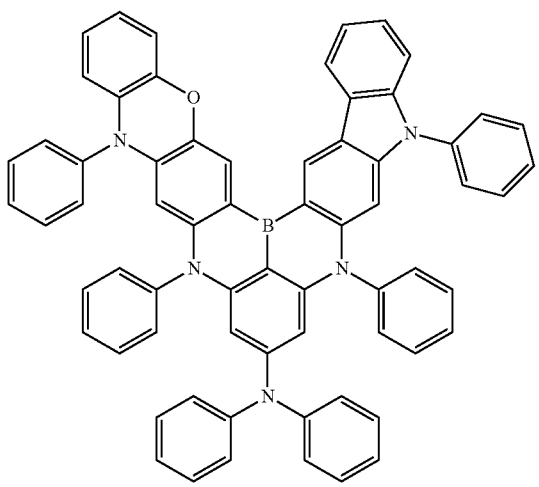

Comparative Compounds c1 to c4 were respectively used for the manufacture of devices of Comparative Examples 1 to 4.

Comparative Compounds c1
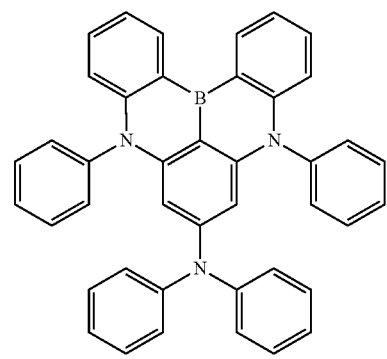

c2
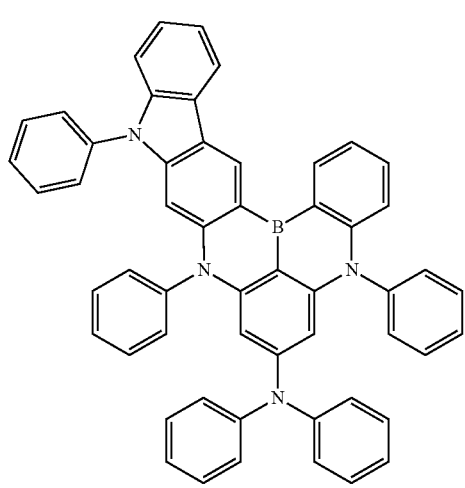

-continued c3
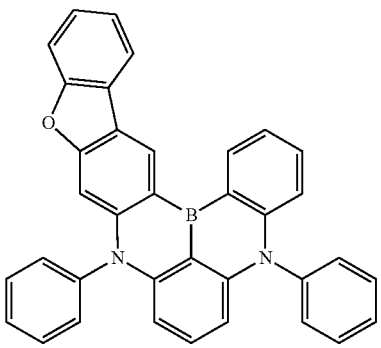

c4
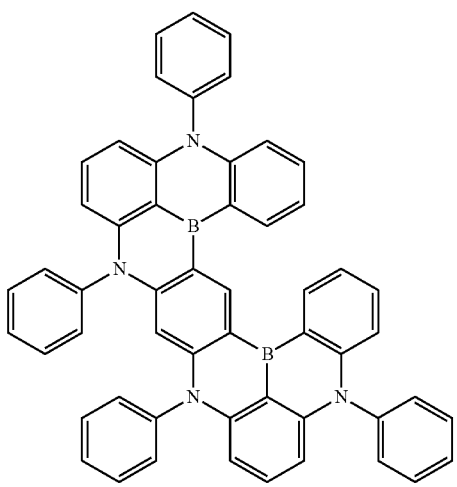

An organic electroluminescence device of the embodiments including the fused polycyclic compound of the embodiments in an emission layer was manufactured by a method below. Example 1 to Example 7 correspond to organic electroluminescence devices manufactured using the Example Compounds, i.e., Compound 1, Compound 2, Compound 3, Compound 41, Compound 52, Compound 55, and Compound 67 as light-emitting materials. Comparative Example 1 to Comparative Example 4 correspond to organic electroluminescence devices manufactured using Comparative Compound c1 to Comparative Compound c4 as light-emitting materials.

A first electrode with a thickness of about 150 nm was formed using ITO, a hole injection layer with a thickness of about 10 nm was formed using 1,4,5,8,9,11-hexaazatriphenylenehexacarbonitrile (HAT-CN), a first hole transport layer with a thickness of about 80 nm was formed using N,N-di(1-naphthyl)-N,N'-diphenyl-(1,1'-biphenyl)-4,4'-diamine (α-NPD), a second hole transport layer with a thickness of about 5 nm was formed using 1,3-bis(N-carbazolyl)benzene (mCP), an emission layer with a thickness of about 20 nm was formed using 3,3'-bis(N-carbazolyl)-1,1'-biphenyl (mCBP) doped with 1% of the corresponding Example Compound or Comparative Compound, an electron transport layer with a thickness of about 30 nm was formed using 1,3,5-tris(N-phenylbenzimidazole-2-yl)benzene (TPBi), an electron injection layer with a thickness of about 0.5 nm was formed using LiF, and a second electrode with a thickness of about 100 nm was formed using Al. Each layer was formed by a deposition method in a vacuum atmosphere.

The compounds used for the manufacture of the organic electroluminescence devices of the Examples and the Comparative Examples are shown below.

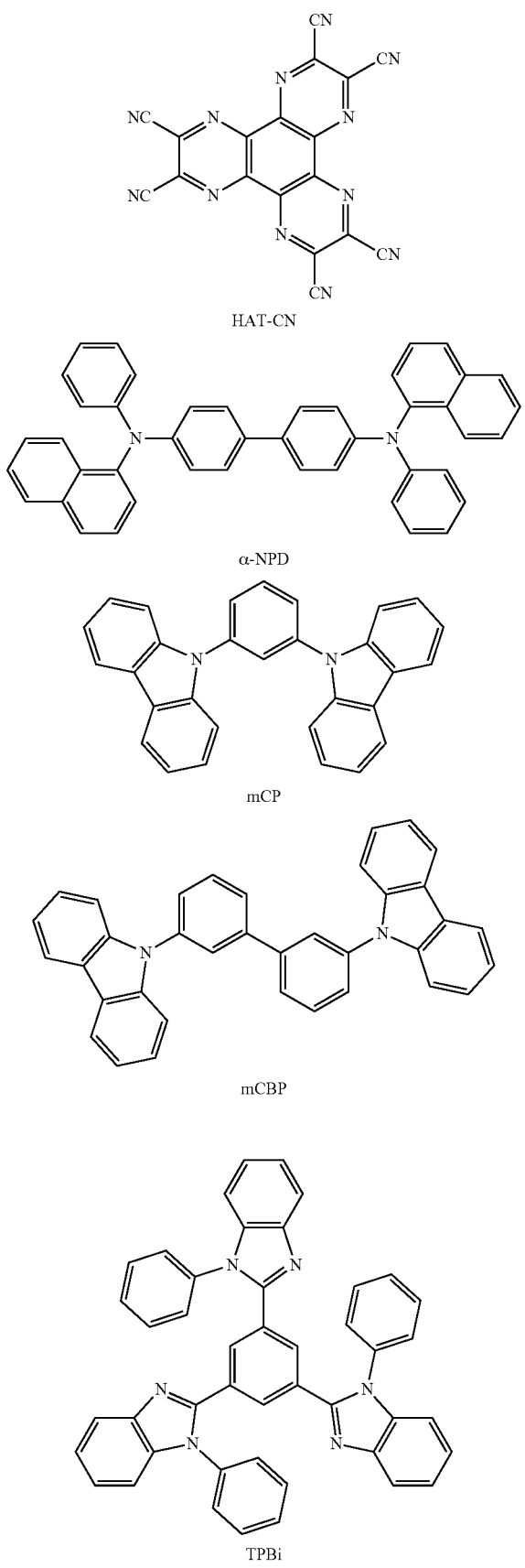

Experimental Examples

The emission efficiency of each of the organic electroluminescence devices manufactured using example Compound 1, Compound 2, Compound 3, Compound 41, Compound 52, Compound 55, and Compound 67, and Comparative Compounds c1 to c4 was evaluated. Evaluation results are listed in Table 1 below.

TABLE 1

| Device manufacturing example | Dopant compound | Emission wavelength (nm) | Maximum external quantum efficiency ($EQE_{max}$) (%) | External quantum efficiency (at 1000 nit) ($EQE_{1000}$ nit) (%) |
| --- | --- | --- | --- | --- |
| Example 1 | Compound 1 | 467 | 24 | 17 |
| Example 2 | Compound 2 | 466 | 22 | 16 |
| Example 3 | Compound 3 | 467 | 23 | 17 |
| Example 4 | Compound 41 | 494 | 20 | 15 |
| Example 5 | Compound 52 | 471 | 21 | 16 |
| Example 6 | Compound 55 | 468 | 20 | 15 |
| Example 7 | Compound 67 | 470 | 21 | 15 |
| Comparative Example 1 | Comparative Compound c1 | 450 | 13 | 10 |
| Comparative Example 2 | Comparative Compound c2 | 460 | 16 | 10 |
| Comparative Example 3 | Comparative Compound c3 | 468 | 13 | 5 |
| Comparative Example 4 | Comparative Compound c4 | 476 | 16 | 7 |

Referring to the results in Table 1, it could be confirmed that the Examples of the organic electroluminescence devices using the fused polycyclic compound according to embodiments of the inventive concept as a light-emitting material maintained emission wavelength of blue light and improved maximum external quantum efficiency and external quantum efficiency at 1000 nit when compared with the Comparative Examples.

The polycyclic compound having a structure of a fused polycyclic ring, including five rings having one boron atom and two nitrogen atoms, an amine group which is bonded to a benzene ring in a para position to a boron atom, and aryl group(s) connected via two heteroatoms to the fused polycyclic ring, may increase multiple resonance effects. Accordingly, the fused polycyclic compound according to the embodiments may have a decreased difference between the lowest singlet excitation energy level (S1 level) and the lowest triplet energy (T1 level) when compared with the Comparative Compound which does not include aryl group(s) connected via two heteroatoms to the fused polycyclic ring and/or an amine group bonded in a para position with respect to a boron atom. Accordingly, the organic electroluminescence devices of embodiments may show improved emission efficiency than the organic electroluminescence devices of the Comparative Examples. Particularly, by including the fused polycyclic compound of the embodiments as a dopant of a thermally activated delayed fluorescence (TADF) organic electroluminescence device, the organic electroluminescence device of the embodiments may achieve high emission efficiency in a blue light wavelength region.

In case of Comparative Compounds c1 to c3, included in Comparative Examples 1 to 3, a five-ring fused polycyclic heterocycle including one boron atom and two nitrogen atoms as core atoms is included, but aryl group(s) connected through two heteroatoms to the fused polycyclic heterocycle is not included. Accordingly, Comparative Examples 1 to 3 may not show multiple resonance increasing effects, which are shown by the Example Compounds, and may have lower emission efficiency than the Examples. Further, since Comparative Compound c3 included in Comparative Example 3 does not include an amine group which is bonded in a para position to a boron atom, the multiple resonance range may be even further decreased.

Comparative Compound c4 included in Comparative Example 4 includes a structure in which aryl group(s) are connected via two heteroatoms, i.e., a boron atom and a nitrogen atom, with the five-ring fused polycyclic heterocycle which includes one boron atom and two nitrogen atoms as core atoms, but does not include an amine group bonded in a para position to a boron atom. Accordingly, the multiple resonance increasing effects are decreased when compared with the Example Compounds, and Comparative Example 4 showed lower emission efficiency when compared with the Examples.

The organic electroluminescence device according to an embodiment may show improved device characteristics with high efficiency.

The fused polycyclic compound of the embodiments may be included in an emission layer of an organic electroluminescence device and may contribute to increasing the efficiency of the organic electroluminescence device.

As used herein, the terms "use," "using," and "used" may be considered synonymous with the terms "utilize," "utilizing," and "utilized," respectively.

In addition, the terms "substantially," "about," and similar terms are used as terms of approximation and not as terms of degree, and are intended to account for the inherent deviations in measured or calculated values that would be recognized by those of ordinary skill in the art.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein Although the example embodiments of the present invention have been described, it is understood that the present invention should not be limited to these example embodiments but various changes and modifications can be made by one ordinary skilled in the art within the spirit and scope of the present invention as hereinafter defined by the following claims and their equivalents.

What is claimed is:

1. An organic electroluminescence device, comprising:

a first electrode;

a second electrode facing the first electrode; and a plurality of organic layers between the first electrode and the second electrode, wherein the first electrode and the second electrode each independently comprise at least one selected from Ag, Mg, Cu, Al, Pt, Pd, Au, Ni, Nd, Ir, Cr, Li, Ca, LiF/Ca, LiF/Al, Mo, Ti, In, Sn, and Zn, a compound of two or more thereof, a mixture of two or more thereof, and an oxide of one or more thereof, wherein at least one organic layer among the plurality of organic layers comprises a fused polycyclic compound, and the fused polycyclic compound comprises:

a fused polycyclic heterocycle in which five rings are fused, the fused polycyclic heterocycle comprising one boron atom and two nitrogen atoms, an amine group connected to the fused polycyclic heterocycle; and a substituted or unsubstituted aromatic hydrocarbon ring connected to the fused polycyclic heterocycle via two heteroatoms which are each independently selected from the group consisting of a boron atom, an oxygen atom, a sulfur atom and a nitrogen atom, wherein the amine group is connected with one ring in the fused polycyclic heterocycle, and the substituted or unsubstituted aromatic hydrocarbon ring is connected with at least one of the remaining four rings in the fused polycyclic heterocycle other than the one ring in the fused polycyclic heterocycle which the amine group is connected with, via the two heteroatoms.

2. The organic electroluminescence device of claim 1, wherein the plurality of organic layers comprises:

a hole transport region on the first electrode;

an emission layer on the hole transport region; and an electron transport region on the emission layer, and the emission layer comprises the fused polycyclic compound.

3. The organic electroluminescence device of claim 2, wherein the emission layer is to emit delayed fluorescence.

4. The organic electroluminescence device of claim 2, wherein the emission layer is a delayed fluorescence emission layer comprising a host and a dopant, and the dopant comprises the fused polycyclic compound.

5. The organic electroluminescence device of claim 1, wherein in the fused polycyclic heterocycle, the five rings are formed by connecting three substituted or unsubstituted benzene rings via one boron atom and two nitrogen atoms, and the amine group and the boron atom are positioned para in one benzene ring among the three benzene rings.

6. The organic electroluminescence device of claim 1, wherein the fused polycyclic compound is represented by Formula 1:

Formula 1

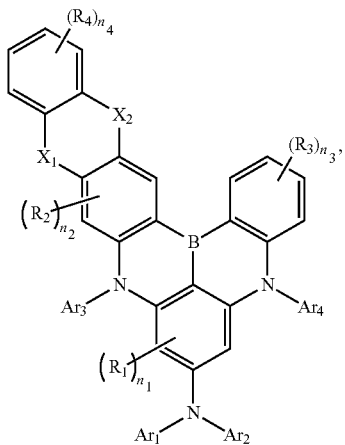

in Formula 1, $X_1$ and $X_2$ are each independently $BAr_5$, O, S, or $NAr_6$, $Ar_1$ to $Ar_6$ are each independently a substituted or unsubstituted aryl group of 6 to 60 carbon atoms to form a ring, or a substituted or unsubstituted heteroaryl group of 2 to 60 carbon atoms to form a ring, $Ar_1$ and $Ar_2$ are optionally combined with each other to form a ring, $R_1$ to $R_4$ are each independently a hydrogen atom, a deuterium atom, a halogen atom, a substituted or unsubstituted amine group, a substituted or unsubstituted oxy group, a substituted or unsubstituted thio group, a substituted or unsubstituted alkyl group of 1 to 20 carbon atoms, a substituted or unsubstituted aryl group of 6 to 60 carbon atoms to form a ring, or a substituted or unsubstituted heteroaryl group of 2 to 60 carbon atoms to form a ring, and any of $R_1$ to $R_4$ are optionally combined with an adjacent group to form a ring, $n_1$ and $n_2$ are each independently an integer of 0 to 2, and $n_3$ and $n_4$ are each independently an integer of 0 to 4.

7. The organic electroluminescence device of claim 6, wherein the fused polycyclic compound represented by Formula 1 is represented by any one among Formula 2-1 to Formula 2-3:

Formula 2-1

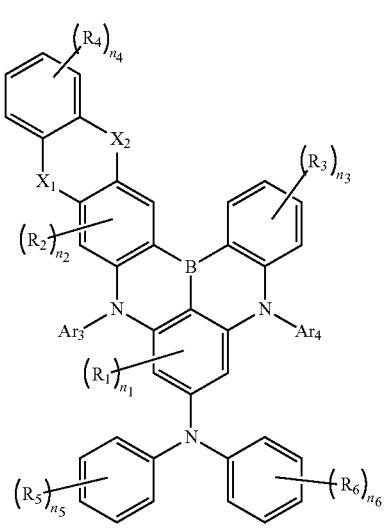

Formula 2-2

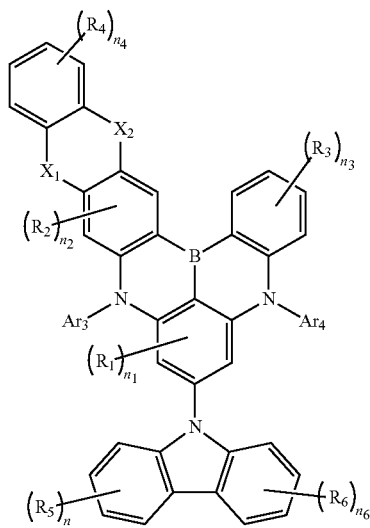

Formula 2-3

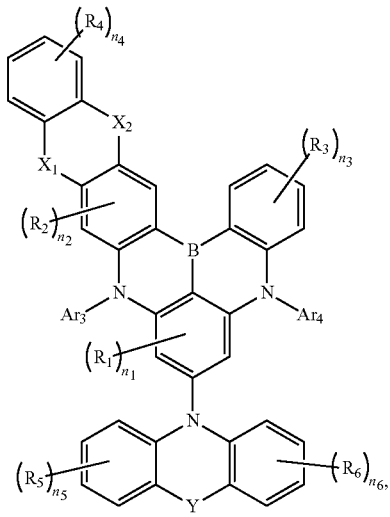

in Formula 2-1 to Formula 2-3,

Y is $CR_7R_8$, O, or S, $R_5$ to $R_8$ are each independently a hydrogen atom, a deuterium atom, a halogen atom, a substituted or unsubstituted oxy group, a substituted or unsubstituted thio group, a substituted or unsubstituted alkyl group of 1 to 20 carbon atoms, a substituted or unsubstituted aryl group of 6 to 60 carbon atoms to form a ring, or a substituted or unsubstituted heteroaryl group of 2 to 60 carbon atoms to form a ring, where each of a plurality of $R_5$ and $R_6$ is optionally combined with an adjacent group to form a ring, $n_5$ and $n_6$ are each independently an integer of 0 to 4, and $X_1$ and $X_2$, $R_1$ to $R_4$, $Ar_3$ and $Ar_4$, and $n_1$ to $n_4$ are the same as defined in Formula 1.

8. The organic electroluminescence device of claim 6, wherein the fused polycyclic compound represented by Formula 1 is represented by any one among Formula 3-1 to Formula 3-5:

Formula 3-1

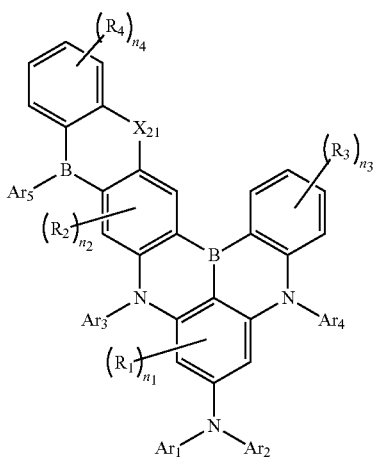

Formula 3-2

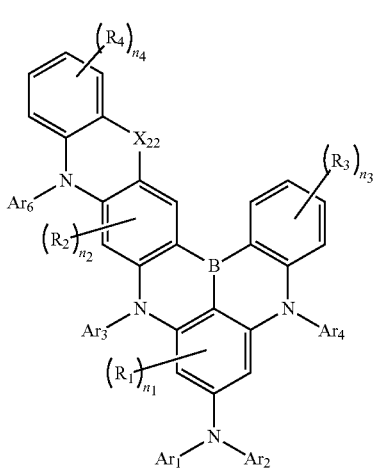

Formula 3-3

Formula 3-4

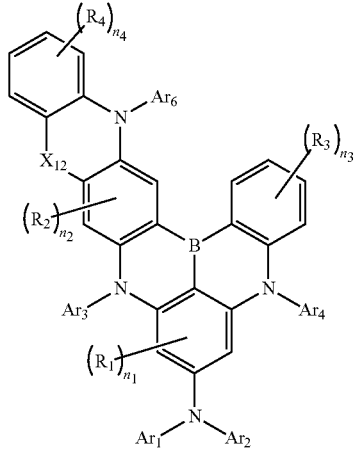

Formula 3-5

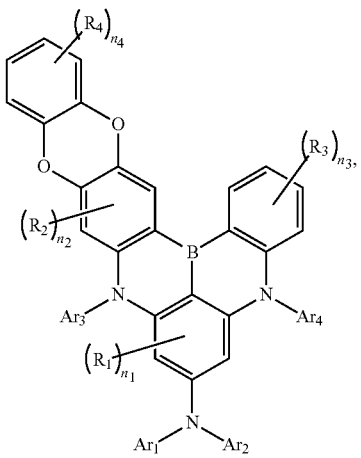

in Formula 3-1 to Formula 3-5, $X_{11}$ and $X_{21}$ are each independently O, S, or $NAr_6$, $X_{12}$ and $X_{22}$ are each independently $BAr_5$, O, or S, and $R_1$ to $R_4$, $Ar_1$ to $Ar_6$, and $n_1$ to $n_4$ are the same as defined in Formula 1.

9. The organic electroluminescence device of claim 6, wherein $Ar_3$ and $Ar_4$ are each independently a substituted or unsubstituted phenyl group, a substituted or unsubstituted dibenzofuranyl group, or a substituted or unsubstituted dibenzothiophenyl group.

10. The organic electroluminescence device of claim 6, wherein $R_3$ is a substituted or unsubstituted amino group, a substituted or unsubstituted oxy group, a substituted or unsubstituted thio group, or a substituted or unsubstituted phenyl group, and each of a plurality of $R_3$ groups is optionally combined with an adjacent group to form a ring.

11. The organic electroluminescence device of claim 6, wherein $R_4$ is a hydrogen atom, a halogen atom, a substituted or unsubstituted methyl group, or a substituted or unsubstituted phenyl group.

12. The organic electroluminescence device of claim 1, wherein the fused polycyclic compound is selected among compounds in Compound Group 1:
Compound Group 1
1
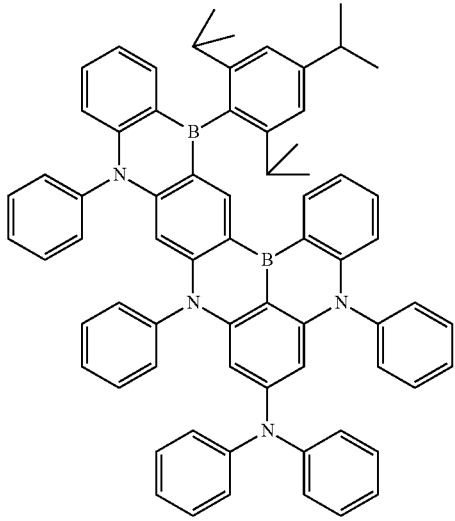
2
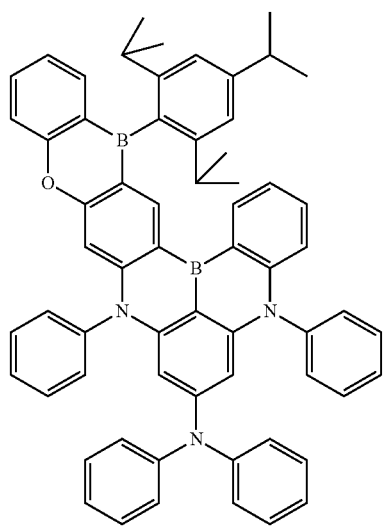
3
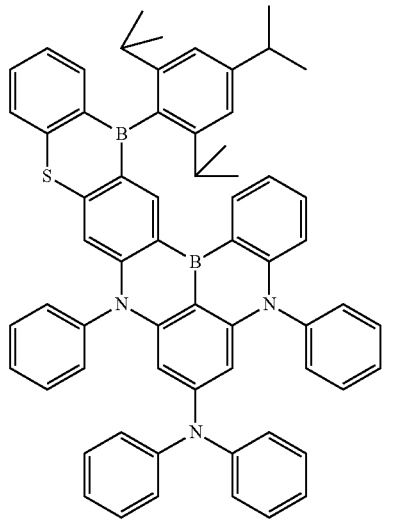
4
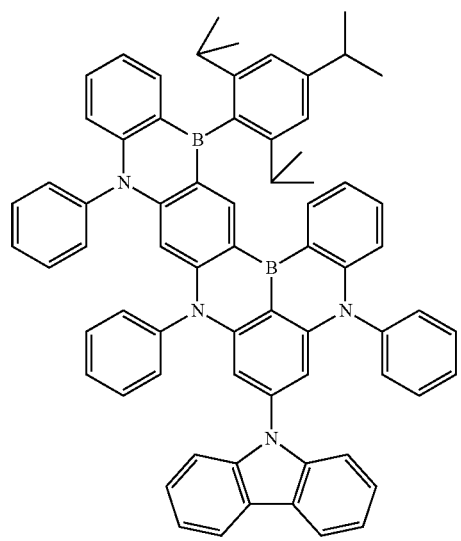
5
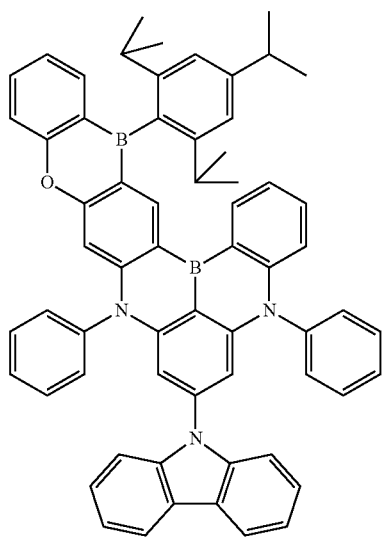

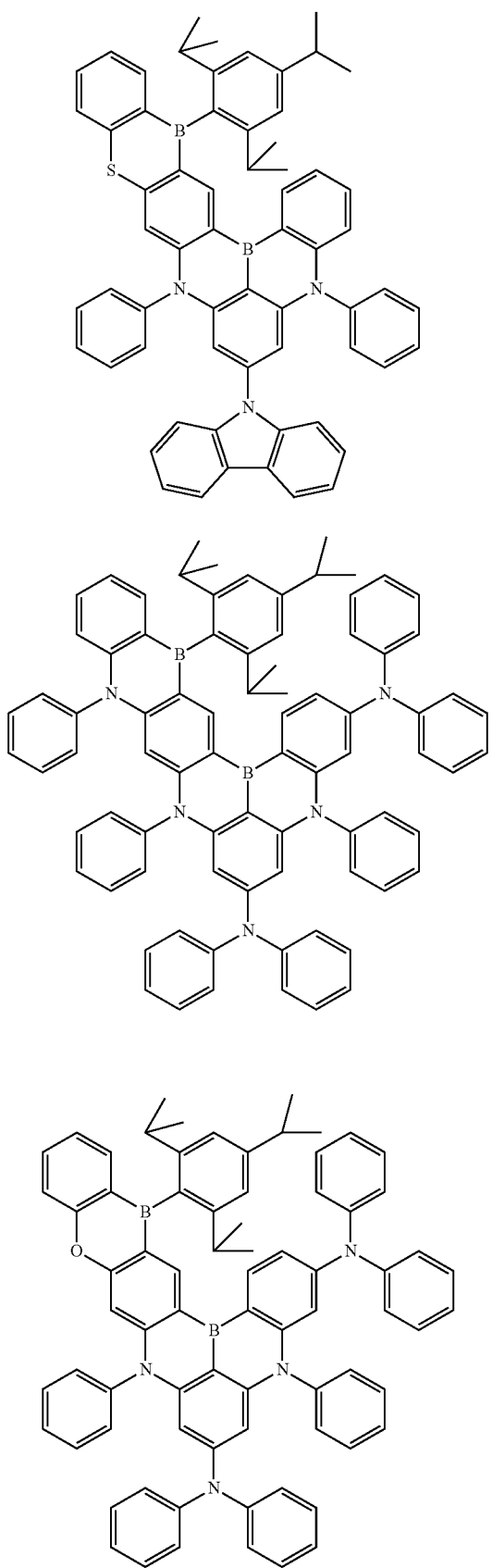
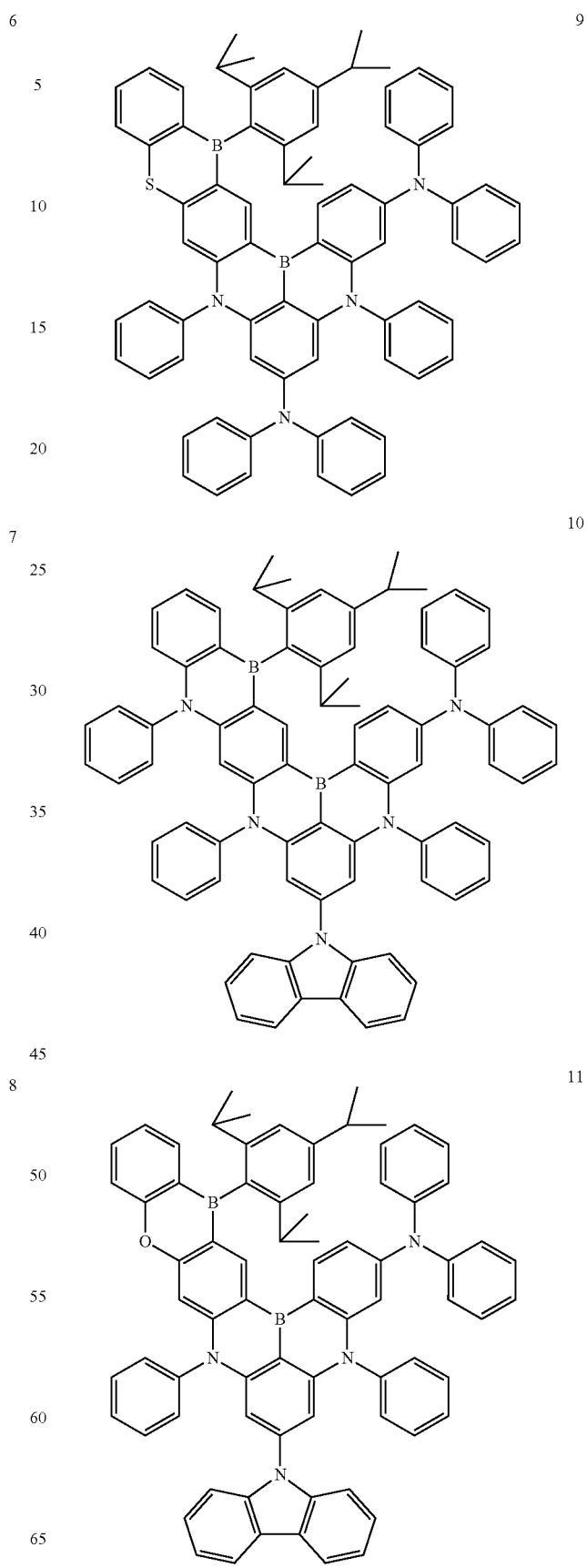

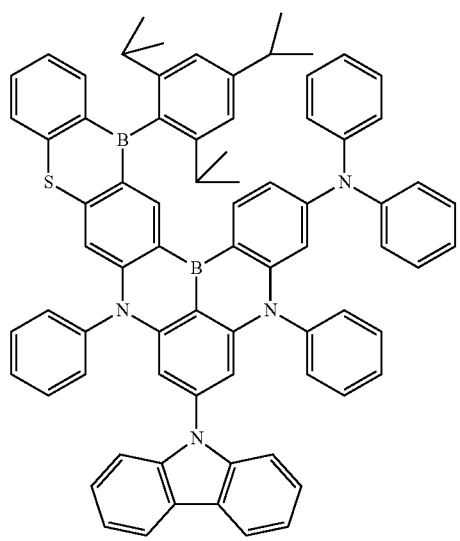
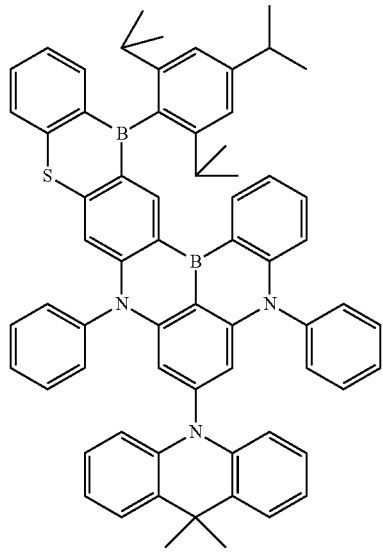
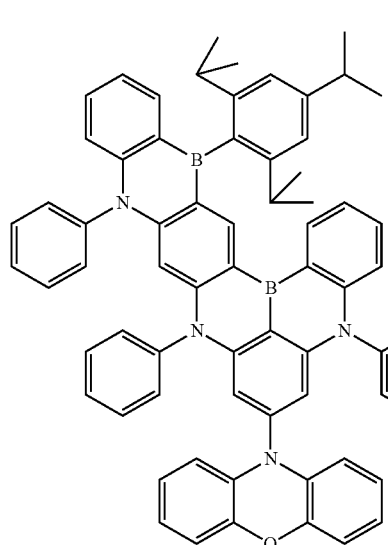
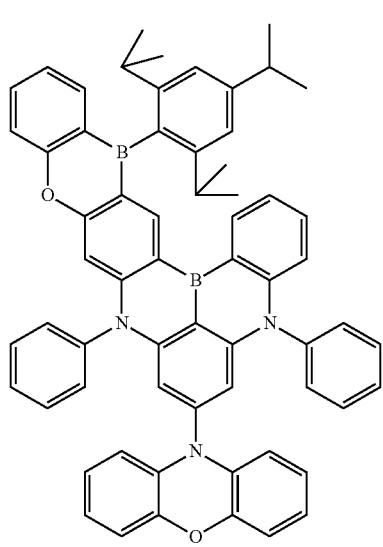

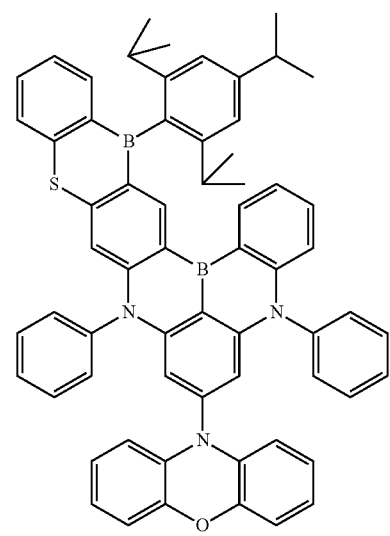
18
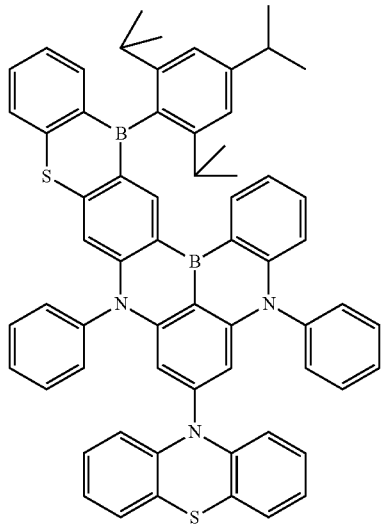
21
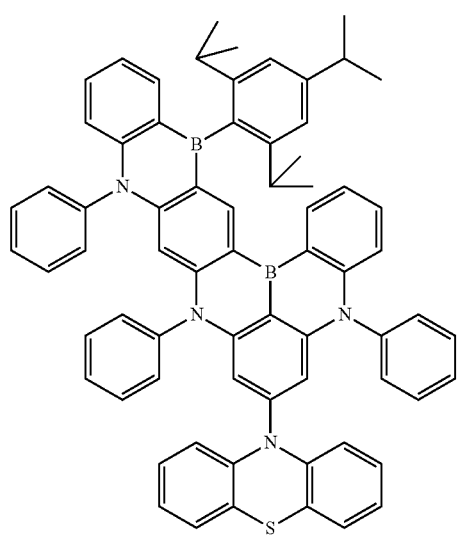
19
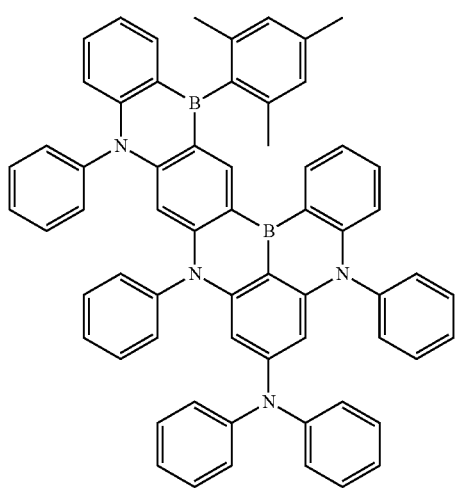
22
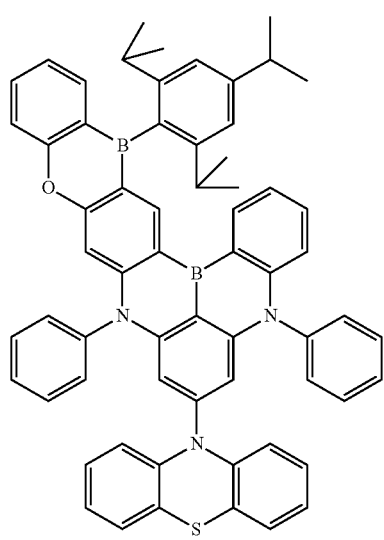
20
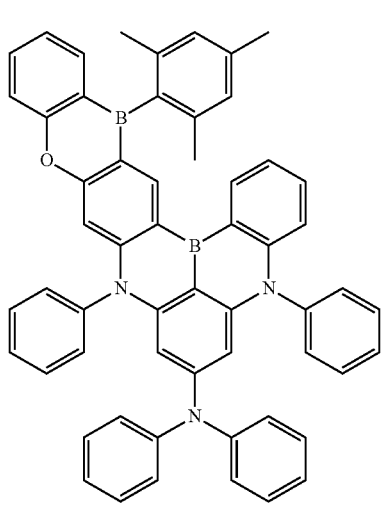
23

24
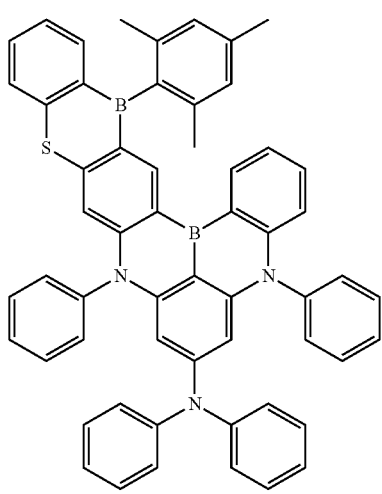
25
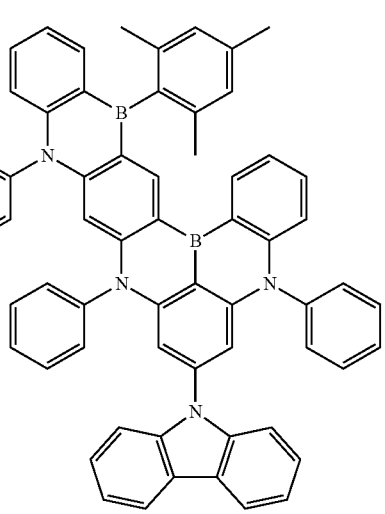
26
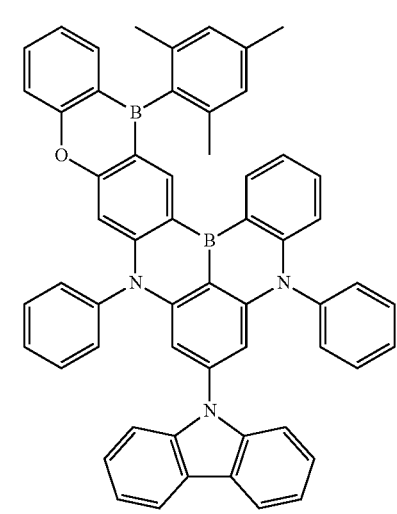
27
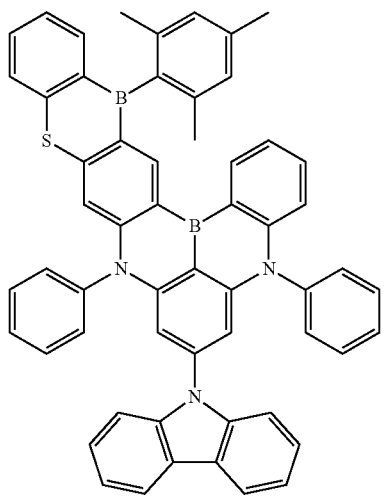
28
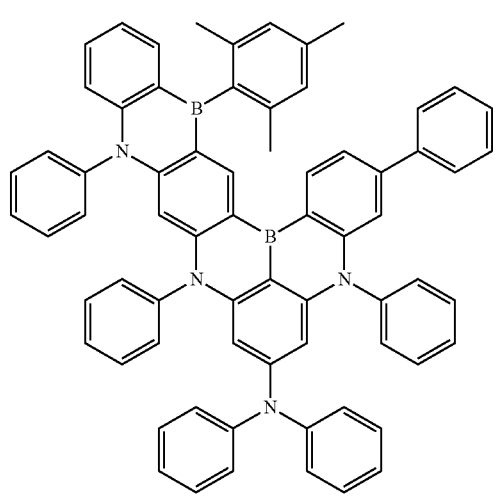
29
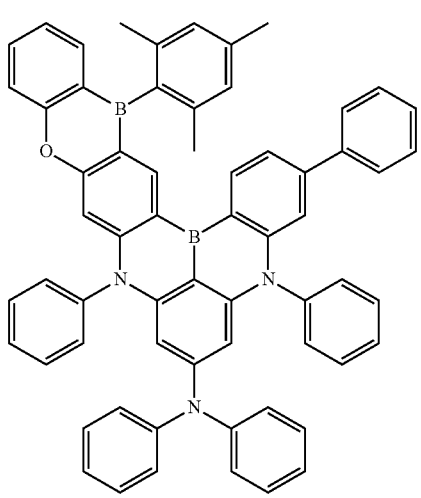

95
-continued
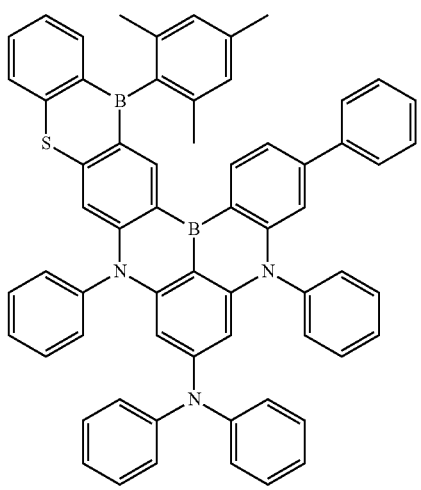
30
31
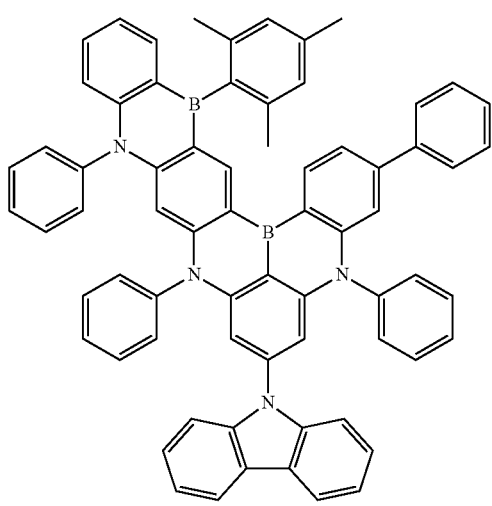
32
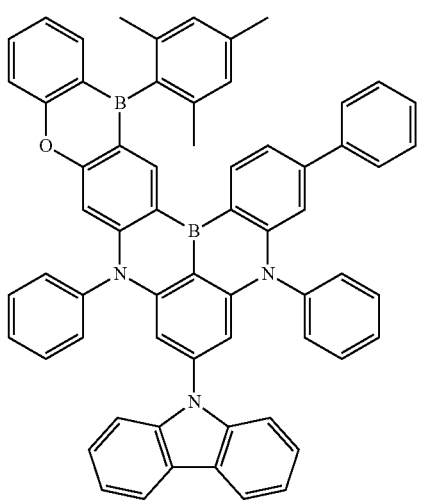
96
-continued
33
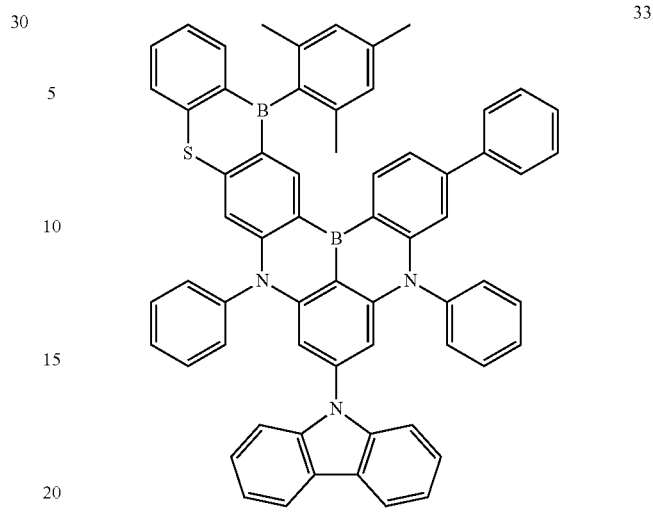
34
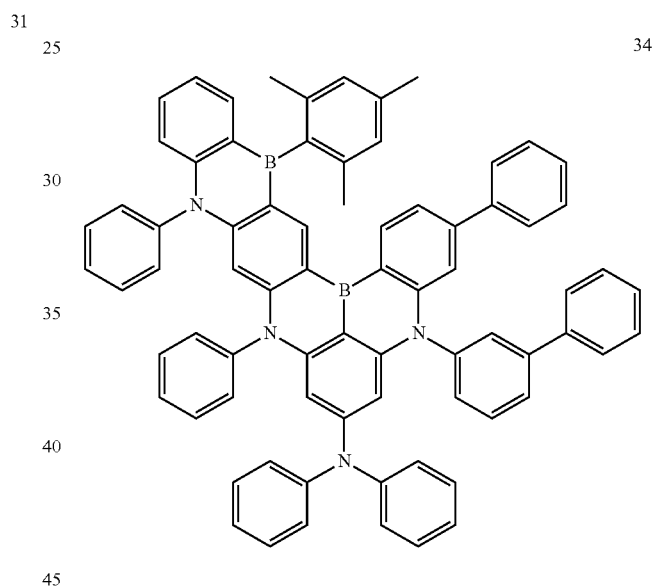
35
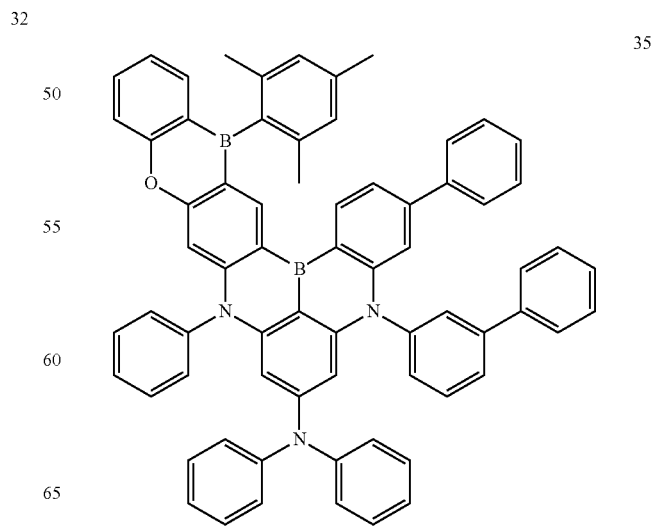

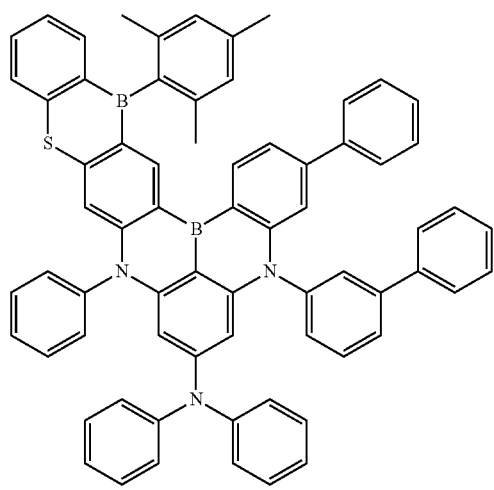
36
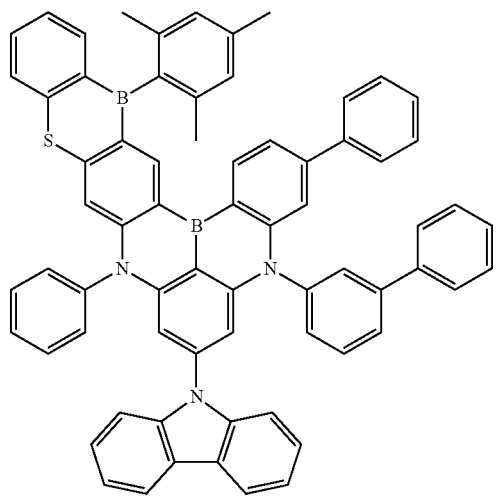
39
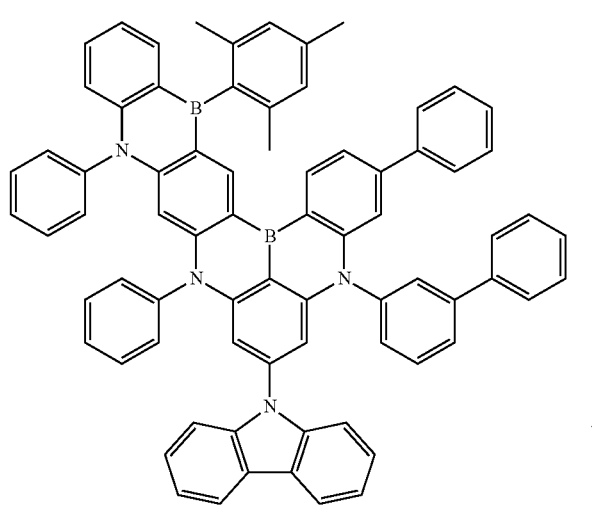
37
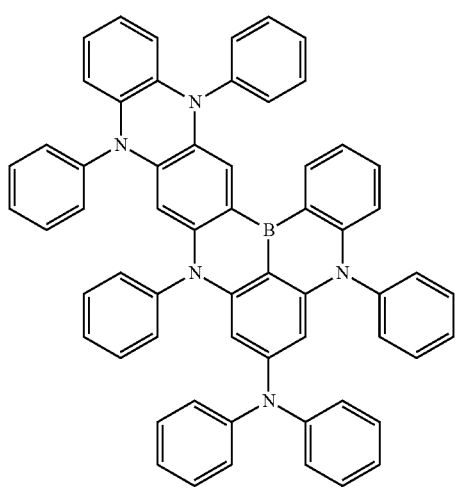
40
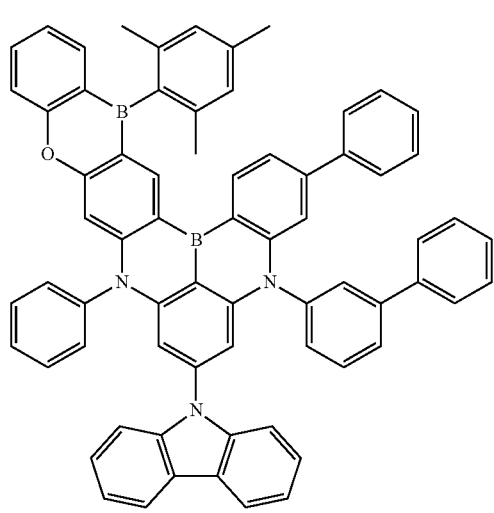
38
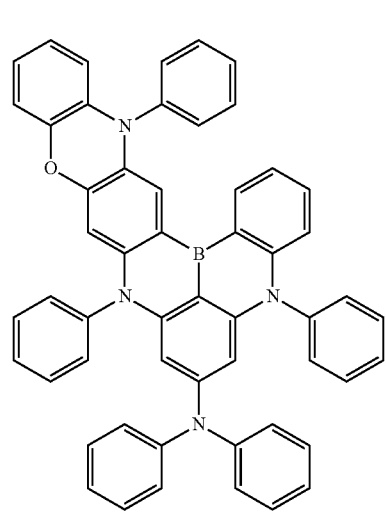
41

99
-continued
42
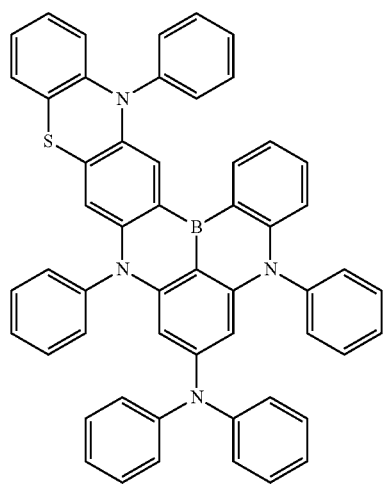
43
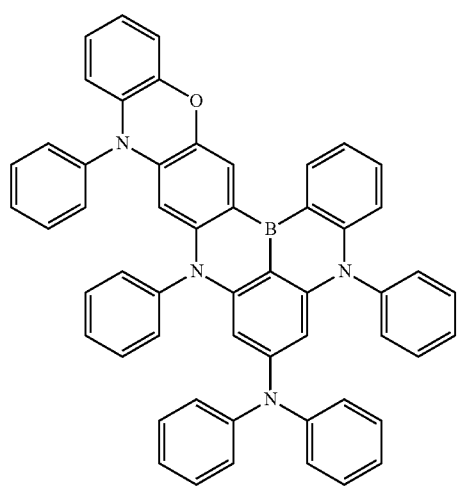
44
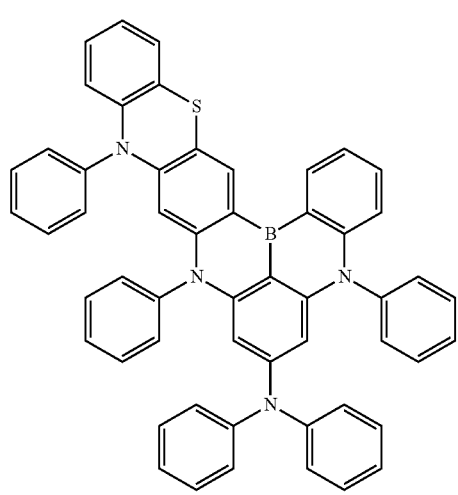
100
-continued
45
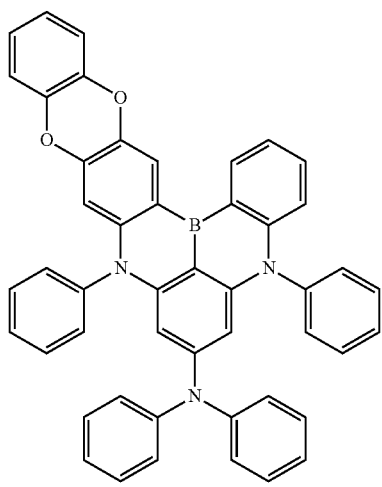
46
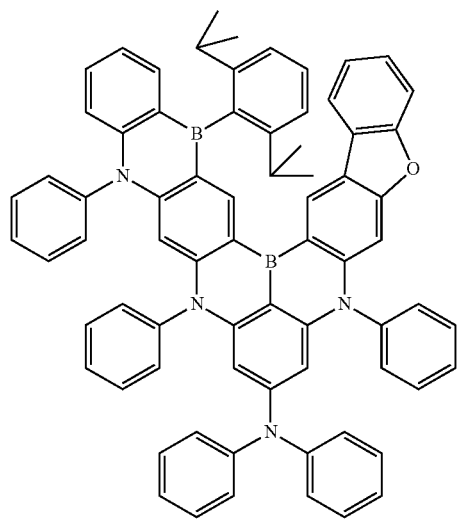
47
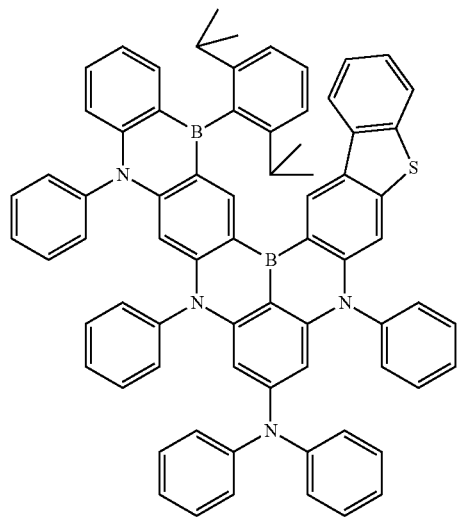

48
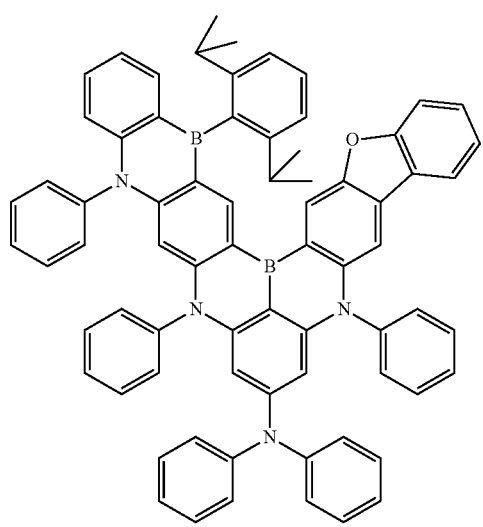
49
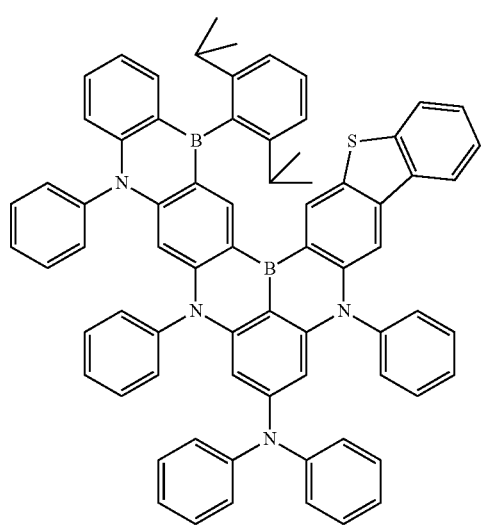
50
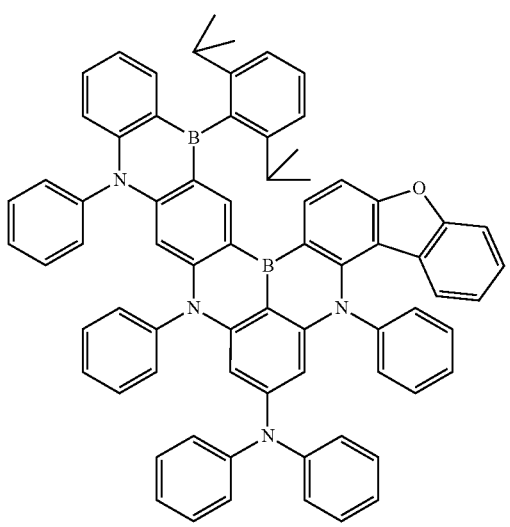
51
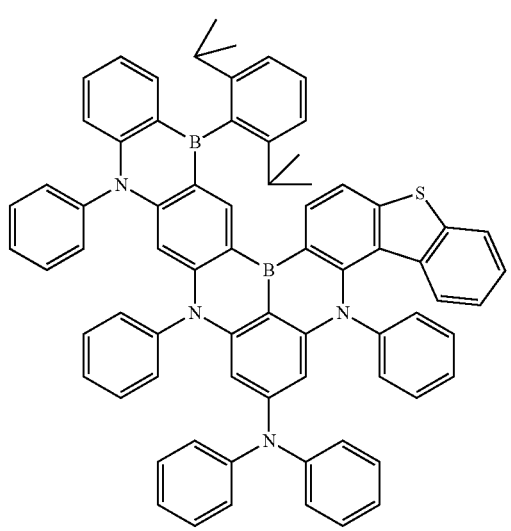
52
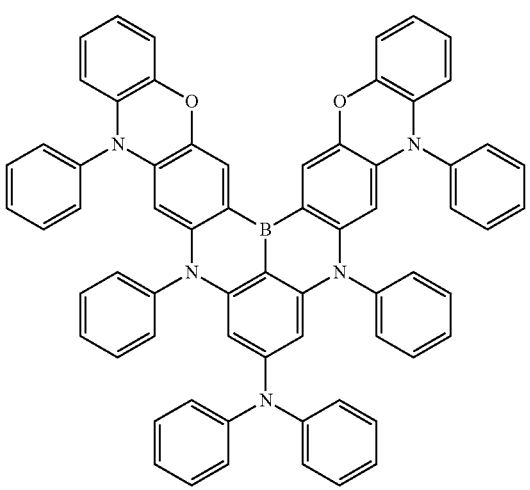
53
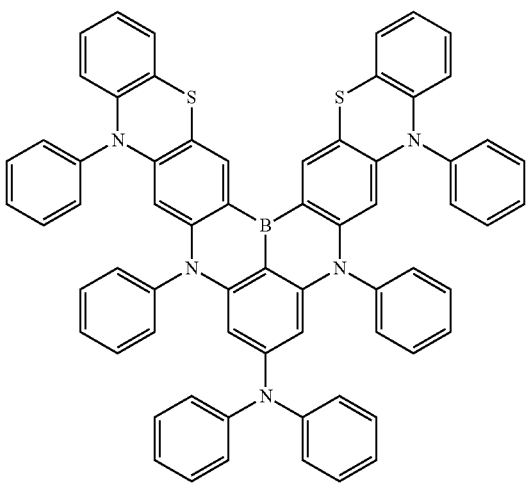

54
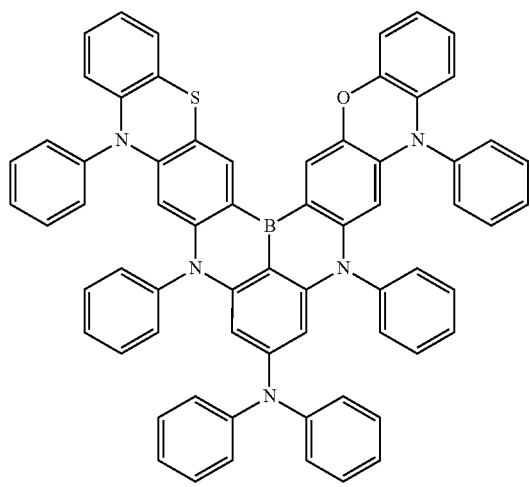
55
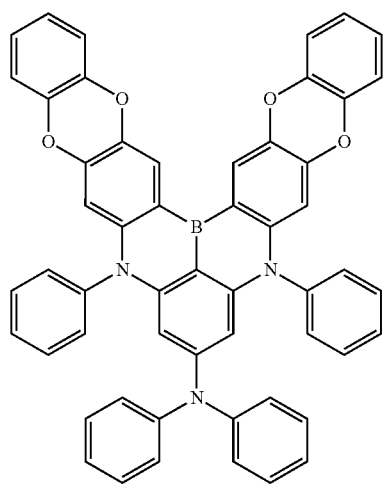
56
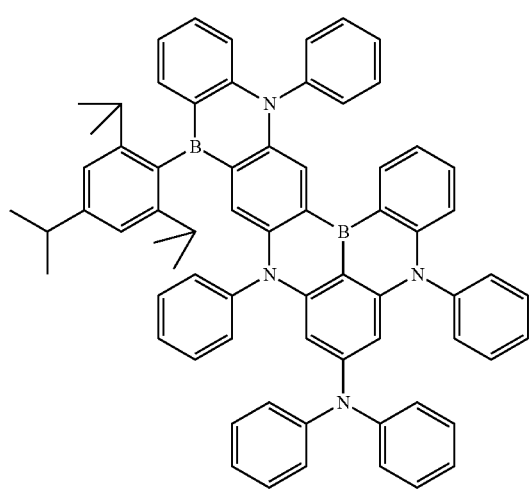
57
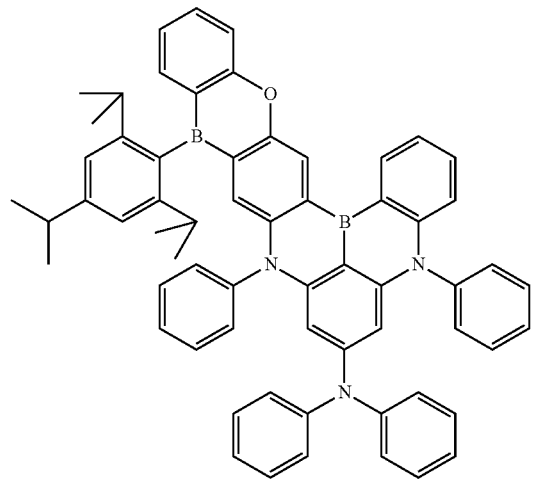
58
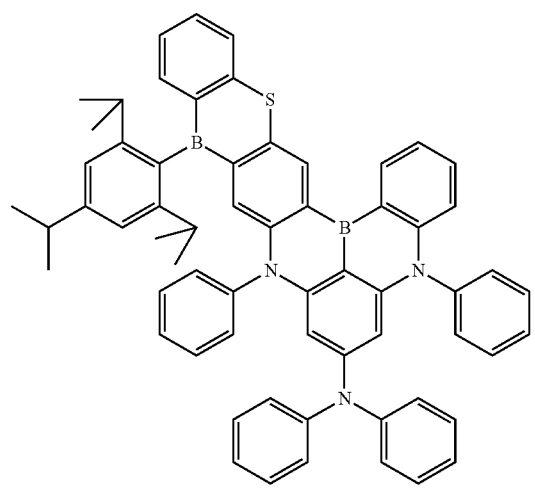
59

60
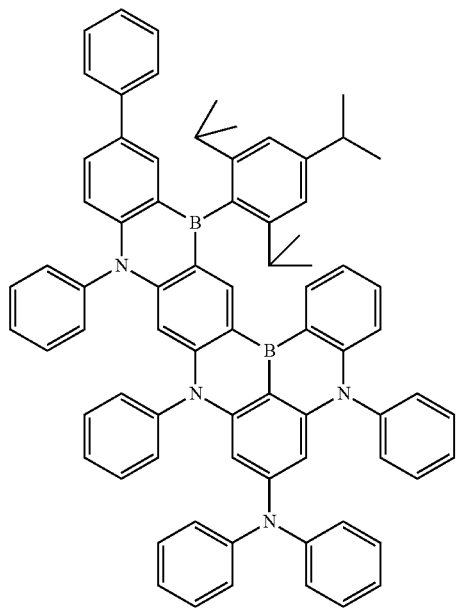
61
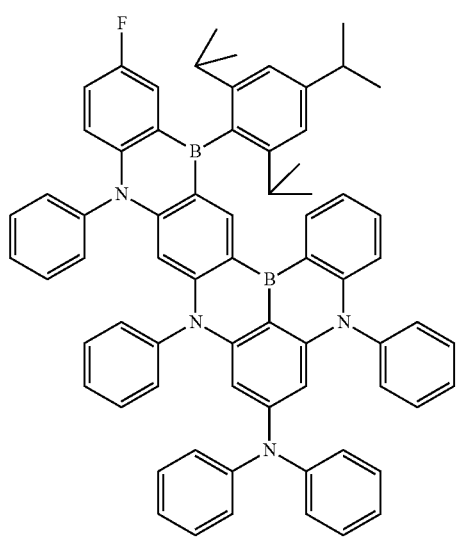
62
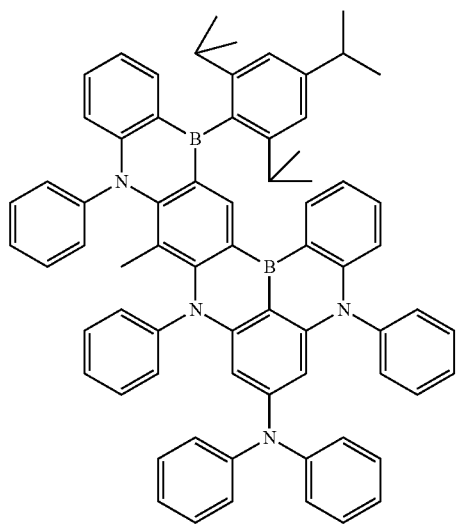
63
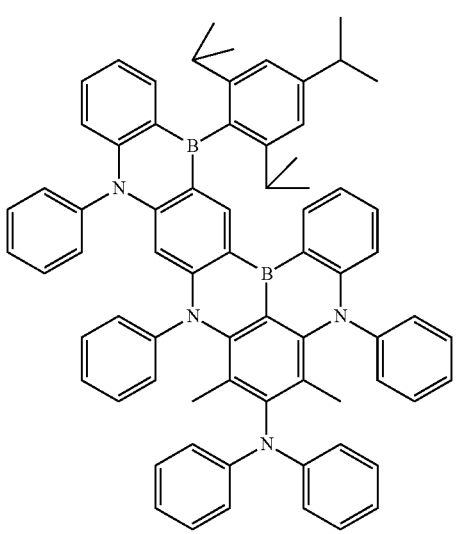
64
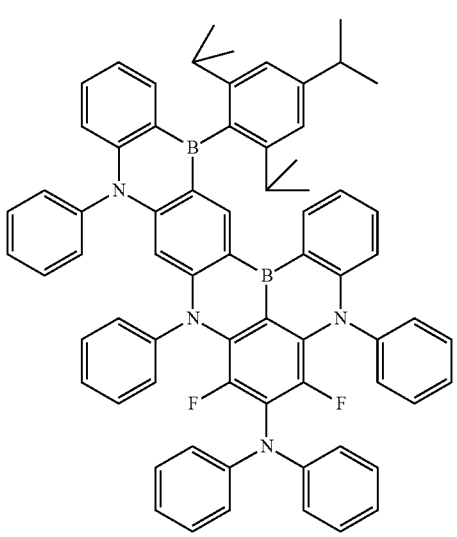
65
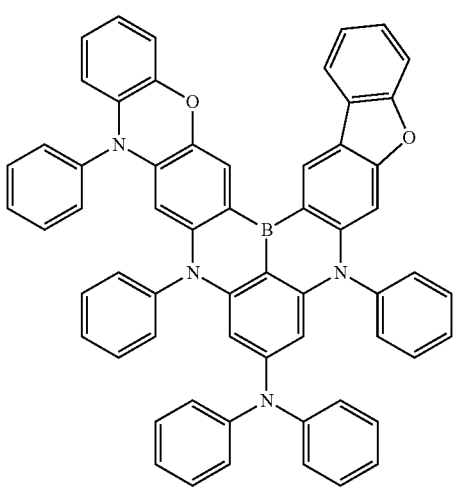

107
66
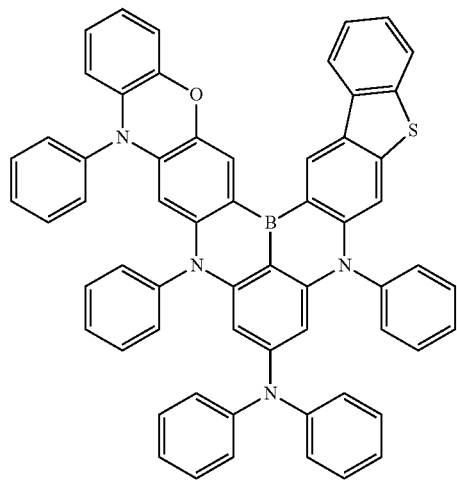
67
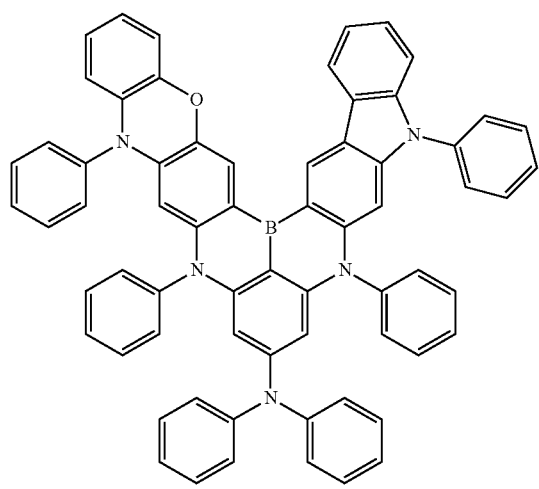
68
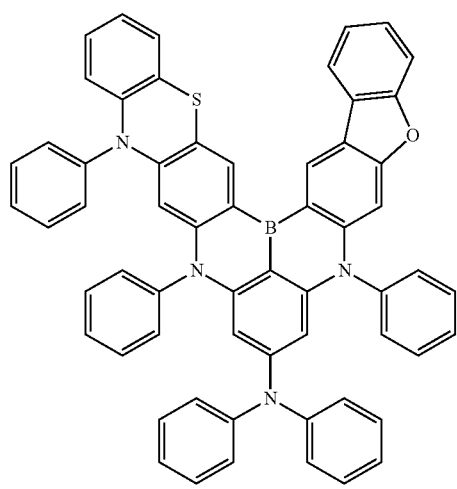
108
69
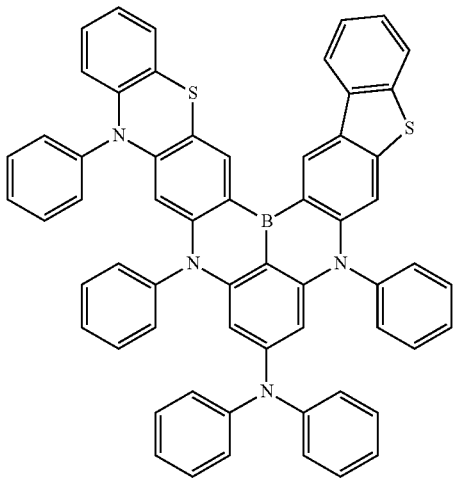
70
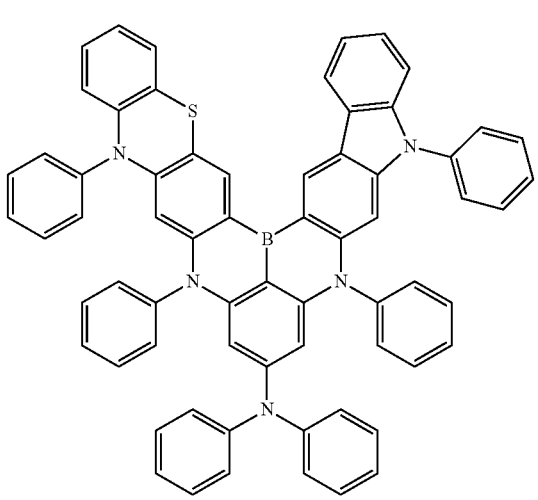
71
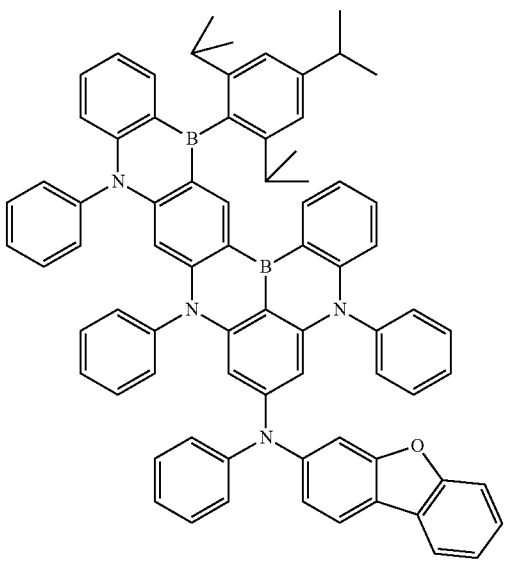

72
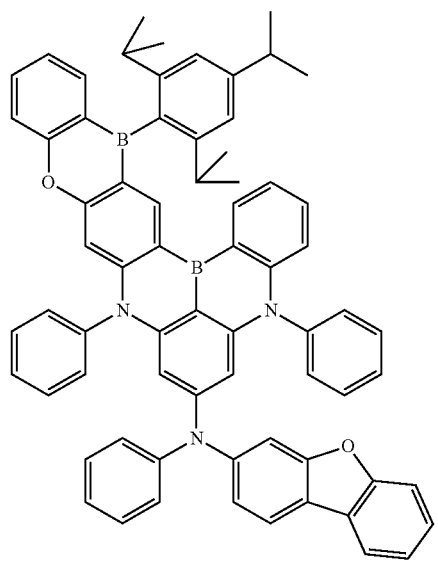
75
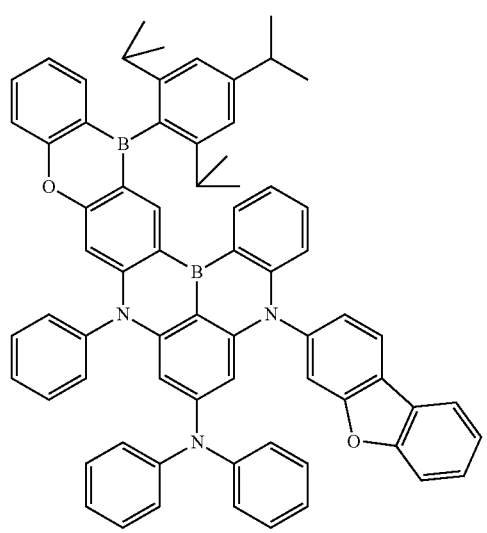
73
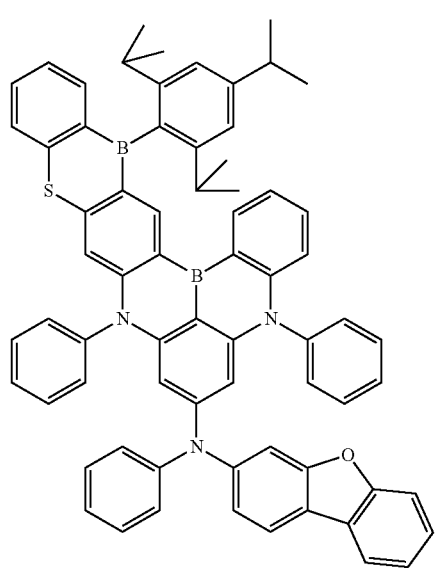
76
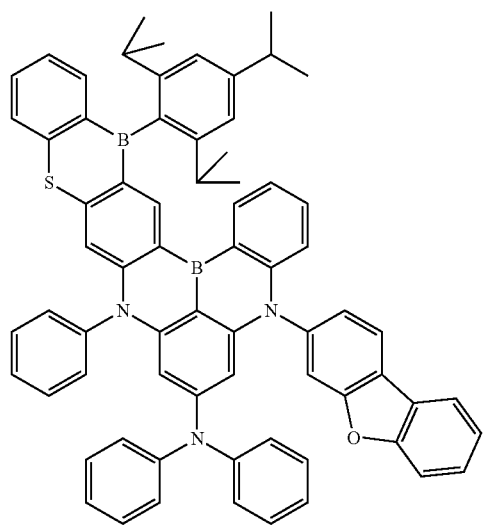
74
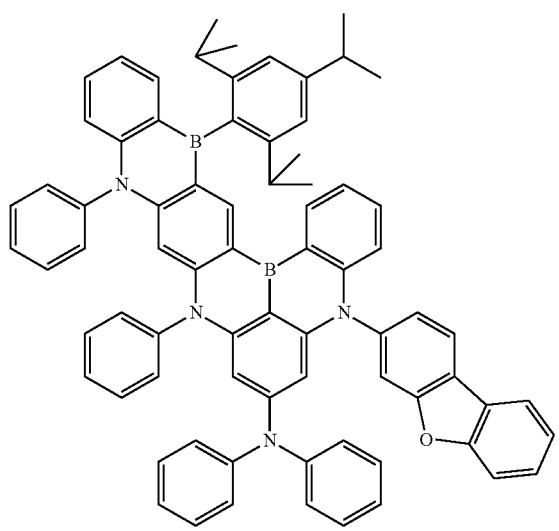
77
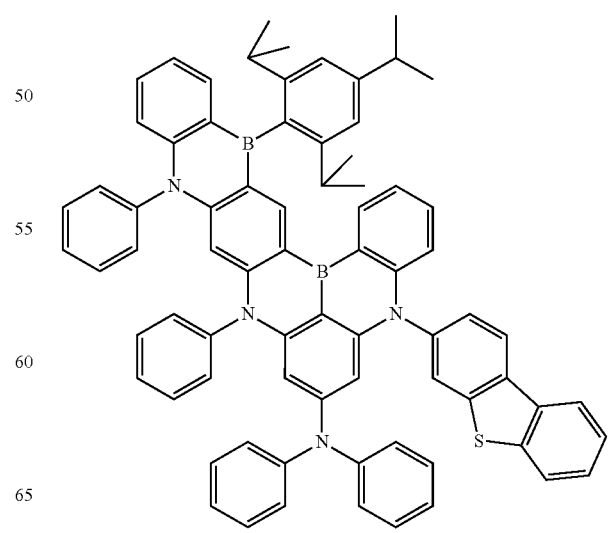

78

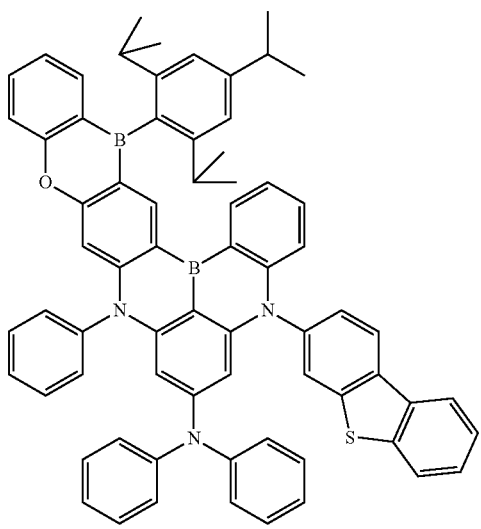

79

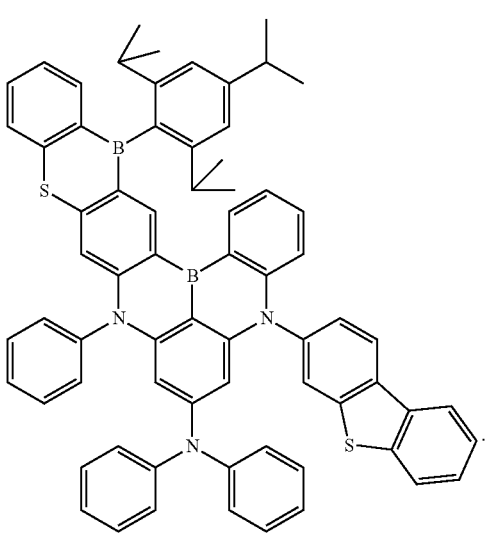

13. An organic electroluminescence device, comprising:
a first electrode;
a second electrode facing the first electrode; and
a plurality of organic layers between the first electrode and the second electrode,
wherein at least one organic layer among the plurality of organic layers comprises a fused polycyclic compound represented by Formula 1:

Formula 1

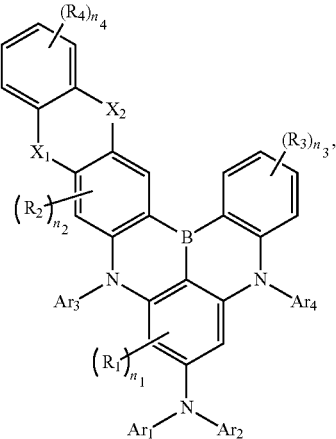

in Formula 1,
$X_1$ and $X_2$ are each independently $BAr_5$, O, S, or $NAr_6$,
$Ar_1$ to $Ar_6$ are each independently a substituted or unsubstituted aryl group of 6 to 60 carbon atoms to form a ring, or a substituted or unsubstituted heteroaryl group of 2 to 60 carbon atoms to form a ring,
$Ar_1$ and $Ar_2$ are optionally combined with each other to form a ring,
$R_1$ to $R_4$ are each independently a hydrogen atom, a deuterium atom, a halogen atom, a substituted or unsubstituted amine group, a substituted or unsubstituted oxy group, a substituted or unsubstituted thio group, a substituted or unsubstituted alkyl group of 1 to 20 carbon atoms, a substituted or unsubstituted aryl group of 6 to 60 carbon atoms to form a ring, or a substituted or unsubstituted heteroaryl group of 2 to 60 carbon atoms to form a ring, or combined with an adjacent group to form a ring,
$n_1$ and $n_2$ are integers of 0 to 2, and
$n_3$ and $n_4$ are integers of 0 to 4.

14. A fused polycyclic compound represented by the following Formula 1:

Formula 1

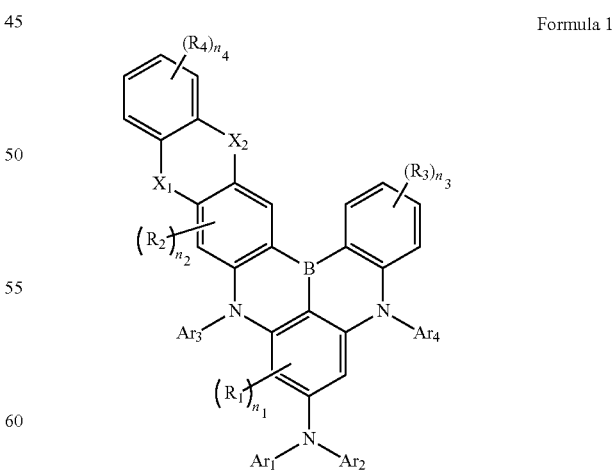

in Formula 1,
$X_1$ and $X_2$ are each independently $BAr_5$, O, S, or $NAr_6$,
$Ar_1$ to $Ar_6$ are each independently a substituted or unsubstituted aryl group of 6 to 60 carbon atoms to form a ring, or a substituted or unsubstituted heteroaryl group of 2 to 60 carbon atoms to form a ring, Ar₁ and Ar₂ may be combined with each other to form a ring, R₁ to R₄ are each independently a hydrogen atom, a deuterium atom, a halogen atom, a substituted or unsubstituted amine group, a substituted or unsubstituted oxy group, a substituted or unsubstituted thio group, a substituted or unsubstituted alkyl group of 1 to 20 carbon atoms, a substituted or unsubstituted aryl group of 6 to 60 carbon atoms to form a ring, or a substituted or unsubstituted heteroaryl group of 2 to 60 carbon atoms to form a ring, and any of R₁ to R₄ are optionally combined with an adjacent group to form a ring, $n_1$ and $n_2$ are each independently an integer of 0 to 2, and $n_3$ and $n_4$ are each independently an integer of 0 to 4.

15. The fused polycyclic compound of claim 14, wherein the fused polycyclic compound represented by Formula 1 is represented by any one among Formula 2-1 to Formula 2-3:

Formula 2-1

Formula 2-2

Formula 2-3

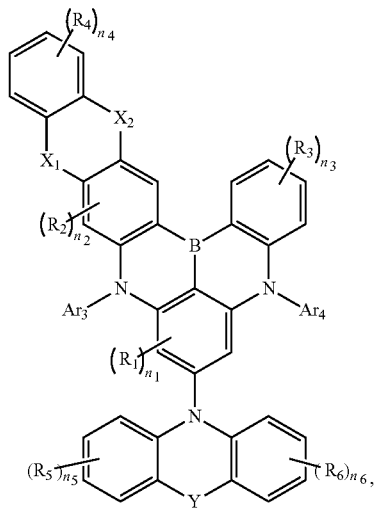

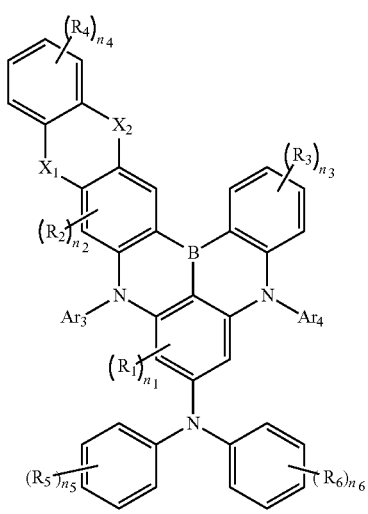

in Formula 2-1 to Formula 2-3,

Y is $CR_7R_8$, O, or S,

R₅ to R₈ are each independently a hydrogen atom, a deuterium atom, a halogen atom, a substituted or unsubstituted oxy group, a substituted or unsubstituted thio group, a substituted or unsubstituted alkyl group of 1 to 20 carbon atoms, a substituted or unsubstituted aryl group of 6 to 60 carbon atoms to form a ring, or a substituted or unsubstituted heteroaryl group of 2 to 60 carbon atoms to form a ring, where each of a plurality of R₅ and R₆ is optionally combined with an adjacent group to form a ring, $n_5$ and $n_6$ are each independently an integer of 0 to 4, and $X_1$ and $X_2$, $R_1$ to $R_4$, $Ar_3$ and $Ar_4$, and $n_1$ to $n_4$ are the same as defined in Formula 1.

16. The fused polycyclic compound of claim 14, wherein the fused polycyclic compound represented by Formula 1 is represented by any one among Formula 3-1 to Formula 3-5:

Formula 3-1

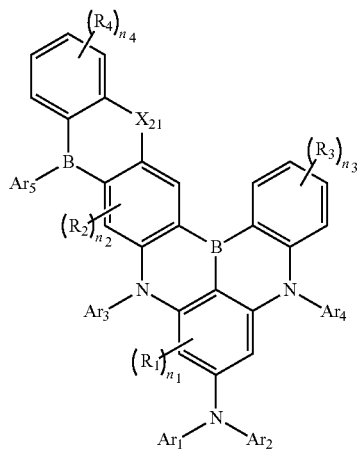

-continued

Formula 3-2

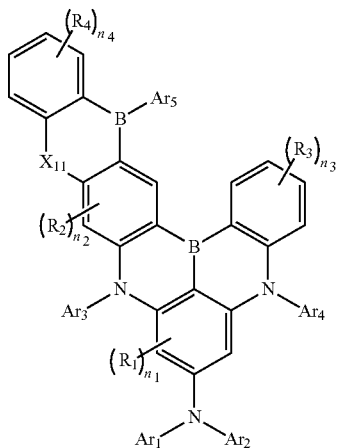

Formula 3-3

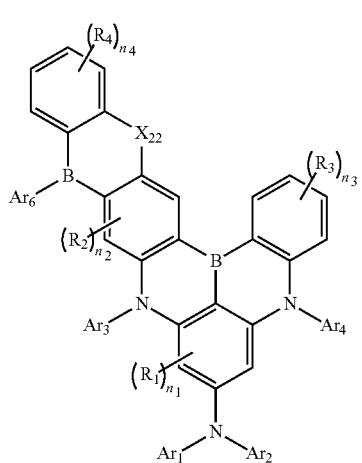

Formula 3-4

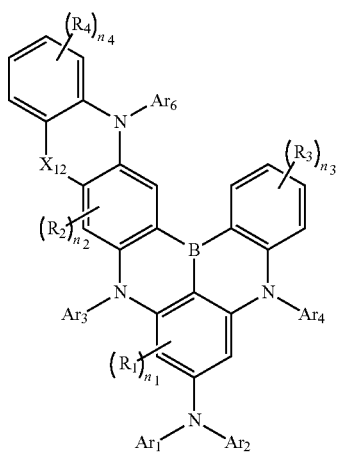

-continued

Formula 3-5

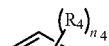

in Formula 3-1 to Formula 3-5,
$X_{11}$ and $X_{21}$ are each independently O, S, or $NAr_6$,
$X_{12}$ and $X_{22}$ are each independently $BAr_5$, O, or S, and
$R_1$ to $R_4$, $Ar_1$ to $Ar_6$, and $n_1$ to $n_4$ are the same as defined in Formula 1.

17. The fused polycyclic compound of claim 14, wherein $Ar_3$ and $Ar_4$ are each independently a substituted or unsubstituted phenyl group, a substituted or unsubstituted dibenzofuranyl group, or a substituted or unsubstituted dibenzothiophenyl group.

18. The fused polycyclic compound of claim 14, wherein $R_3$ is a substituted or unsubstituted amino group, a substituted or unsubstituted oxy group, a substituted or unsubstituted thio group, or a substituted or unsubstituted phenyl group, and each of a plurality of $R_3$ groups is optionally combined with an adjacent group to form a ring.

19. The fused polycyclic compound of claim 14, wherein $R_4$ is a hydrogen atom, a halogen atom, a substituted or unsubstituted methyl group, or a substituted or unsubstituted phenyl group.

20. The fused polycyclic compound of claim 14, wherein the fused polycyclic compound is selected among compounds in Compound Group 1:

Compound Group 1

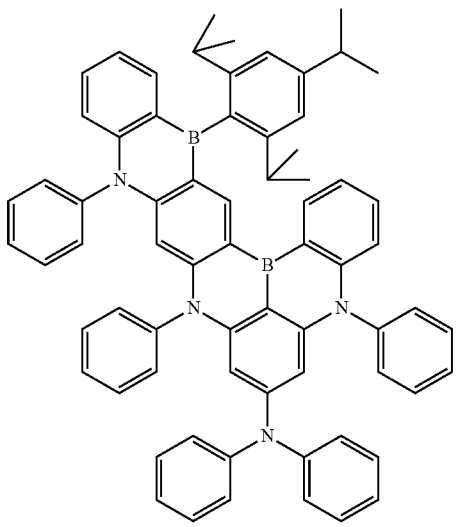

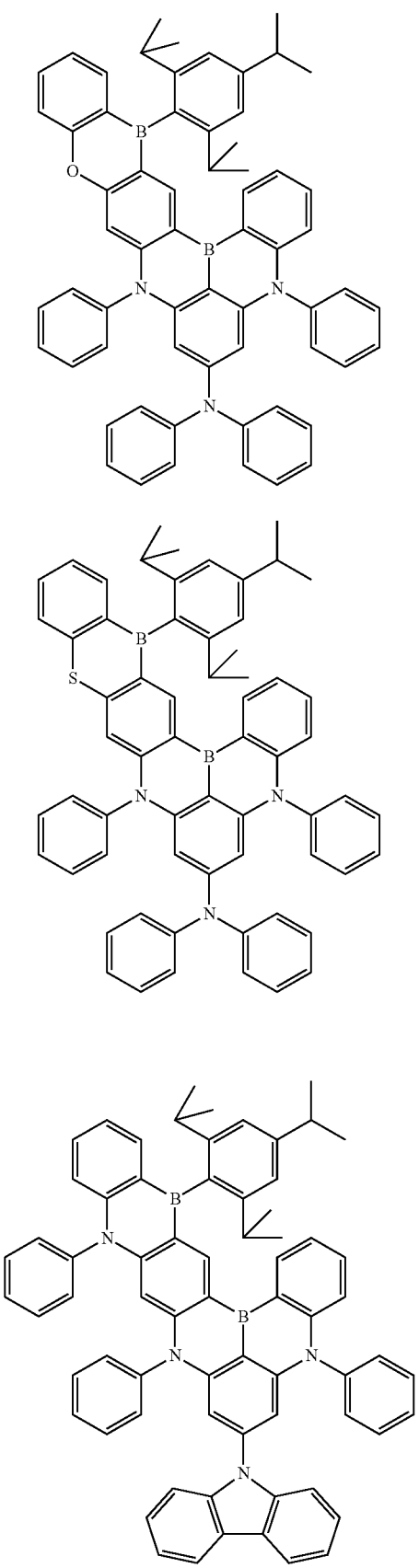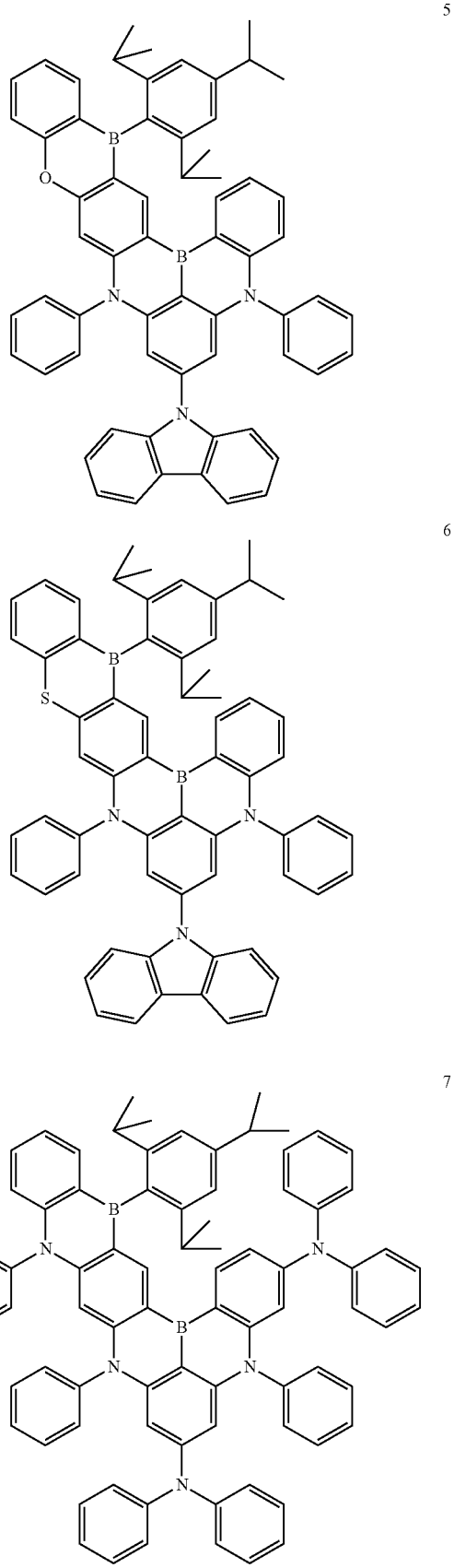

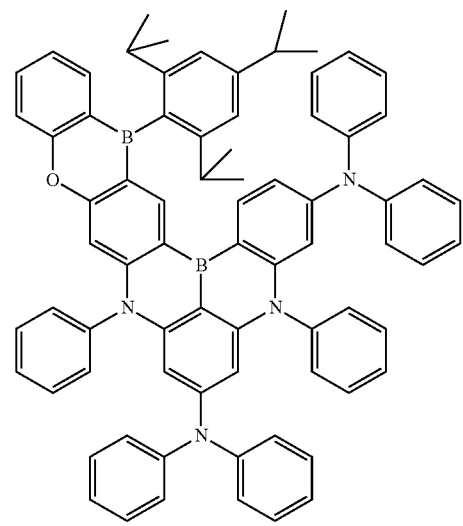
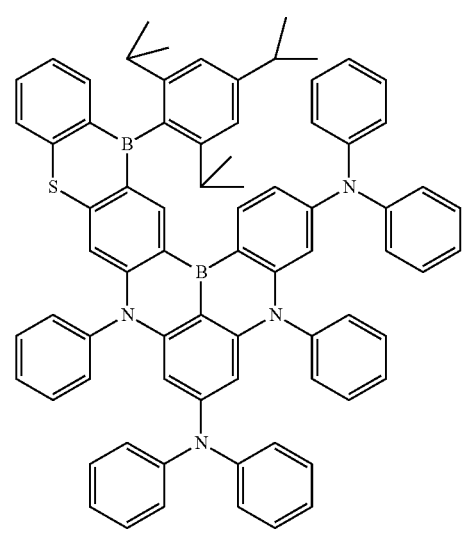
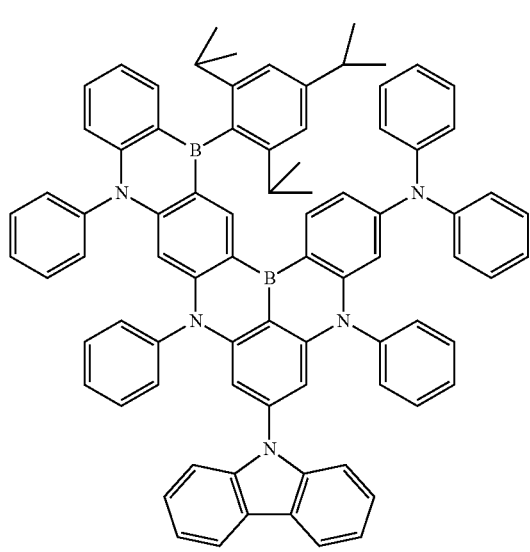
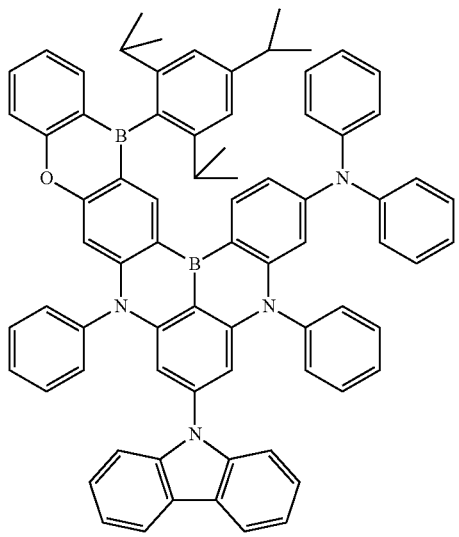
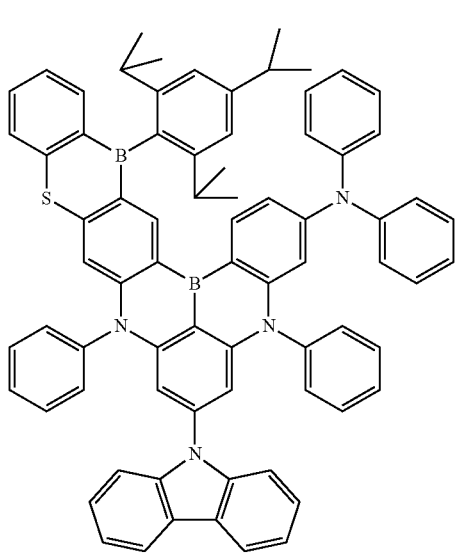
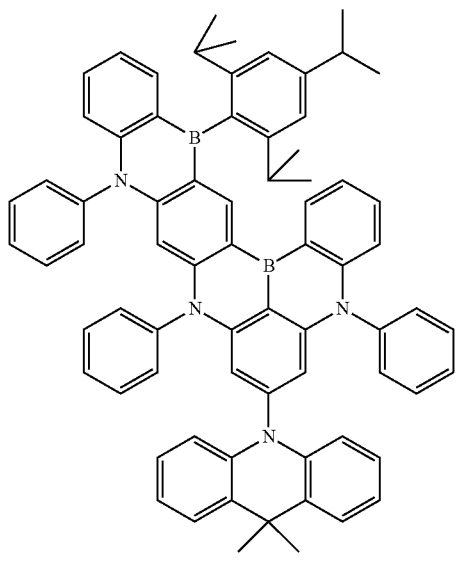

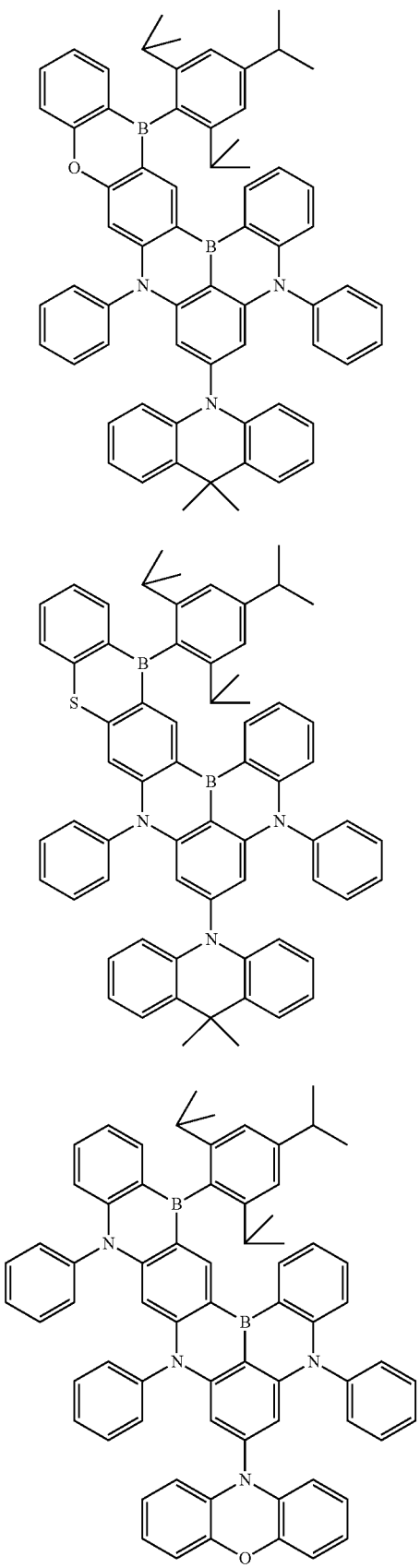
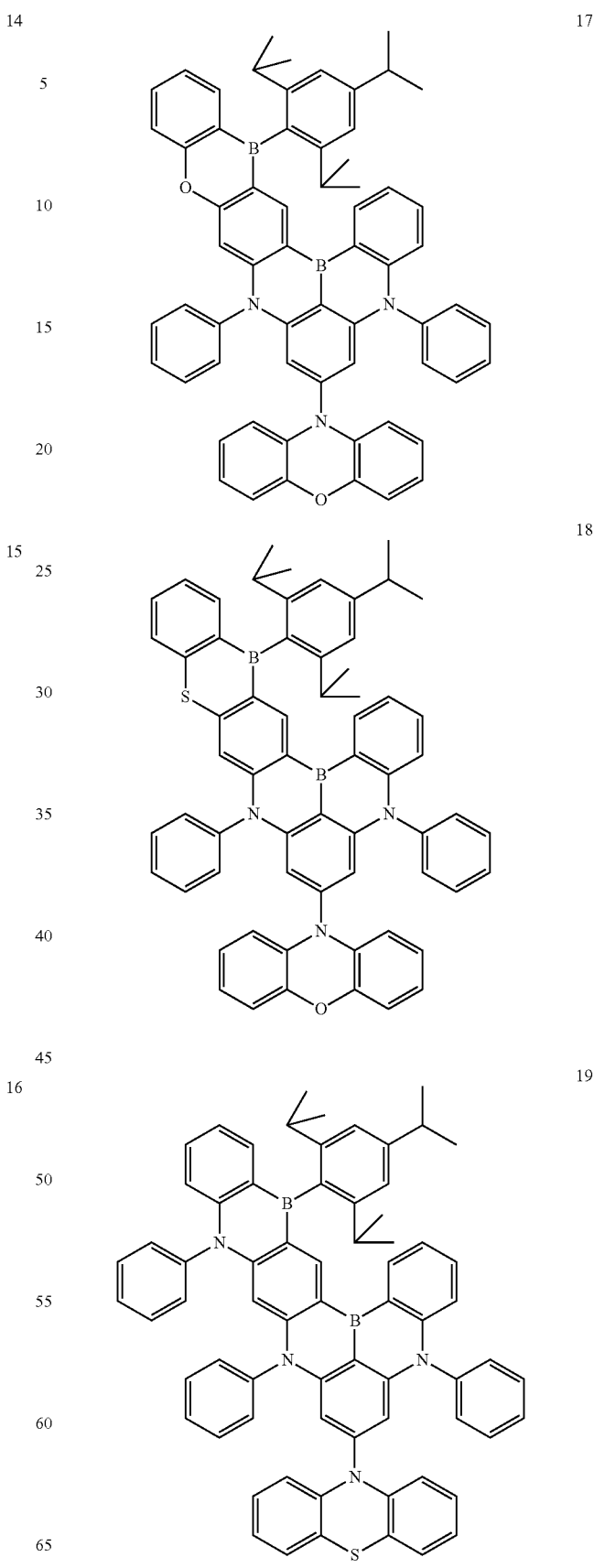

123
20
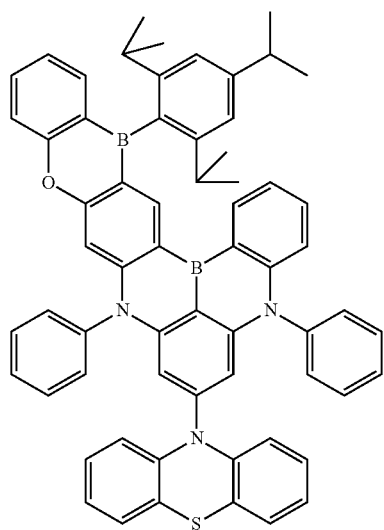
21
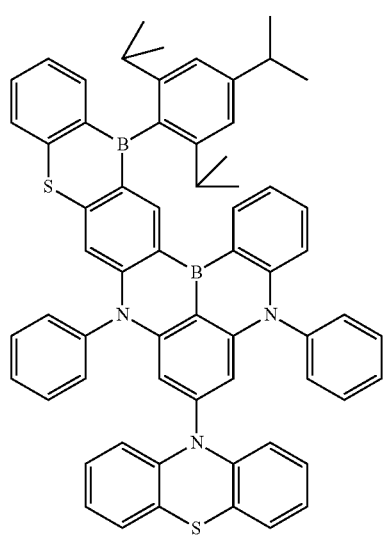
22
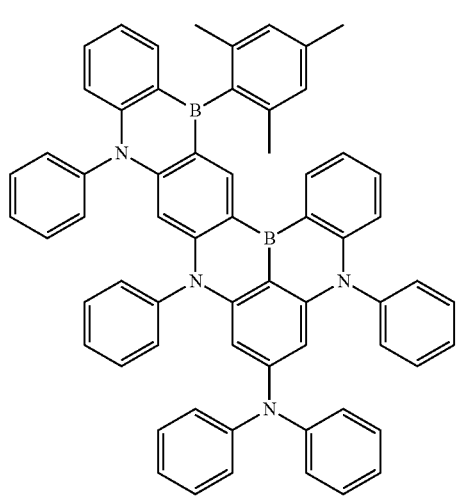
124
23
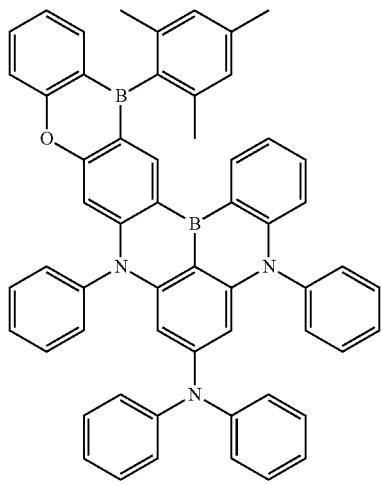
24
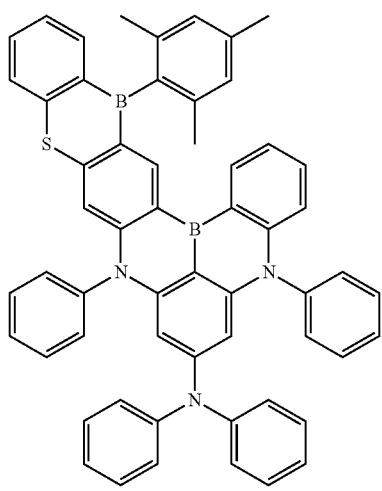
25
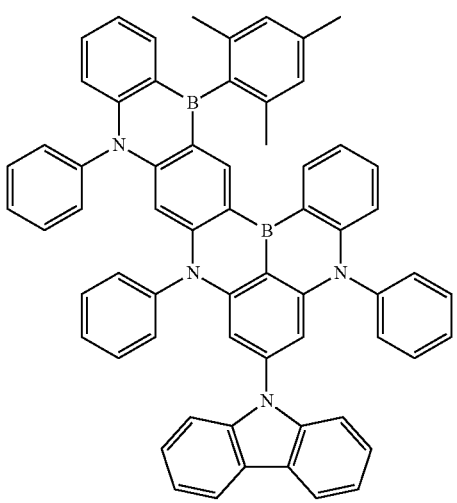

125
-continued
26
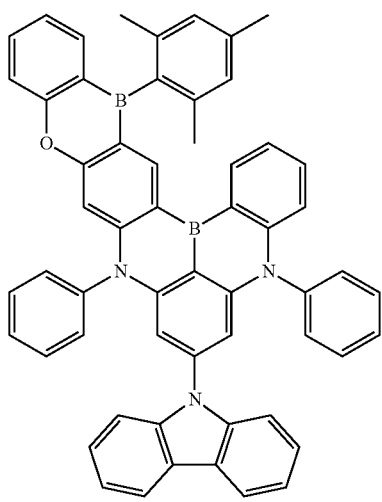
27
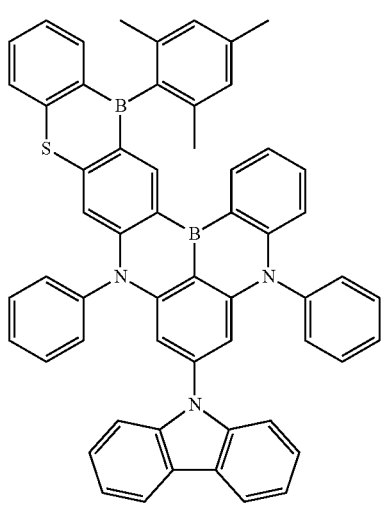
28
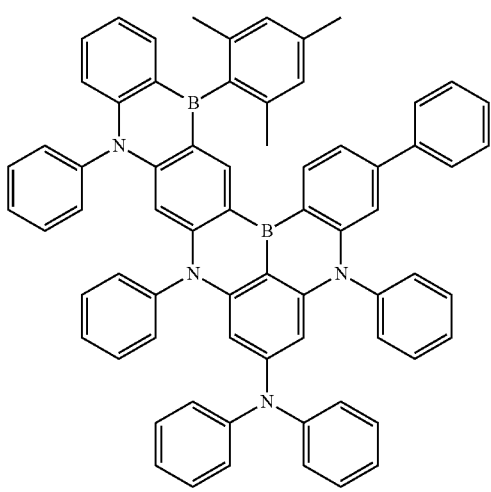
126
-continued
29
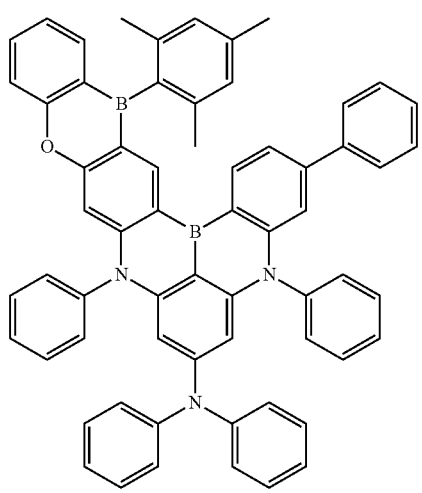
30
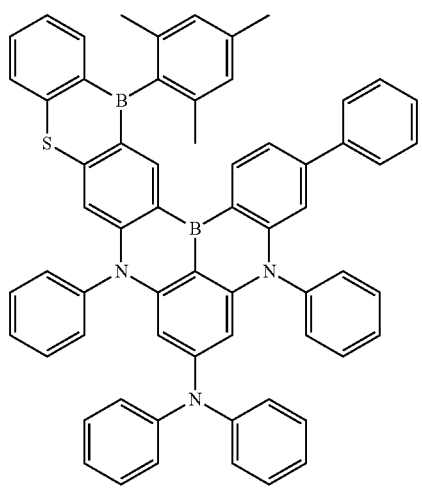
31
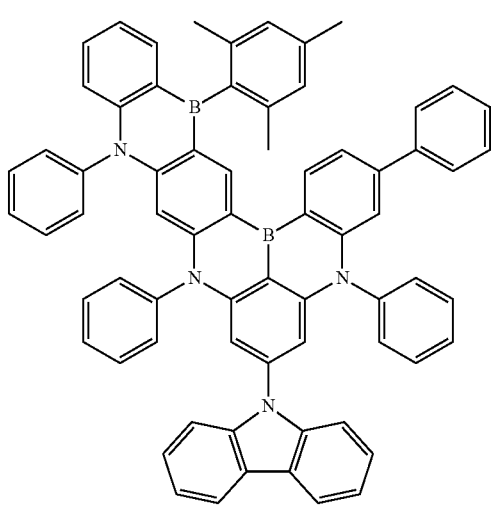

32
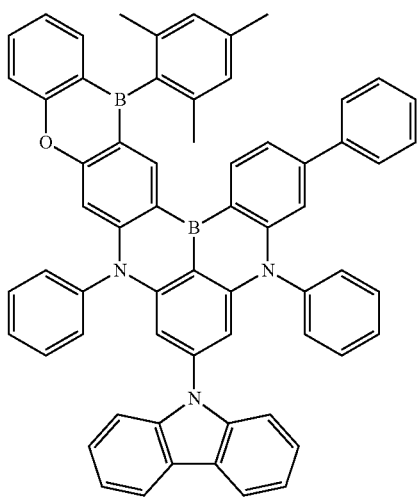
33
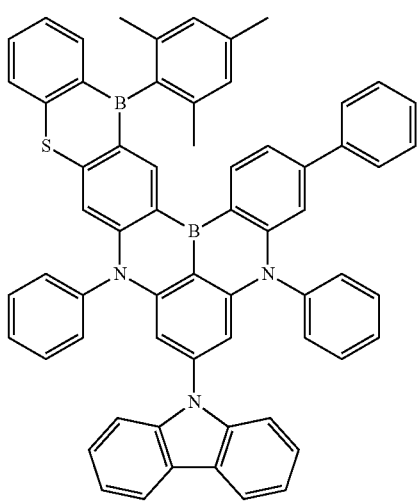
34
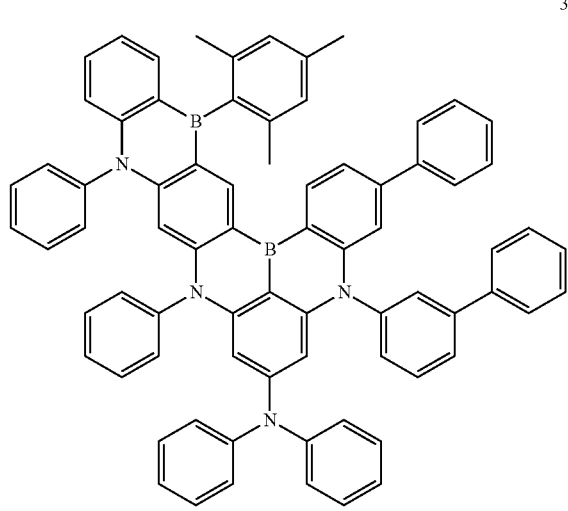
35
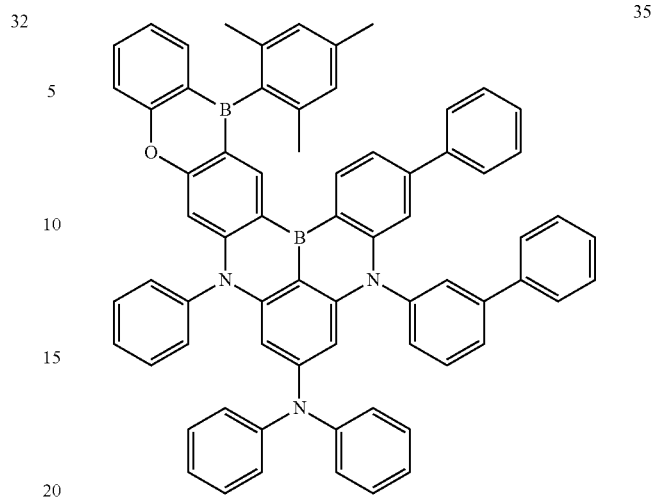
36
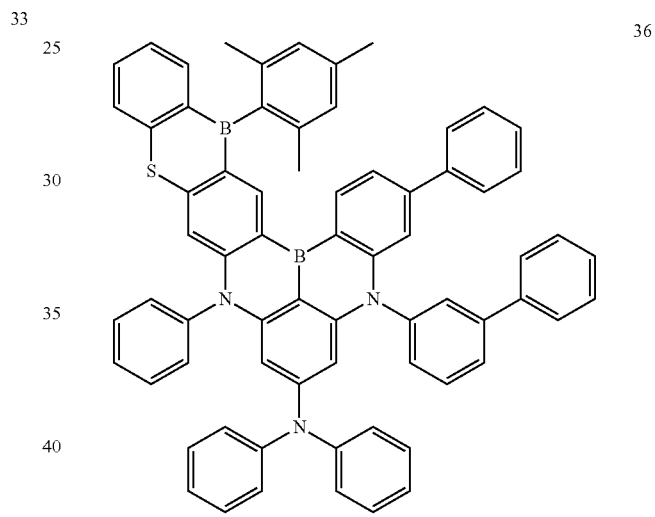
37
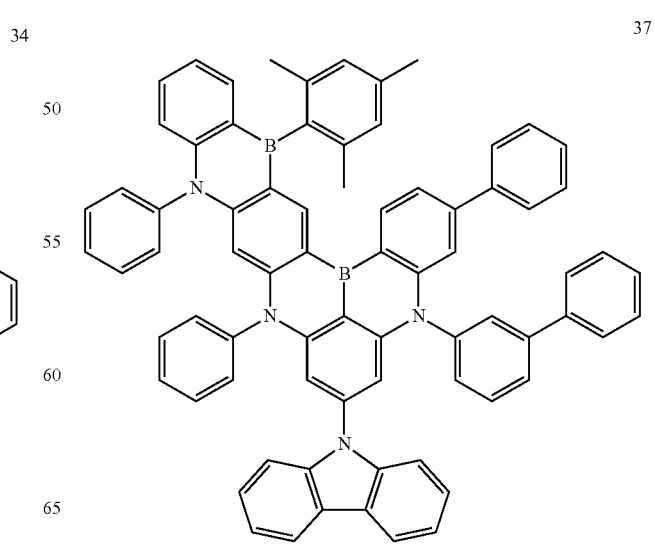

129
-continued
38
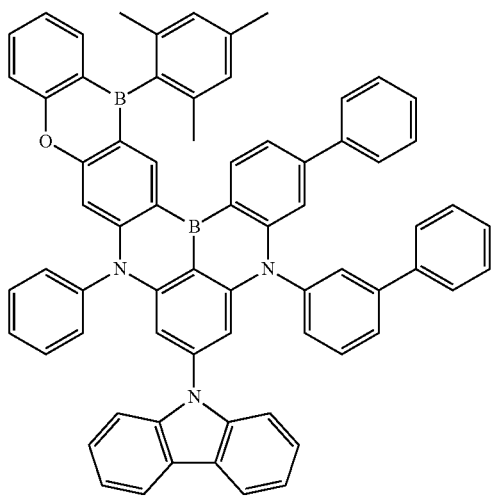
39
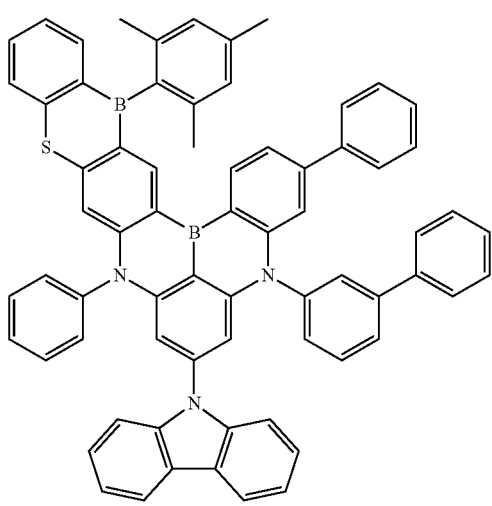
40
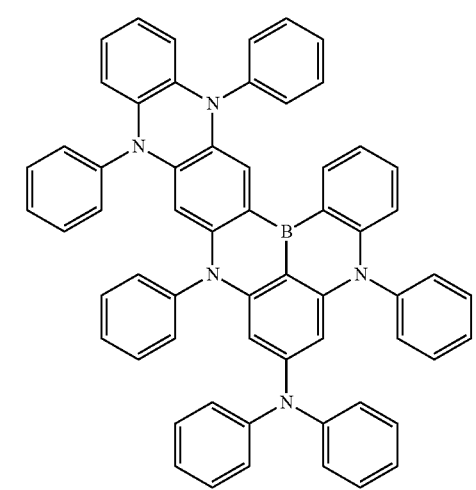
130
-continued
41
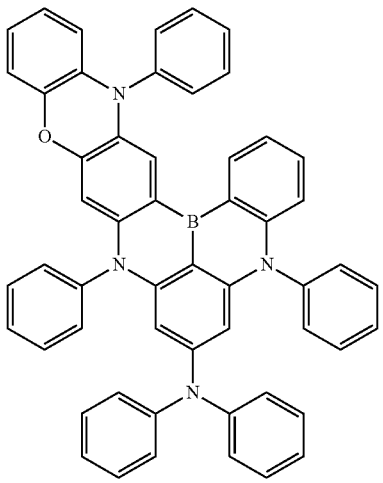
42
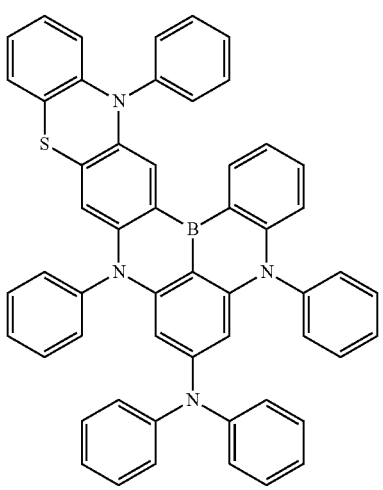
43
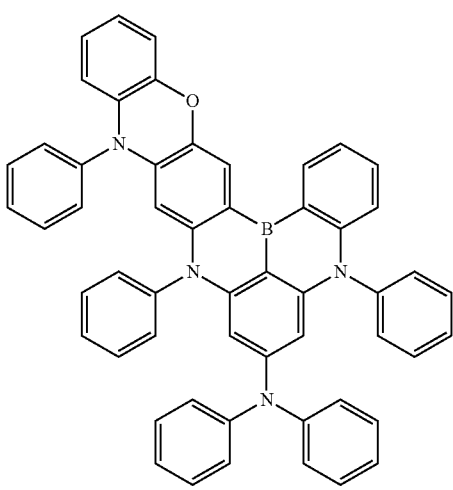

131
-continued
44
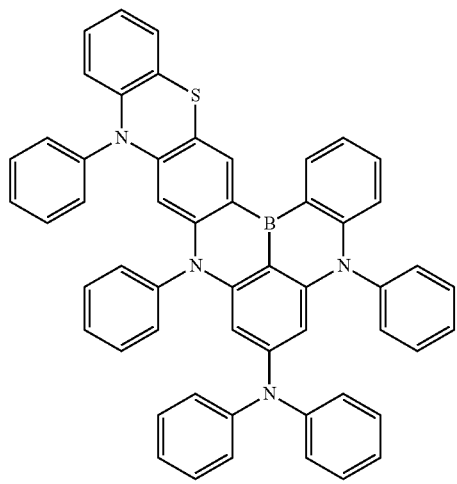
45
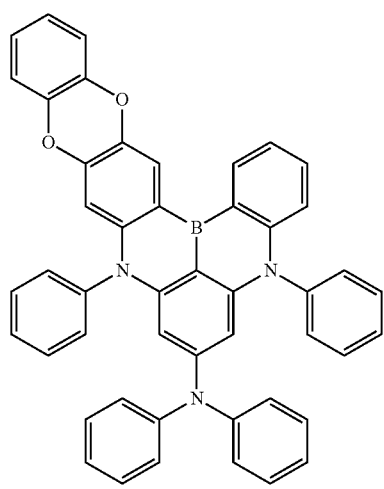
46
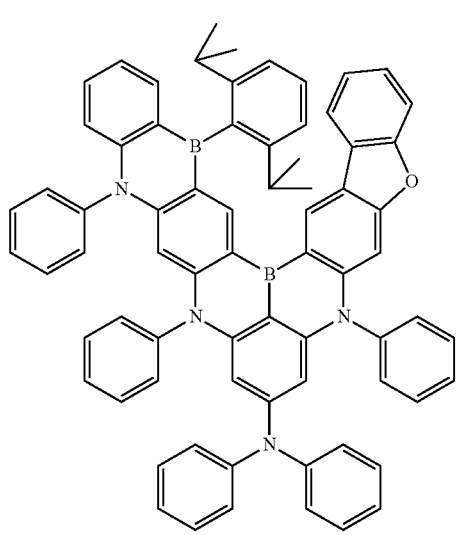
132
-continued
47
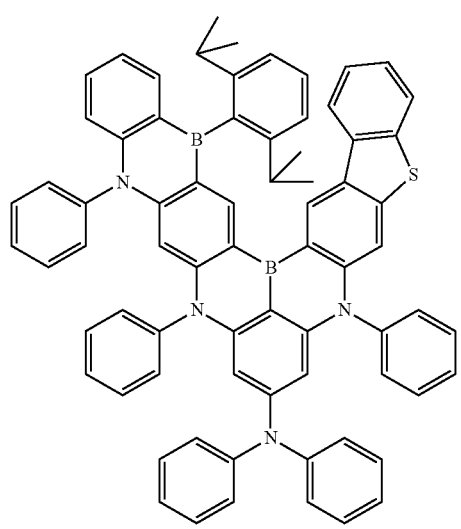
48
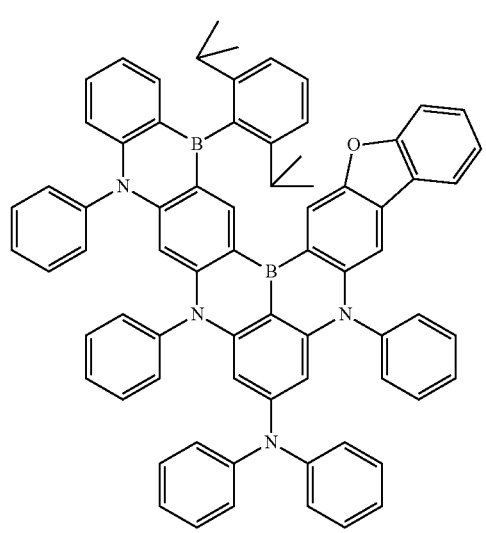
49
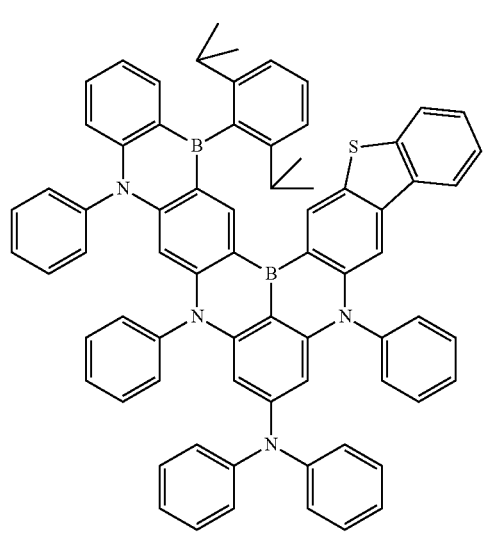

133
-continued
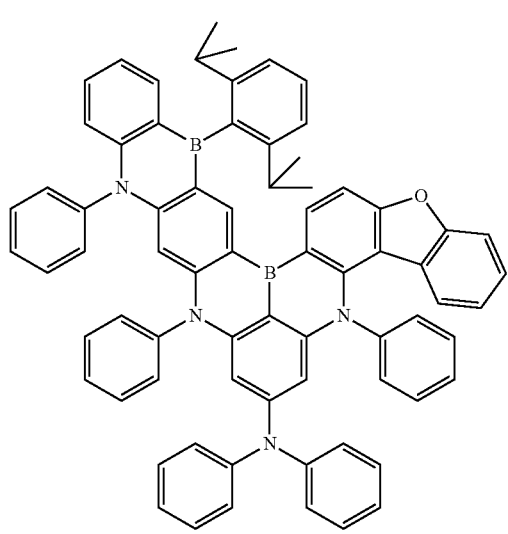
50
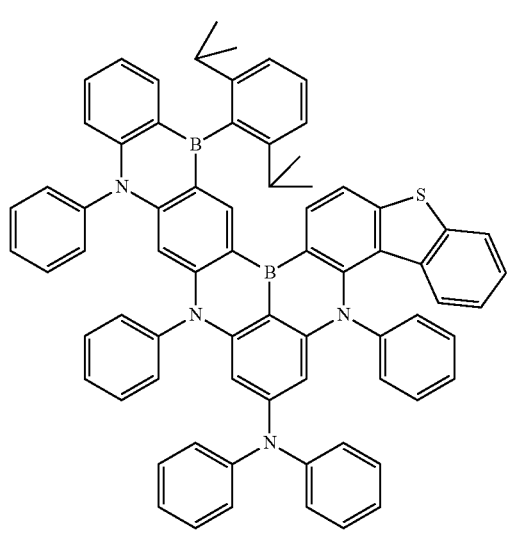
51
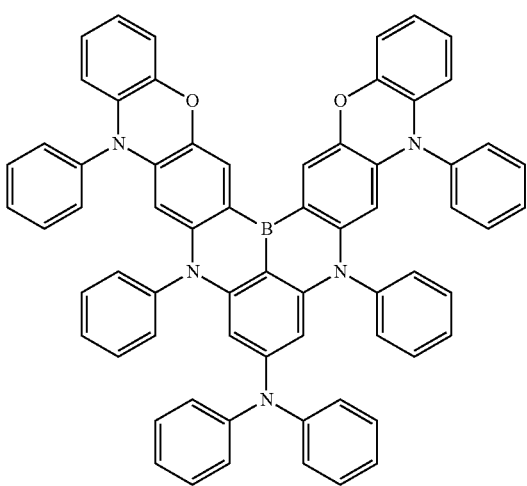
52
134
-continued
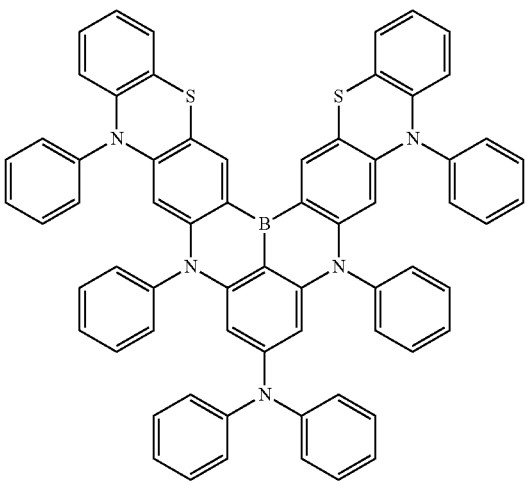
53
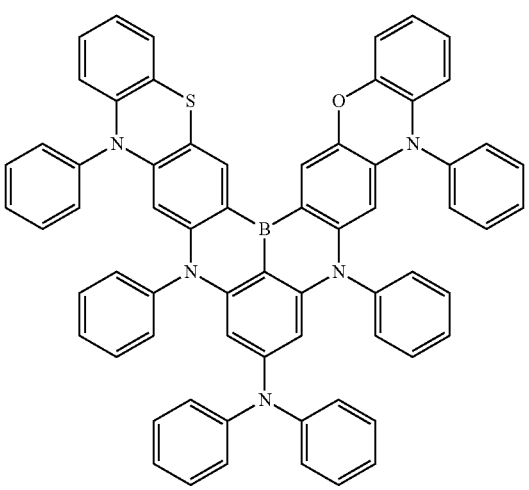
54
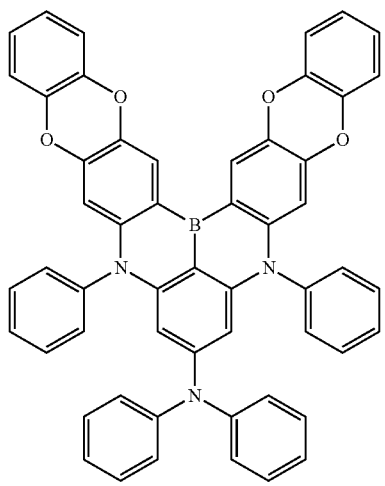
55

56
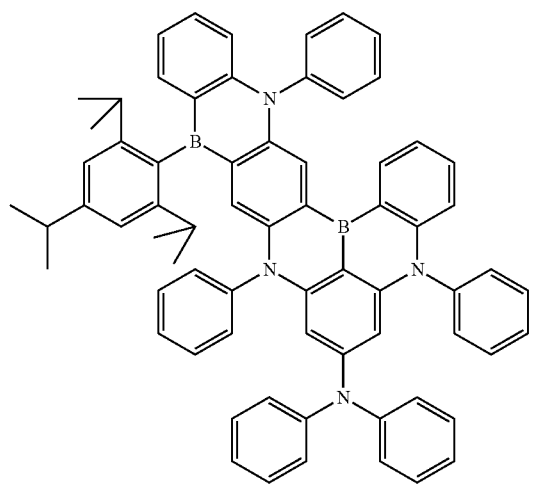
57
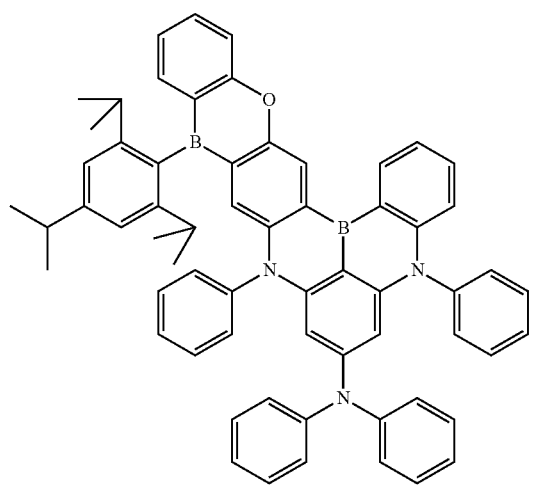
58
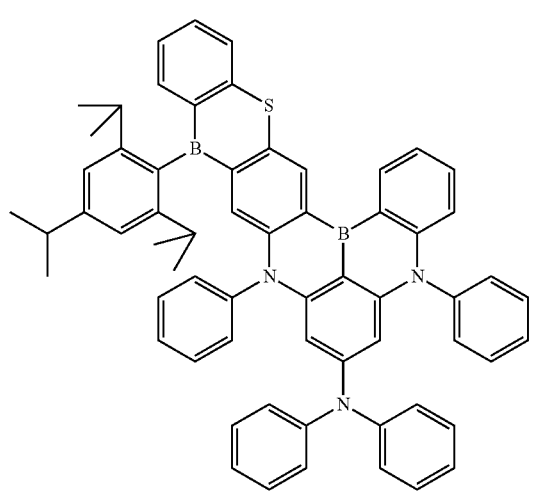
59
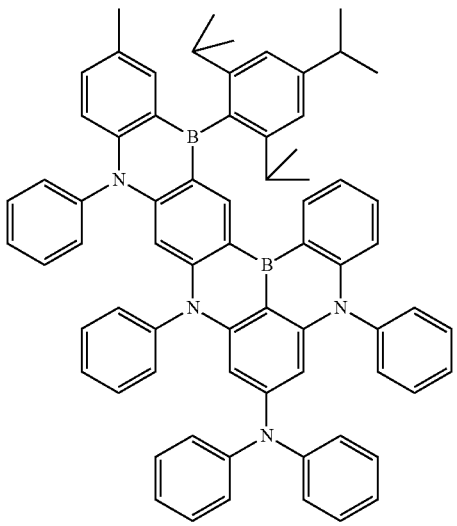
60
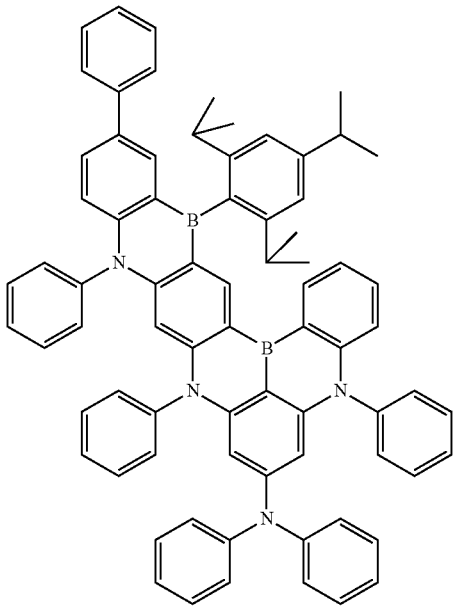
61
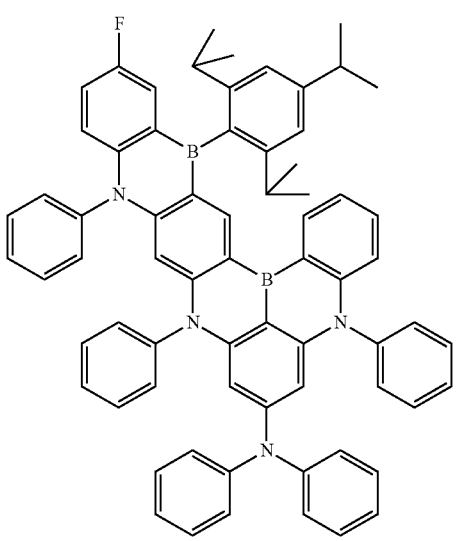

137
62
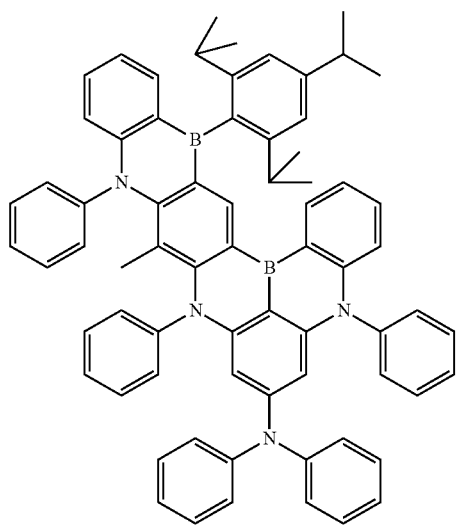
63
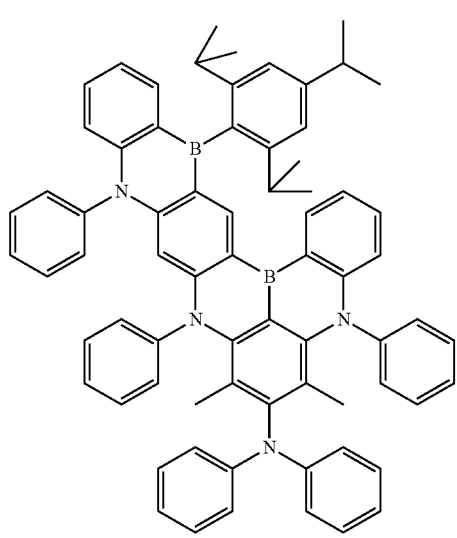
64
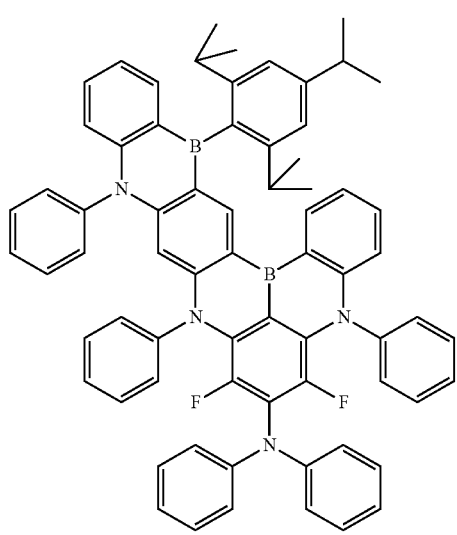
138
65
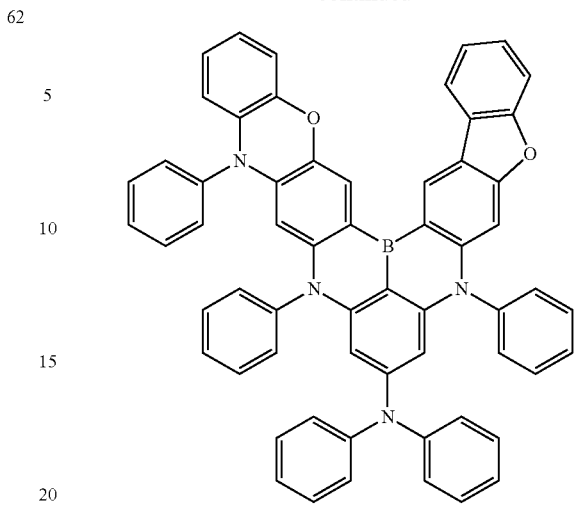
66
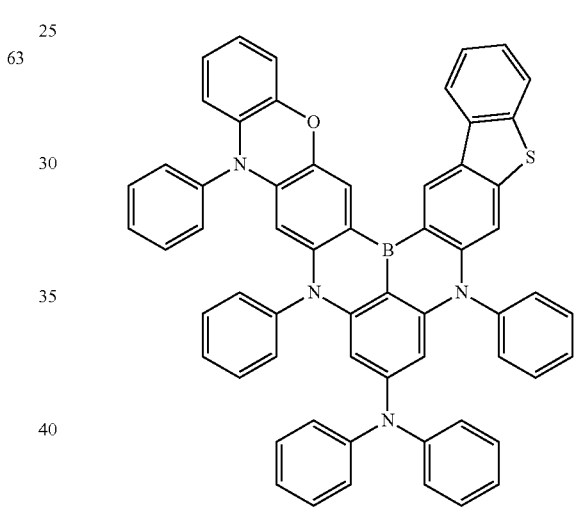
67
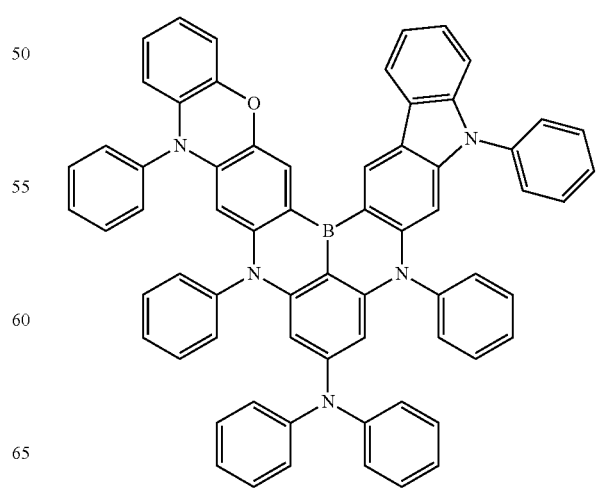

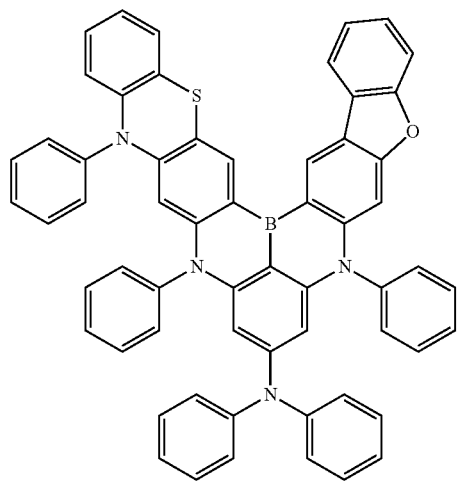
68
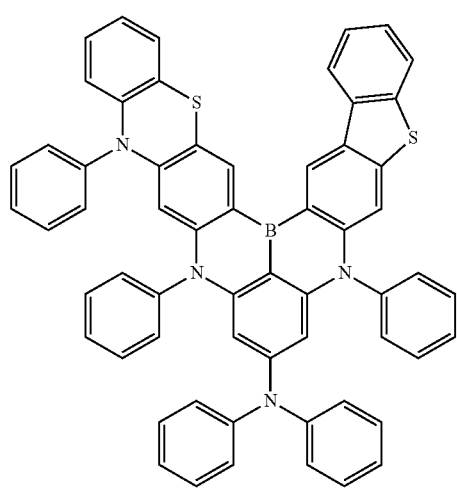
69
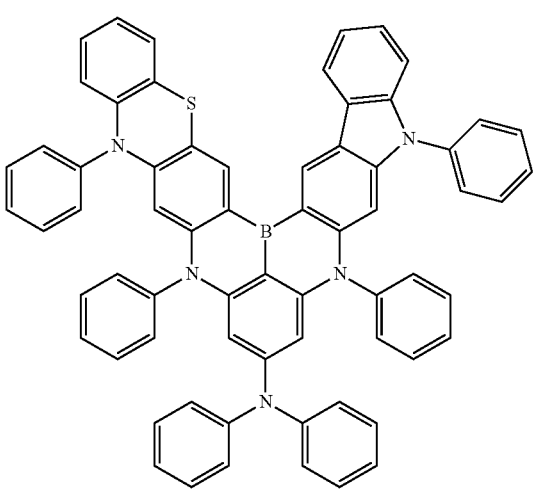
70
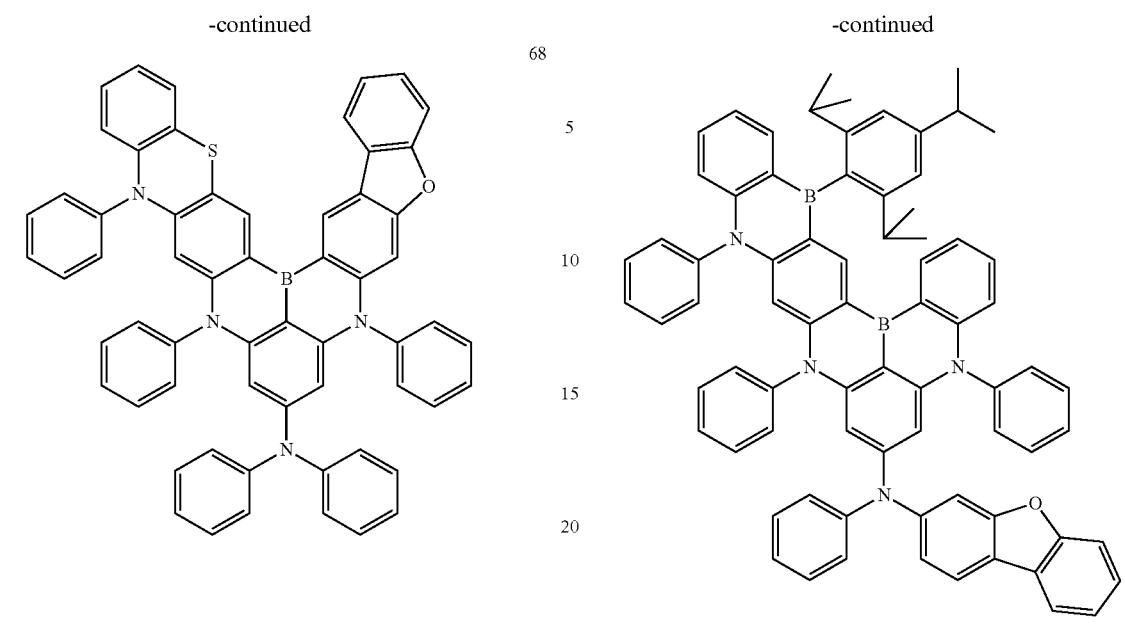
71
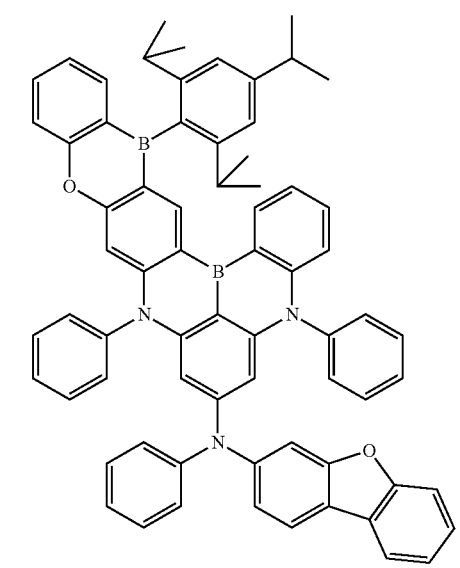
72

141
-continued
73
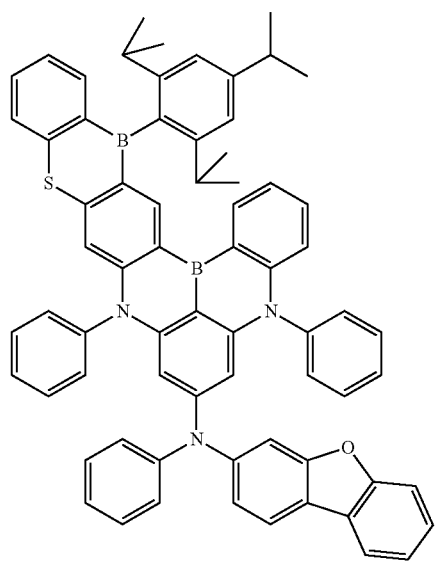
74
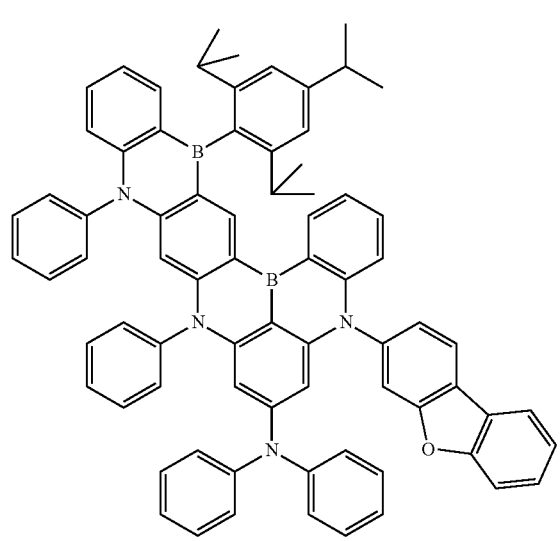
75
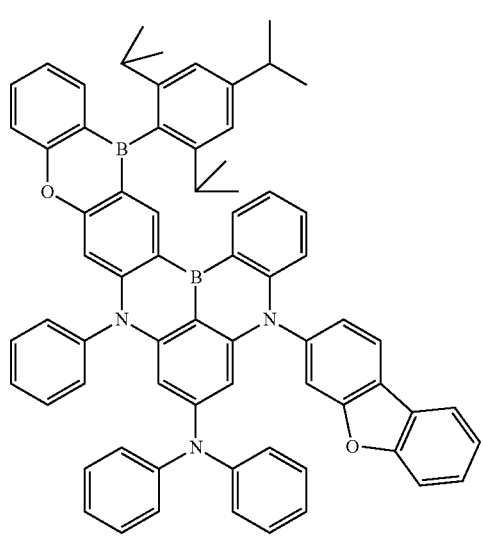
142
-continued
76
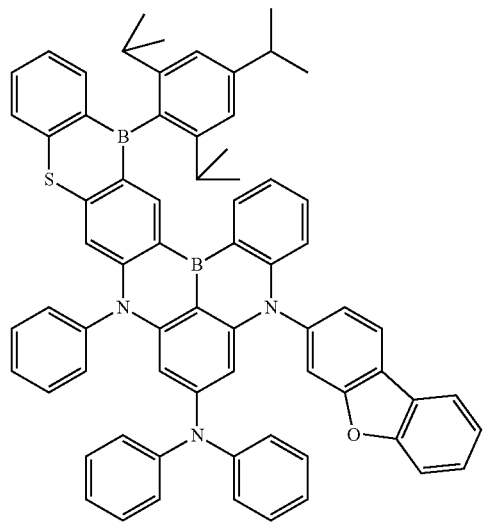
77
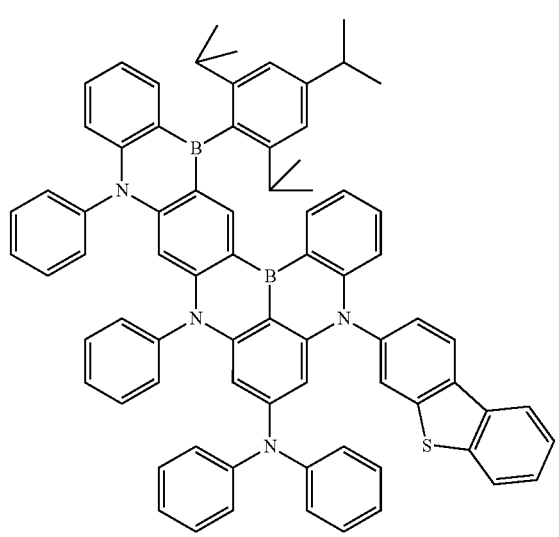
78
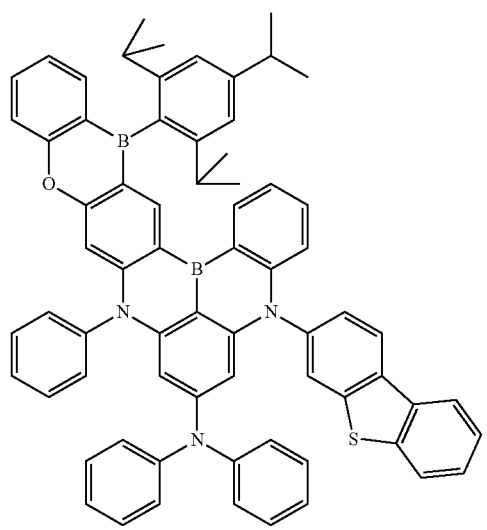

79
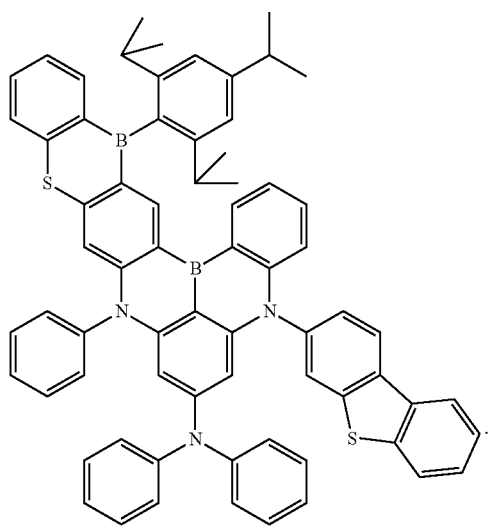
* * * * *